(12) United States Patent
Iizuka et al.

(10) Patent No.: US 10,333,053 B2
(45) Date of Patent: Jun. 25, 2019

(54) PIEZOELECTRIC RESONATOR DEVICE, AND BONDING STRUCTURE OF PIEZOELECTRIC RESONATOR DEVICE AND CIRCUIT BOARD

(71) Applicant: Daishinku Corporation, Kakogawa-shi (JP)

(72) Inventors: Minoru Iizuka, Kakogawa (JP); Takuya Kojo, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 262 days.

(21) Appl. No.: 15/109,645

(22) PCT Filed: Dec. 22, 2014

(86) PCT No.: PCT/JP2014/083995
§ 371 (c)(1),
(2) Date: Jul. 4, 2016

(87) PCT Pub. No.: WO2015/102080
PCT Pub. Date: Jul. 9, 2015

(65) Prior Publication Data
US 2016/0329484 A1  Nov. 10, 2016

(30) Foreign Application Priority Data

Jan. 6, 2014  (JP) ................. 2014-000486

(51) Int. Cl.
*H01L 41/04* (2006.01)
*H01L 41/31* (2013.01)
(Continued)

(52) U.S. Cl.
CPC ............... *H01L 41/31* (2013.01); *H03H 9/10* (2013.01); *H03H 9/1035* (2013.01);
(Continued)

(58) Field of Classification Search
CPC .................................................. H03H 9/1035
See application file for complete search history.

(56) References Cited

U.S. PATENT DOCUMENTS 8,570,110 B2 * 10/2013 Mizusawa ............ H03H 9/1035
310/344
8,610,337 B2 * 12/2013 Kawahara ............... H01L 23/10
310/344
(Continued)

FOREIGN PATENT DOCUMENTS

JP  63-104512 A  5/1988
JP  2011-009973 A  1/2011
(Continued)

*Primary Examiner* — J. San Martin
(74) *Attorney, Agent, or Firm* — American Patent Works

(57) ABSTRACT

A crystal resonator includes: a crystal resonator plate; a first sealing member that covers a first excitation electrode of the crystal resonator plate; and a second sealing member that covers a second excitation electrode of the crystal resonator plate and includes a first external electrode terminal and a second external electrode terminal to be bonded to a circuit board using a flowable conductive bonding material. The second sealing member includes a second through hole and a third through hole that pass through between a first main surface and a second main surface on which the first external electrode terminal and the second external electrode terminal are formed. The second through hole and the third through hole include: respective through electrodes for conduction between electrodes formed on the first main surface and the second main surface; and respective through parts.

19 Claims, 17 Drawing Sheets

(51) Int. Cl.
   *H03H 9/10*   (2006.01)
   *H03H 9/125*  (2006.01)
   *H03H 9/15*   (2006.01)
   *H03H 9/17*   (2006.01)
   *H03H 9/05*       (2006.01)

(52) U.S. Cl.
   CPC .............. *H03H 9/125* (2013.01); *H03H 9/15* (2013.01); *H03H 9/17* (2013.01); *H01L 2924/0002* (2013.01); *H03H 9/0552* (2013.01)

(56)          References Cited

U.S. PATENT DOCUMENTS

2007/0103697 A1     5/2007   Degertekin
2007/0115079 A1     5/2007   Kubo et al.
2008/0150398 A1*    6/2008   Yoshimatsu ......... H03H 9/0595
                                                        310/348
2009/0096329 A1*    4/2009   Ono ...................... H01L 41/053
                                                        310/348
2010/0201221 A1*    8/2010   Inoue ........................ H03H 3/04
                                                        310/312
2010/0237740 A1     9/2010   Aratake et al.
2010/0270891 A1*   10/2010   Kohda ................. H03H 9/1021
                                                        310/344
2011/0163637 A1     7/2011   Hashi
2011/0316390 A1    12/2011   Umeki et al.
2012/0032562 A1*    2/2012   Mizusawa ............... H03H 3/04
                                                        310/344

FOREIGN PATENT DOCUMENTS

JP          2011-142374 A      7/2011
JP          2012-009969 A      1/2012
JP          2013-254855 A     12/2013

* cited by examiner

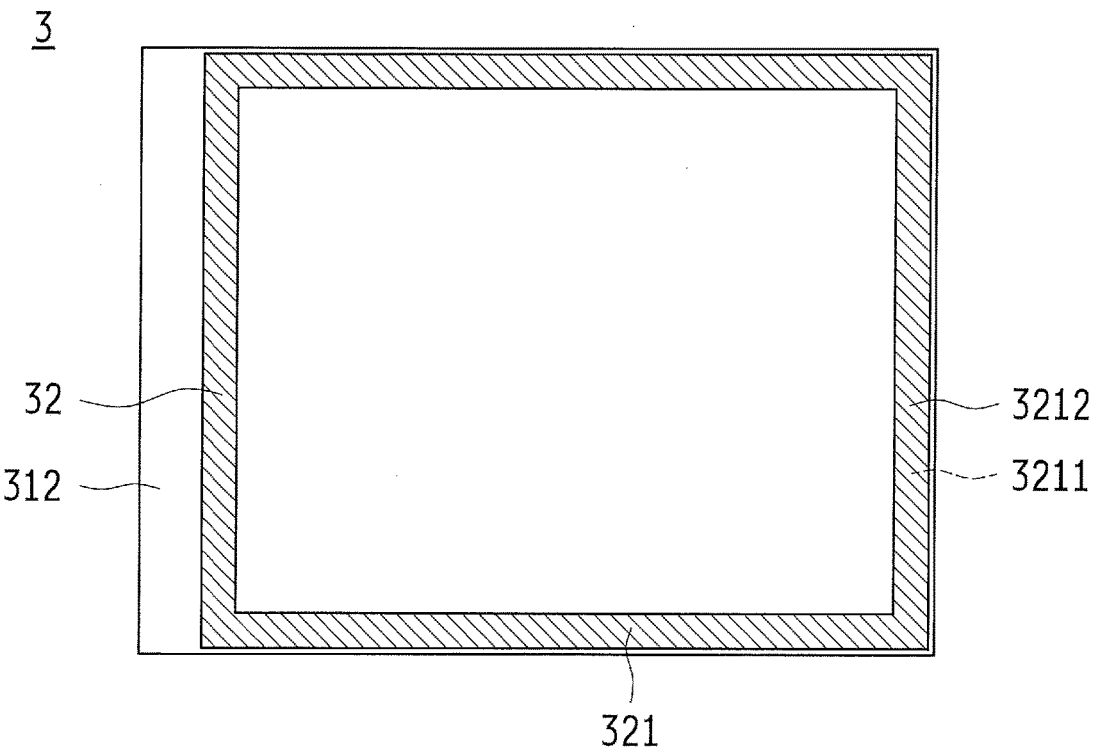
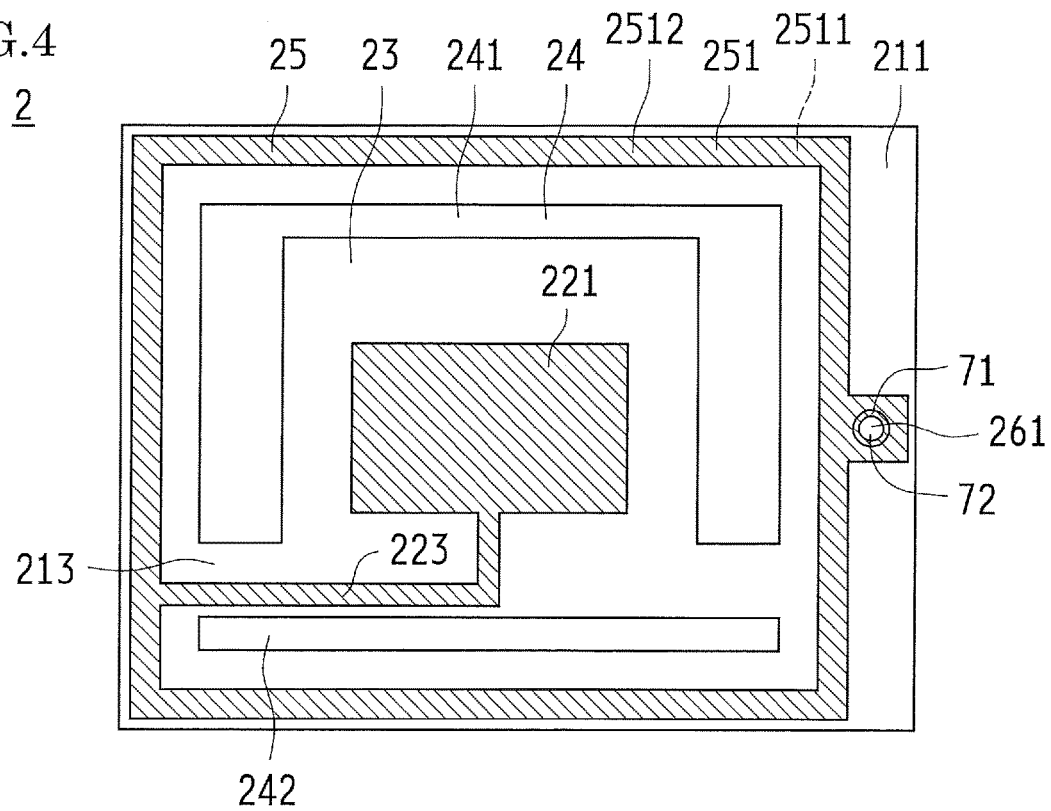

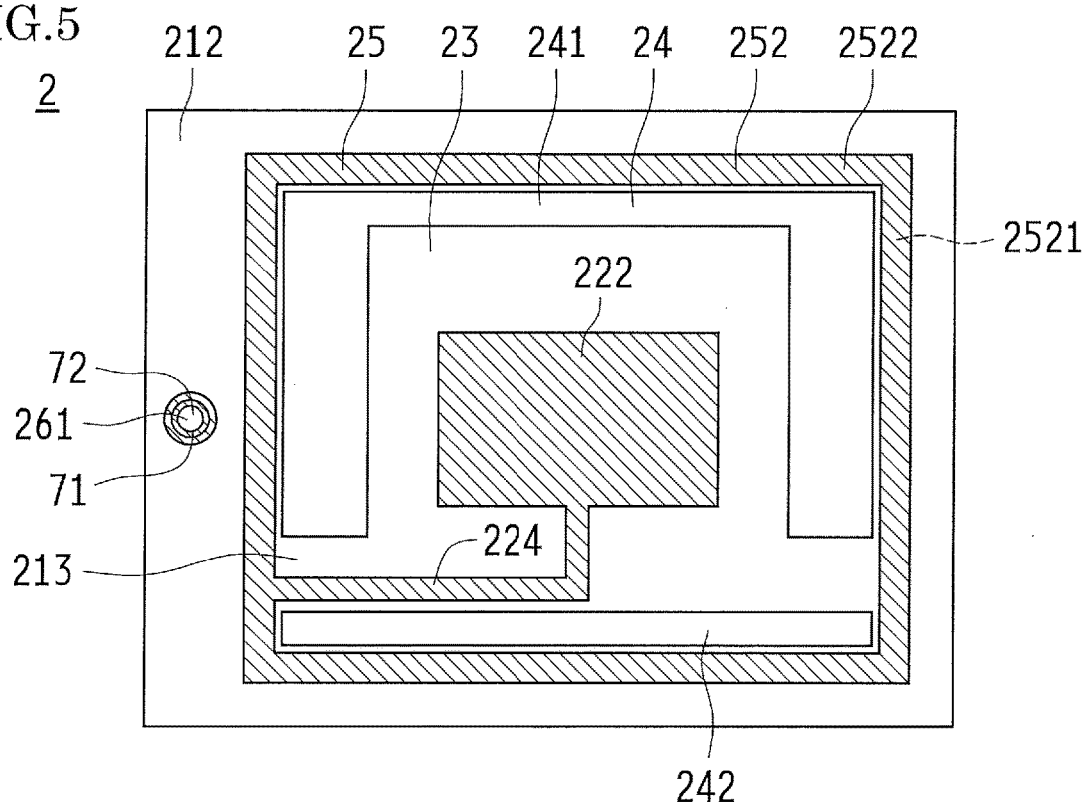
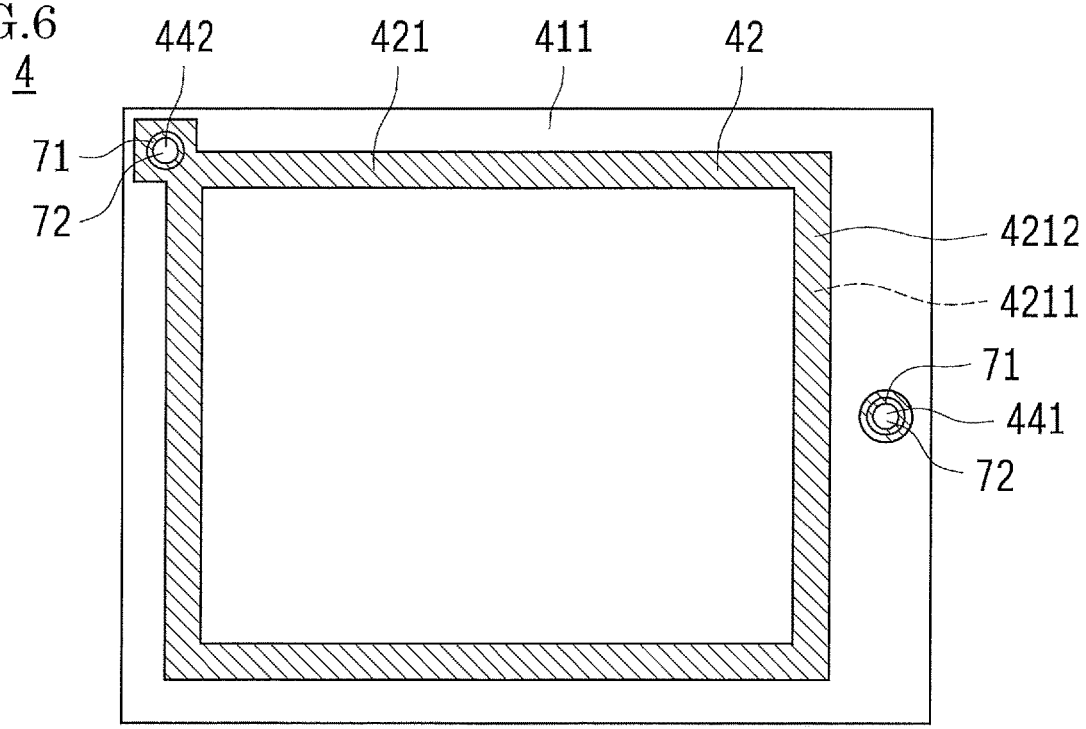

PIEZOELECTRIC RESONATOR DEVICE, AND BONDING STRUCTURE OF PIEZOELECTRIC RESONATOR DEVICE AND CIRCUIT BOARD

REFERENCE TO RELATED APPLICATIONS

In accordance with 37 C.F.R. 1.76, a claim of priority is included in an Application Data Sheet filed concurrently. Accordingly, this application claims priority to PCT/JP2014/083995 filed on Dec. 22, 2014 and entitled "Piezoelectric Vibration Device, and Joining Structure Between Piezoelectric Vibration Device and Circuit Board," which receives priority from JP 2014-000486 filed Jan. 6, 2014 the contents of which is incorporated herein by reference in its entirety.

TECHNICAL FIELD

The present invention relates to a piezoelectric resonator device, and a bonding structure of the piezoelectric resonator device and a circuit board.

BACKGROUND ART

In recent years, the operating frequencies of various electronic devices have increased, and the package sizes, especially the heights, have decreased. According to such an increase in operating frequency and a reduction in package size, there is also a need for piezoelectric resonator devices (crystal resonators, for example) to be adaptable to the increase in operating frequency and the reduction in package size.

In this kind of piezoelectric resonator devices, a housing is constituted by a rectangular-shaped package. The package is constituted by: a first sealing member and a second sealing member both made of glass or crystal; and a crystal resonator plate made of crystal. On both main surfaces of the crystal resonator plate, excitation electrodes are formed. The first sealing member and the second sealing member are laminated and bonded via the crystal resonator plate. Thus, the excitation electrodes of the crystal resonator plate that is disposed in the package (in the internal space of the package) are hermetically sealed (e.g. Patent Document 1). Hereinafter, such a laminated structure of the piezoelectric resonator device is referred to as a sandwich structure.

PRIOR ART REFERENCE

Patent Document

[Patent Document 1] JP 2013-254855 A

SUMMARY OF INVENTION

Problems to be Solved by Invention

In the crystal resonator described in Patent Document 1, through holes are formed in a second sealing member within the internal space. The through holes are filled with an electrode material. Thus, with this crystal resonator, it is possible to conduct between both main surfaces of the second sealing member, and further to hermetically seal the internal space (inside of the package) because the through holes are filled with the electrode material.

However, the crystal resonator described in Patent Document 1 requires the electrode material that can completely fill the through holes so as to conduct between both main surfaces of the second sealing member using the through holes, which results in increase in costs.

In consideration of the above problem, it is among the objects of the present invention to provide a piezoelectric resonator device having a sandwich structure and being capable of conducting between both main surfaces of a second sealing member using through holes while reducing the costs, and also to provide a bonding structure of the piezoelectric resonator device and a circuit board.

Means for Solving Problems

In order to achieve the above object, a piezoelectric resonator device according to the present invention includes: a piezoelectric resonator plate including a first excitation electrode formed on a first main surface of a substrate, and a second excitation electrode formed on a second main surface of the substrate, the second excitation electrode making a pair with the first excitation electrode; a first sealing member covering the first excitation electrode of the piezoelectric resonator plate; a second sealing member covering the second excitation electrode of the piezoelectric resonator plate, the second sealing member including external electrode terminals to be electrically connected to an external circuit board using a flowable conductive bonding material; and an internal space formed by bonding the first sealing member to the piezoelectric resonator plate and by bonding the second sealing member to the piezoelectric resonator plate, the internal space hermetically sealing a vibrating part including the first excitation electrode and the second excitation electrode of the piezoelectric resonator plate. Through holes of the second sealing member are formed so as to pass through between a first main surface and a second main surface of the second sealing member, and the external electrode terminals are formed on the second main surface of the second sealing member. The through holes of the second sealing member include: respective through electrodes for conduction between electrodes formed on the first main surface and the second main surface of the second sealing member; and respective through parts.

With the present invention, the through holes of the second sealing member include the respective through electrodes and further the respective through parts, which means that the through electrodes are not formed in the respective through parts. Thus, it is possible to reduce the material for the through electrodes by the amount corresponding to the through electrodes with which the through parts are to be filled, which results in cost reduction. Furthermore, with the present invention, it is possible to conduct between both main surfaces (i.e., between the first main surface and the second main surface) of the second sealing member by the through electrodes that are formed on the through holes of the second sealing member. For this reason, there is no need to fill the through holes of the second sealing member with a metal electrode material, in contrast to the conventional art such as disclosed in Patent Document 1.

Also, with the present invention, in the bonding structure for being electrically connected to the external circuit board using the flowable conductive bonding material, the through holes of the second sealing member each have the through electrode and further the through part. Thus, when the external electrode terminals are electrically connected to the external circuit board using the flowable conductive bonding material, the flowable conductive bonding material creeps up the through parts of the through holes of the second sealing member along the through holes of the second sealing member from the external electrode terminals. When using a large amount of flowable conductive bonding material, the through parts of the through holes of the second sealing member are filled with the flowable conductive bonding material. For this reason, when the piezoelectric resonator device is bonded to the external circuit board, bonding stress is applied to the external electrode terminals. However, the bonding stress is dispersed by the amount corresponding to the flowable conductive bonding material that creeps up the through parts of the through holes of the second sealing member along the through holes of the second sealing member. Therefore, when the piezoelectric resonator device is bonded to the external circuit board, it is possible to substantially reduce the bonding stress that is applied to the external electrode terminals.

When the external electrode terminals are electrically connected to the external circuit board using the flowable conductive bonding material, the flowable conductive bonding material adheres to the external electrode terminals, and further spreads over and adheres to the through parts of the through holes of the second sealing member. Thus, it is possible to substantially increase the bonding region. Such functions and effects are suitable for the miniaturized piezoelectric resonator device. Even when the package of the piezoelectric resonator device is reduced in size, the bonding region can be substantially maintained or even increased, which results in improvement in bonding strength.

As the specific configuration of the present invention, it is preferable that the through holes of the second sealing member are disposed in the outside of the internal space. With this configuration, the through holes of the second sealing member are not formed within the internal space. Thus, it is possible to avoid the problem that the internal space cannot be hermetically sealed due to the through holes of the second sealing member.

In the above-described configuration, the through holes of the piezoelectric resonator plate may be formed so as to pass through between the first main surface and the second main surface of the piezoelectric resonator plate. The through holes of the piezoelectric resonator plate may include: respective through electrodes for conduction between electrodes formed on the first main surface and the second main surface of the piezoelectric resonator plate; and respective through parts. The respective through parts of the through holes of the piezoelectric resonator plate may be at least partially superimposed to the respective through parts of the through holes of the second sealing member.

In this case, the respective through parts of the through holes of the piezoelectric resonator plate are at least partially superimposed to the respective through parts of the through holes of the second sealing member. Thus, it is possible to prevent misalignment in lamination of the second sealing member and piezoelectric resonator plate by the use of the through holes of the piezoelectric resonator plate and the through holes of the second sealing member, i.e., by confirming their superimposed parts.

In the above-described configuration, through holes of the first sealing member may be formed so as to pass through between a first main surface and a second main surface of the first sealing member. The through holes of the first sealing member may include: respective through electrodes for conduction between electrodes formed on the first main surface and the second main surface of the first sealing member; and respective through parts. The respective through parts of the through holes of the piezoelectric resonator plate may be at least partially superimposed to the respective through parts of the through holes of the second sealing member, and to the respective through parts of the through holes of the first sealing member.

In this case, the respective through parts of the through holes of the piezoelectric resonator plate are at least partially superimposed to the respective through parts of the through holes of the second sealing member, and to the respective through parts of the through holes of the first sealing member. Thus, it is possible to prevent misalignment in lamination of the first sealing member, second sealing member and piezoelectric resonator plate by confirming their superimposed parts.

Since the respective through parts of the through holes of the piezoelectric resonator plate are at least partially superimposed to the respective through parts of the through holes of the second sealing member, and to the respective through parts of the through holes of the first sealing member, even when air bubbles exist in the flowable conductive bonding material used for electrically connecting the piezoelectric resonator device to the external circuit board, it is possible to release the air bubbles of the flowable conductive bonding material from the first main surface of the first sealing member to the outside via the superimposed parts of: the through holes of the second sealing member; the through holes of the piezoelectric resonator plate; and the through holes of the first sealing member.

In the above-described configuration, the first excitation electrode of the piezoelectric resonator plate may be connected to a first external electrode terminal out of the external electrode terminals of the second sealing member via a first terminal formed on the first main surface of the first sealing member. The second excitation electrode of the piezoelectric resonator plate may be connected to a second external electrode terminal out of the external electrode terminals of the second sealing member via a second terminal formed on the first main surface of the first sealing member. In this case, the superimposed parts of the respective through parts of the through holes of the piezoelectric resonator plate, the through holes of the second sealing member and the through holes of the first sealing member may be disposed between the first terminal and the first external electrode terminal, and between the second terminal and the second external electrode terminal.

In this configuration, the respective through parts of the through holes of the piezoelectric resonator plate are at least partially superimposed to: the respective through parts of the through holes of the second sealing member, and to the respective through parts of the through holes of the first sealing member. Thus, even when air bubbles exist in the flowable conductive bonding material used for electrically connecting the piezoelectric resonator device to the circuit board, it is possible to release the air bubbles of the flowable conductive bonding material from the first main surface of the first sealing member to the outside via the superimposed parts of the through holes of the second sealing member, the through holes of the piezoelectric resonator plate and the through holes of the first sealing member.

In addition, when the external electrode terminals (the first external electrode terminal and the second external electrode terminal) are electrically connected to the external circuit board using the flowable conductive bonding material, the flowable conductive bonding material creeps up the through parts of the through holes of the second sealing member along the through holes of the second sealing member from the external electrode terminals. In this case, the hermeticity of the internal space in which the vibrating part of the piezoelectric resonator plate is hermetically sealed may be decreased due to corrosion of the flowable conductive bonding material that creeps up the through parts. However, with the above-described configuration, it is possible to ensure a long distance as the length of a path from the first excitation electrode of the piezoelectric resonator plate to the external electrode terminal (the first external electrode terminal) and as the length of a path from the second excitation electrode of the piezoelectric resonator plate to the external electrode terminal (the second external electrode terminal), which prevents the internal space from being affected by corrosion of the flowable conductive bonding material that decreases the hermeticity.

Also, it is possible to easily test the piezoelectric resonator plate using the first terminal and the second terminal, which are disposed on the first main surface of the first sealing member, as test terminals for the piezoelectric resonator plate. Furthermore, the size of the first terminal and the second terminal can be easily changed. Thus, the capacity of the piezoelectric resonator plate viewed from the external electrode terminals (the first external electrode terminal and the second external electrode terminal) can be finely adjusted as required.

In the above-described configuration, the respective superimposed parts are disposed on an outside of a sealed region of the internal space.

In this configuration, the superimposed parts are disposed in the outside (where the hermeticity is of no concern) of the sealed region of the internal space in which the vibrating part of the piezoelectric resonator plate is hermetically sealed. Thus, it is possible to further prevent the hermeticity of the internal space from being decreased by the corrosion of the flowable conductive bonding material (such as solder).

In this configuration, when the piezoelectric resonator device is bonded to the external circuit board using the flowable conductive bonding material, the flowable conductive bonding material creeps up the through parts of the through holes (the through holes of the second sealing member, the through holes of the piezoelectric resonator plate and the through holes of the first sealing member) along the through holes of the second sealing member from the external electrode terminals, so that the through parts of the through holes are filled with the flowable conductive bonding material. Thus, the bonding stress, which is generated when bonding the piezoelectric resonator device to the external circuit board, is dispersed by the amount corresponding to the flowable conductive bonding material that creeps up the through parts of the through holes. As a result, it is possible to reduce the bonding stress that is applied to the external electrode terminals when bonding.

Also, In this configuration, since the through holes (the through holes of the piezoelectric resonator plate, the through holes of the first sealing member and the through holes of the second sealing member) are disposed in the positions apart from the vibrating part disposed in the sealed region of the internal space, even when the through parts of the through holes are filled with the flowable conductive bonding material having a different coefficient of thermal expansion from that of the piezoelectric resonator plate or the like at the time of bonding the piezoelectric resonator device to the external circuit board, it is possible to prevent the generated bonding stress from affecting the vibrating part of the piezoelectric resonator plate.

Specifically, when the through parts of the through holes are filled with the flowable conductive bonding material at the time of bonding the piezoelectric resonator device to the external circuit board, the vibrating part of the piezoelectric resonator plate may be affected by the stress caused by the difference in the coefficient of thermal expansion between the flowable conductive bonding material and the piezoelectric resonator plate or the like. However, with this configuration, even when the through parts of the through holes are filled with the flowable conductive bonding material, the vibrating part of the piezoelectric resonator plate and the through holes are disposed apart from each other. Thus, it is possible to prevent the stress caused by the difference in the coefficient of thermal expansion from affecting the vibrating part of the piezoelectric resonator plate. Also, since the sealing part in the sealed region is interposed between the vibrating part of the piezoelectric resonator plate and the through holes, the stress caused by the difference in the coefficient of thermal expansion is not directly transmitted to the vibrating part of the piezoelectric resonator plate from the flowable conductive bonding material filling the through holes. Thus, the sealing part in the sealed region prevents the stress caused by the difference in the coefficient of thermal expansion from being transmitted, which results in reduction of the stress that is transmitted to the vibrating part of the piezoelectric resonator plate.

In the above-described configuration, a resonator-plate-side first bonding pattern, which is to be bonded and sealed to the first sealing member, may be formed on the first main surface of the piezoelectric resonator plate. A resonator-plate-side second bonding pattern, which is to be bonded and sealed to the second sealing member, may be formed on the second main surface of the piezoelectric resonator plate. A sealing-member-side first bonding pattern, which is to be bonded to the piezoelectric resonator plate, may be formed on the first sealing member. And a sealing-member-side second bonding pattern, which is to be bonded to the piezoelectric resonator plate, may be formed on the second sealing member. The sealing-member-side first bonding pattern may be bonded to the resonator-plate-side first bonding pattern by diffusion bonding, and the sealing-member-side second bonding pattern may be bonded to the resonator-plate-side second bonding pattern by the diffusion bonding. The first sealing member and the piezoelectric resonator plate may have a gap of not more than 1.00 μm, and the second sealing member and the piezoelectric resonator plate may have a gap of not more than 1.00 μm.

In this case, there is no variation in the height of the package of the piezoelectric resonator device. For example, unlike this configuration, when using the metal paste sealing material such as an Sn-containing bonding material that makes a gap of more than 1 μm, the variation in the height occurs when the metal paste sealing material is formed on the patterns (the resonator-plate-side first bonding pattern, the resonator-plate-side second bonding pattern, the sealing-member-side first bonding pattern and the sealing-member-side second bonding pattern). Also, after bonding, due to heat capacity distribution in the formed patterns (the resonator-plate-side first bonding pattern, the resonator-plate-side second bonding pattern, the sealing-member-side first bonding pattern and the sealing-member-side second bonding pattern), the even gaps are not formed. Therefore, in the conventional art, when three members (i.e., the first sealing member, the second sealing member and the piezoelectric resonator plate) are laminated, the respective gaps between the members are different. As a result, the laminated three members are bonded in a state in which they are not parallel to each other. This problem becomes remarkable according to the reduction in package height. On the other hand, in this configuration, since the upper limit of the gap is set to 1.00 μm, the three members (i.e., the first sealing member, the second sealing member and the piezoelectric resonator plate) can be laminated and bonded in a state in which they are parallel to each other, thus, this configuration can be adaptable to the height reduction.

In order to achieve the above object, in the bonding structure of a piezoelectric resonator device and a circuit board according to the present invention, the piezoelectric resonator device according to the present invention is electrically connected to the circuit board using the flowable conductive bonding material, and when the external electrode terminals are electrically connected to the circuit board, the through parts of the through holes of the second sealing member are filled with the flowable conductive bonding material.

In the present invention, when the external electrode terminals are electrically connected to the circuit board, the through parts of the through holes of the second sealing member are filled with the flowable conductive bonding material. Thus, it is possible to reduce the material for the through electrodes by the amount corresponding to the flowable conductive bonding material filling the through electrodes, in contrast to the conventional art such as disclosed in Patent Document 1. For this reason, there is no need to fill the through holes of the second sealing member with a metal electrode material, in contrast to the conventional art.

Also, in the present invention, the flowable conductive bonding material creeps up the through parts of the through holes of the second sealing member along the through holes of the second sealing member from the external electrode terminals. When using a large amount of flowable conductive bonding material, the through parts of the through holes of the second sealing member are filled with the flowable conductive bonding material. For this reason, when the piezoelectric resonator device is bonded to the circuit board, bonding stress is applied to the external electrode terminals. However, the bonding stress is dispersed by the amount corresponding to the flowable conductive bonding material that creeps up the through parts of the through holes of the second sealing member along the through holes of the second sealing member. Therefore, when the piezoelectric resonator device is bonded to the circuit board, it is possible to substantially reduce the bonding stress that is applied to the external electrode terminals.

When the external electrode terminals are electrically connected to the circuit board using the flowable conductive bonding material, the flowable conductive bonding material adheres to the external electrode terminals, and further spreads over and adheres to the through parts of the through holes of the second sealing member. Thus, it is possible to substantially increase the bonding region. Such functions and effects are suitable for the miniaturized piezoelectric resonator device. Even when the package of the piezoelectric resonator device is reduced in size, the bonding region can be substantially maintained or even increased, which results in improvement in bonding strength.

In order to achieve the above object, in a bonding structure of another piezoelectric resonator device and a circuit board according to the present invention, the piezoelectric resonator device according to the present invention is electrically connected to the circuit board using a flowable conductive bonding material, and when the external electrode terminals are electrically connected to the circuit board, the through parts of the through holes of the piezoelectric resonator plate and the through parts of the through holes of the second sealing member are filled with the flowable conductive bonding material.

In the present invention, when the external electrode terminals are electrically connected to the circuit board, the through parts of the through holes of the piezoelectric resonator plate and the through parts of the through holes of the second sealing member are filled with the flowable conductive bonding material. Thus, it is possible to suitably reduce the material for the through electrodes of the through holes of the piezoelectric resonator plate and the through electrodes of the through holes of the second sealing member by the amount corresponding to the flowable conductive bonding material filling the through parts of the through holes of the piezoelectric resonator plate and the through parts of the through holes of the second sealing member, in contrast to the conventional art such as disclosed in Patent Document 1. For this reason, there is no need to fill the through holes of the piezoelectric resonator plate and the through holes of the second sealing member with a metal electrode material, in contrast to the conventional art.

In the present invention, the flowable conductive bonding material creeps up the through parts of the through holes of the second sealing member and the through parts of the through holes of the piezoelectric resonator plate along the through holes of the second sealing member and the through holes of the piezoelectric resonator plate from the external electrode terminals. Thus, the through parts of the through holes of the second sealing member and the through parts of the through holes of the piezoelectric resonator plate are filled with the flowable conductive bonding material. For this reason, when the piezoelectric resonator device is bonded to the circuit board, bonding stress is applied to the external electrode terminals. However, the bonding stress is dispersed by the amount corresponding to the flowable conductive bonding material that creeps up the through parts of the through holes of the second sealing member and the through parts of the through holes of the piezoelectric resonator plate along the through holes of the second sealing member and the through holes of the piezoelectric resonator plate. Therefore, when the piezoelectric resonator device is bonded to the circuit board, it is possible to substantially reduce the bonding stress that is applied to the external electrode terminals.

When the external electrode terminals are electrically connected to the circuit board using the flowable conductive bonding material, the flowable conductive bonding material adheres to the external electrode terminals, and further spreads over and adheres to the through parts of the through holes of the second sealing member and the through parts of the through holes of the piezoelectric resonator plate. Thus, it is possible to substantially increase the bonding region. Such functions and effects are suitable for the miniaturized piezoelectric resonator device. Even when the package of the piezoelectric resonator device is reduced in size, the bonding region can be substantially maintained or even increased, which results in improvement in bonding strength.

In order to achieve the above object, in a bonding structure of another piezoelectric resonator device and a circuit board according to the present invention, the piezoelectric resonator device according to the present invention is electrically connected to the circuit board using a flowable conductive bonding material. When the external electrode terminals are electrically connected to the circuit board, the through parts of the through holes of the piezoelectric resonator plate, the through parts of the through holes of the second sealing member and the through parts of the through holes of the first sealing member are filled with the flowable conductive bonding material.

In the present invention, when the external electrode terminals are electrically connected to the circuit board, the through parts of the through holes of the piezoelectric resonator plate, the through parts of the through holes of the second sealing member and the through parts of the through holes of the first sealing member are filled with the flowable conductive bonding material. Thus, it is possible to suitably reduce the material for the through electrodes of the through holes of the piezoelectric resonator plate, the through electrodes of the through holes of the second sealing member and the through electrodes of the through holes of the first sealing member by the amount corresponding to the flowable conductive bonding material filling the through parts of the through holes of the piezoelectric resonator plate, the through parts of the through holes of the second sealing member and the through parts of the through holes of the first sealing member, in contrast to the conventional art such as disclosed in Patent Document 1. For this reason, there is no need to fill the through holes of the piezoelectric resonator plate, the through holes of the second sealing member and the through holes of the first sealing member with a metal electrode material, in contrast to the conventional art.

In the present invention, the flowable conductive bonding material creeps up the through parts of the through holes of the second sealing member, the through parts of the through holes of the piezoelectric resonator plate and the through parts of the through holes of the first sealing member along the through holes of the second sealing member, the through holes of the piezoelectric resonator plate and the through holes of the first sealing member from the external electrode terminals. Thus, the through parts of the through holes of the second sealing member, the through parts of the through holes of the piezoelectric resonator plate and the through parts of the through holes of the first sealing member are filled with the flowable conductive bonding material. For this reason, when the piezoelectric resonator device is bonded to the circuit board, bonding stress is applied to the external electrode terminals. However, the bonding stress is dispersed by the amount corresponding to the flowable conductive bonding material that creeps up the through parts of the through holes of the second sealing member, the through parts of the through holes of the piezoelectric resonator plate and the through parts of the through holes of the first sealing member along the through holes of the second sealing member, the through holes of the piezoelectric resonator plate and the through holes of the first sealing member. Therefore, when the piezoelectric resonator device is bonded to the circuit board, it is possible to substantially reduce the bonding stress that is applied to the external electrode terminals.

When the external electrode terminals are electrically connected to the circuit board using the flowable conductive bonding material, the flowable conductive bonding material adheres to the external electrode terminals, and further spreads over and adheres to the through parts of the through holes of the second sealing member, the through parts of the through holes of the piezoelectric resonator plate and the through parts of the through holes of the first sealing member. Thus, it is possible to substantially increase the bonding region. Such functions and effects are suitable for the miniaturized piezoelectric resonator device. Even when the package of the piezoelectric resonator device is reduced in size, the bonding region can be substantially maintained or even increased, which results in improvement in bonding strength.

Effects of Invention

With the present invention, it is possible, in the piezoelectric resonator device having a sandwich structure, to conduct between both main surfaces of the second sealing member using the through holes while reducing the costs.

BRIEF DESCRIPTION OF DRAWINGS

FIG. 3 is a schematic rear view illustrating the first sealing member of the crystal resonator according to the embodiment of the present invention.

FIG. 4 is a schematic plan view illustrating a crystal resonator plate of the crystal resonator according to the embodiment of the present invention.

FIG. 5 is a schematic rear view illustrating the crystal resonator plate of the crystal resonator according to the embodiment of the present invention.

FIG. 6 is a schematic plan view illustrating a second sealing member of the crystal resonator according to the embodiment of the present invention.

MODES FOR CARRYING OUT INVENTION

Hereinafter, embodiments of the present invention will be described with reference to the drawings. In the following embodiment, the present invention is applied to a crystal resonator as a piezoelectric resonator device that causes piezoelectric resonance.

—Crystal Resonator—

Figure 1:
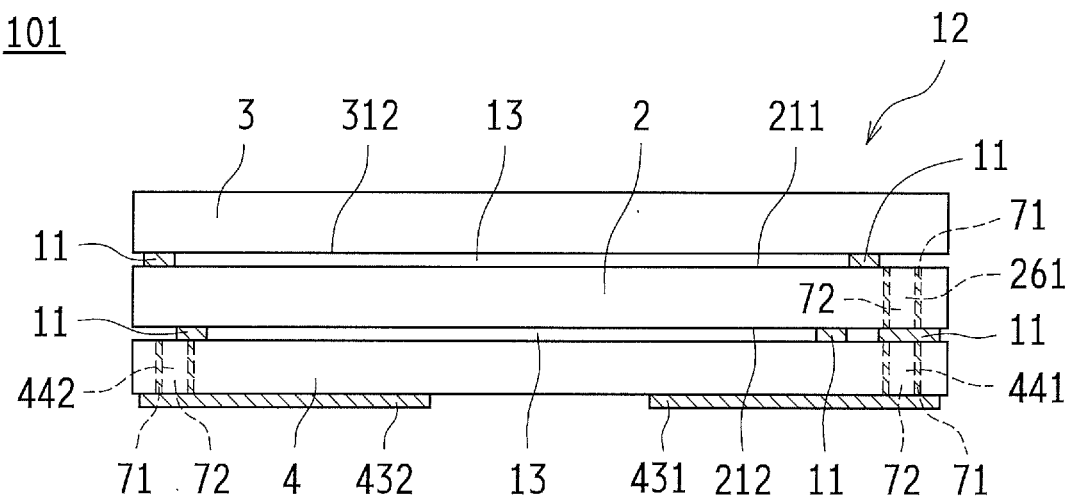
FIG. 1 is a schematic configuration diagram illustrating a configuration of a crystal resonator according to an embodiment of the present invention.

As shown in FIG. 1, a crystal resonator 101 according to this embodiment includes: a crystal resonator plate 2 (a piezoelectric resonator plate in the present invention); a first sealing member 3 that covers a first excitation electrode 221 (see FIG. 4) of the crystal resonator plate 2 so as to hermetically seal the first excitation electrode 221 that is formed on a first main surface 211 of the crystal resonator plate 2; and a second sealing member 4 disposed on a second main surface 212 of the crystal resonator plate 2 so as to cover a second excitation electrode 222 (see FIG. 5) of the crystal resonator plate 2, the second sealing member 4 for hermetically sealing the second excitation electrode 222 that makes a pair with the first excitation electrode 221.

In the crystal resonator 101, the crystal resonator plate 2 is bonded to the first sealing member 3, and also the crystal resonator plate 2 is bonded to the second sealing member 4. Thus, a package 12 having a sandwich structure is constituted.

An internal space 13 of the package 12 is formed by bonding the first sealing member 3 to the second sealing member 4 via the crystal resonator plate 2. In this internal space 13 of the package 12, an vibrating part 23 is hermetically sealed. The vibrating part 23 includes the first excitation electrode 221 and the second excitation electrode 222 respectively formed on both main surfaces 211 and 212 of the crystal resonator plate 2. As shown in FIG. 1, the internal space 13 is located so as to be deflected to one end side (left side) in plan view of the package 12.

The crystal resonator 101 according to this embodiment has a package size of 1.0×0.8 mm, which is reduced in size and height. According to the size reduction, no castellation is formed in the package 12. Through holes (see a first through hole 261, a second through hole 441 and a third through hole 442) are used for conduction between electrodes.

Next, the configuration of the above-described crystal resonator 101 will be described referring to FIGS. 1 to 7. Here, each of the crystal resonator plate 2, the first sealing member 3 and the second sealing member 4 will be described as a single body without bonded.

As shown in FIGS. 4 and 5, the crystal resonator plate 2 is made of a crystal as a piezoelectric material. Both main surfaces (the first main surface 211 and the second main surface 212) are formed as smooth flat surfaces (mirror-finished).

A pair of excitation electrodes (i.e., excitation electrodes making a pair with each other, that is, the first excitation electrode 221 and the second excitation electrode 222) is formed, respectively, on both main surfaces 211 and 212 (the first main surface 211 and the second main surface 212) of the crystal resonator plate 2. Also, in both main surfaces 211 and 212, two cut-out parts 24 (each having a penetration shape) are formed so as to surround the pair of first excitation electrode 221 and second excitation electrode 222, thus, the vibrating part 23 is formed. The cut-out parts 24 are constituted by a squared U-shaped part 241 in plan view (i.e., a part in plan view made up of three rectangles in plan view: one rectangle; and two rectangles extending from both ends of the one rectangle in the direction perpendicular to the longitudinal direction of the one rectangle), and an oblong rectangular shaped part 242 in plan view. A part between the squared U-shaped part 241 in plan view and the oblong rectangular shaped part 242 in plan view serves as a conduction path 213 on which are disposed extraction electrodes (a first extraction electrode 223 and a second extraction electrode 224) for extracting the first excitation electrode 221 and the second excitation electrode 222 to external electrode terminals (a first external electrode terminal 431 and a second external electrode terminal 432, as described later). Regarding electrode patterns, the first extraction electrode 223 and the second extraction electrode 224 extracted respectively from the pair of first excitation electrode 221 and second excitation electrode 222 are electrically connected to the external electrode electrodes (the first external electrode terminal 431 and the second external electrode terminal 432) formed on the second sealing member 4, via a resonator-plate-side first bonding pattern 251 and a resonator-plate-side second bonding pattern 252.

In the crystal resonator plate 2, respective resonator-plate-side sealing parts to be bonded to the first sealing member 3 and to the second sealing member 4 are provided on outward positions along the vibrating part 23 of both main surfaces 211 and 212, so that the vibrating part 23 is surrounded. As shown in FIGS. 4 and 5, the resonator-plate-side sealing parts 25 are located so as to be deflected to the left side in plan view of both main surfaces 211 and 212.

On the resonator-plate-side sealing part 25 on the first main surface 211 of the crystal resonator plate 2, the resonator-plate-side first bonding pattern 251 is formed to be bonded to the first sealing member 3. The first excitation electrode 221 is connected to the resonator-plate-side first bonding pattern 251. Also, on the resonator-plate-side sealing part 25 on the second main surface 212 of the crystal resonator plate 2, the resonator-plate-side second bonding pattern 252 is formed to be bonded to the second sealing member 4. The second excitation electrode 222 is connected to the resonator-plate-side second bonding pattern 252. The internal space 13 is formed in an inward position (inside) of the resonator-plate-side first bonding pattern 251 and the resonator-plate-side second bonding pattern 252.

The resonator-plate-side first bonding pattern 251, which is formed on the first main surface 211 of the crystal resonator plate 2 so as to be bonded to the first sealing member 3, is constituted by a base PVD film 2511 deposited on the first main surface 211 by physical vapor deposition, and an electrode PVD film 2512 deposited on the base PVD film 2511 by the physical vapor deposition. Also, the resonator-plate-side second bonding pattern 252, which is formed on the second main surface 212 of the crystal resonator plate 2 so as to be bonded to the second sealing member 4, is constituted by a base PVD film 2521 deposited on the second main surface 212 by the physical vapor deposition, and an electrode PVD film 2522 deposited on the base PVD film 2521 by the physical vapor deposition. That is, the resonator-plate-side first bonding pattern 251 and the resonator-plate-side second bonding pattern 252 have the same configuration in which a plurality of layers is laminated on the resonator-plate-side sealing part 25 of both main surfaces 211 and 212, specifically, a Ti layer (or a Cr layer) and an Au layer are deposited by vapor deposition in this order from the lowermost layer side. Like this, in the resonator-plate-side first bonding pattern 251 and the resonator-plate-side second bonding pattern 252, the base PVD films 2511 and 2521 are made of a single material (Ti or Cr), the electrode PVD films 2512 and 2522 are made of a single material (Au), and the electrode PVD films 2512 and 2522 have a thickness greater than the thickness of the base PVD films 2511 and 2521. The first excitation electrode 221 and the resonator-plate-side first bonding pattern 251 both formed on the first main surface 211 of the crystal resonator plate 2 have the same thickness, and the surfaces (main surfaces) of the first excitation electrode 221 and the resonator-plate-side first bonding pattern 251 are made of the same metal. The second excitation electrode 222 and the resonator-plate-side second bonding pattern 252 both formed on the second main surface 212 of the crystal resonator plate 2 have the same thickness, and the surfaces (main surfaces) of the second excitation electrode 222 and the resonator-plate-side second bonding pattern 252 are made of the same metal. The resonator-plate-side first bonding pattern 251 and the resonator-plate-side second bonding pattern 252 do not contain Sn. Note that when the resonator-plate-side first and second bonding patterns 251 and 252 are compared with the resonator plate side (first excitation electrode 221 and the second excitation electrode 222) in the configuration in which they have the same thickness and their surfaces are made of the same metal on the same main surface, it is possible to perform bonding even when the kind or thickness of the base metals (the base PVD films 2511 and 2521) differs, under the condition in which the uppermost layers (at least exposed surfaces, i.e., the electrode PVD films 2512 and 2522 and the like) are made of the same metal. The electrode PVD films 2512 and 2522 of the resonator-plate-side first bonding pattern 251 and the resonator-plate-side second bonding pattern 252 have respective scaly surfaces in plan view. Here, being scaly means a dense (or almost dense) state in plan view in which miscroscopically individual pieces of metal due to activation overlap with each other like a straw-mat.

As shown in FIGS. 4 and 5, the crystal resonator plate 2 includes the first through hole 261 (the through hole of the piezoelectric resonator plate in the present invention) that passes through between the first main surface 211 and the second main surface 212. The resonator-plate-side first bonding pattern 251 connected to the first excitation electrode 221 is extracted to the side of the second main surface 212 through the first through hole 261. As shown in FIGS. 1, 4 and 5, a through electrode 71 for conduction between the electrodes respectively formed on the first main surface 211 and the second main surface 212 is formed over an inner wall surface of the first through hole 261. A center of the first through hole 261 is a through part 72 that is a hollow passing through between the first main surface 211 and the second main surface 212. The first through hole 261 is disposed in the outward position of the internal space 13, and located so as to be defected to the other end side (right side) in plan view of both main surfaces 211 and 212, as shown in FIG. 4. Thus, the first through hole 261 is not formed in the inward position of the internal space 13. Here, the inward position of the internal space 13 means strictly the inner side of the inner peripheral surface of the bonding material 11, not including the position on the bonding material 11.

Figure 2:
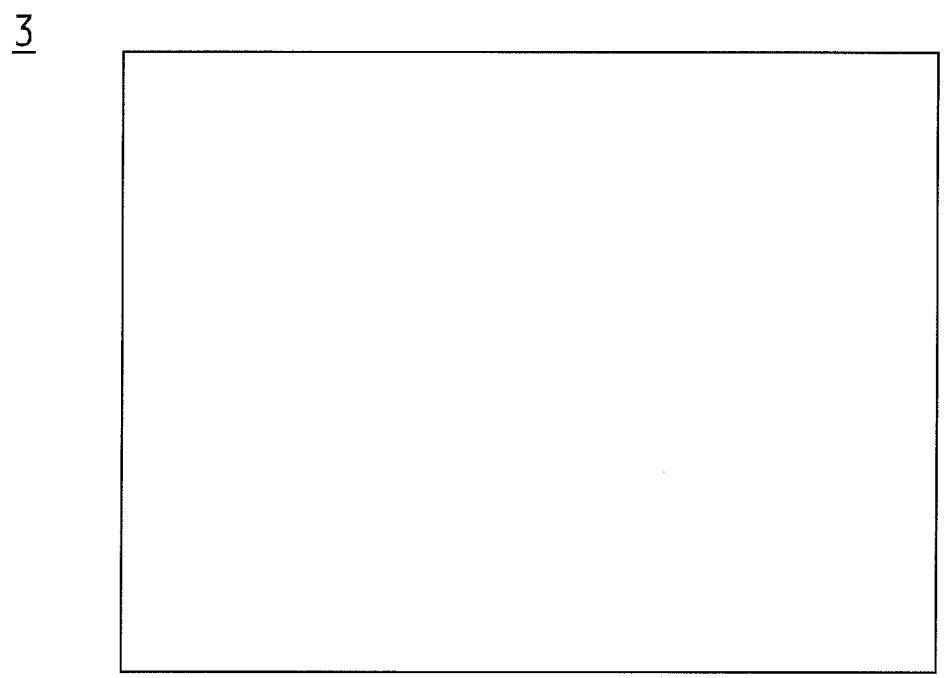
FIG. 2 is a schematic plan view illustrating a first sealing member of the crystal resonator according to the embodiment of the present invention.

The first sealing member 3 is made of a material having the flexural rigidity (moment of inertia of area×Young's modulus) of not more than 1000 [N·mm$^2$]. Specifically, as shown in FIGS. 2 and 3, the first sealing member 3 is a substrate having a rectangular parallelepiped shape that is made of a single glass wafer. A second main surface 312 (a surface to be bonded to the crystal resonator plate 2) of the first sealing member 3 is formed as a smooth flat surface (mirror finished).

On the second main surface 312 of the first sealing member 3, a sealing-member-side first sealing part 32 is disposed so as to be bonded to the crystal resonator plate 2. As shown in FIG. 3, the sealing-member-side first sealing part 32 is located so as to be deflected to the left side in plan view of the second main surface 312 of the first sealing member 3.

On the sealing-member-side first sealing part 32 of the first sealing member 3, a sealing-member-side first bonding pattern 321 is formed so as to be bonded to the crystal resonator plate 2. The sealing-member-side first bonding pattern 321 has the same width at all positions on the sealing-member-side first sealing part 32 of the first sealing member 3.

The sealing-member-side first bonding pattern 321 is constituted by a base PVD film 3211 deposited on the first sealing member 3 by the physical vapor deposition, and an electrode PVD film 3212 deposited on the base PVD film 3211 by the physical vapor deposition. In this embodiment, the base PVD film 3211 is made of Ti (or Cr), and the electrode PVD film 3212 is made of Au. Also, the sealing-member-side first bonding pattern 321 does not contain Sn. Specifically, the sealing-member-side first bonding pattern 321 is made of a plurality of layers laminated on the sealing-member-side first sealing part 32 of the second main surface 312, that is, a Ti layer (or a Cr layer) and an Au layer are deposited by the vapor deposition in this order from the lowermost layer side. Furthermore, in the sealing-member-side first bonding pattern 321, the electrode PVD film 3212 has a scaly surface in plan view.

The second sealing member 4 is made of a material having the flexural rigidity (moment of inertia of area× Young's modulus) of not more than 1000 [N·mm$^2$]. Specifically, as shown in FIG. 6, the second sealing member 4 is a substrate having a rectangular parallelepiped shape that is made of a single glass wafer. A first main surface 411 (a surface to be bonded to the crystal resonator plate 2) of the second sealing member 4 is formed as a smooth flat surface (mirror finished).

On the first main surface 411 of the second sealing member 4, a sealing-member-side second sealing part 42 is disposed so as to be bonded to the crystal resonator plate 2. As shown in FIG. 6, the sealing-member-side second sealing part 42 is located so as to be deflected to the left side in plan view of the first main surface 411 of the second sealing member 4.

Figure 7:
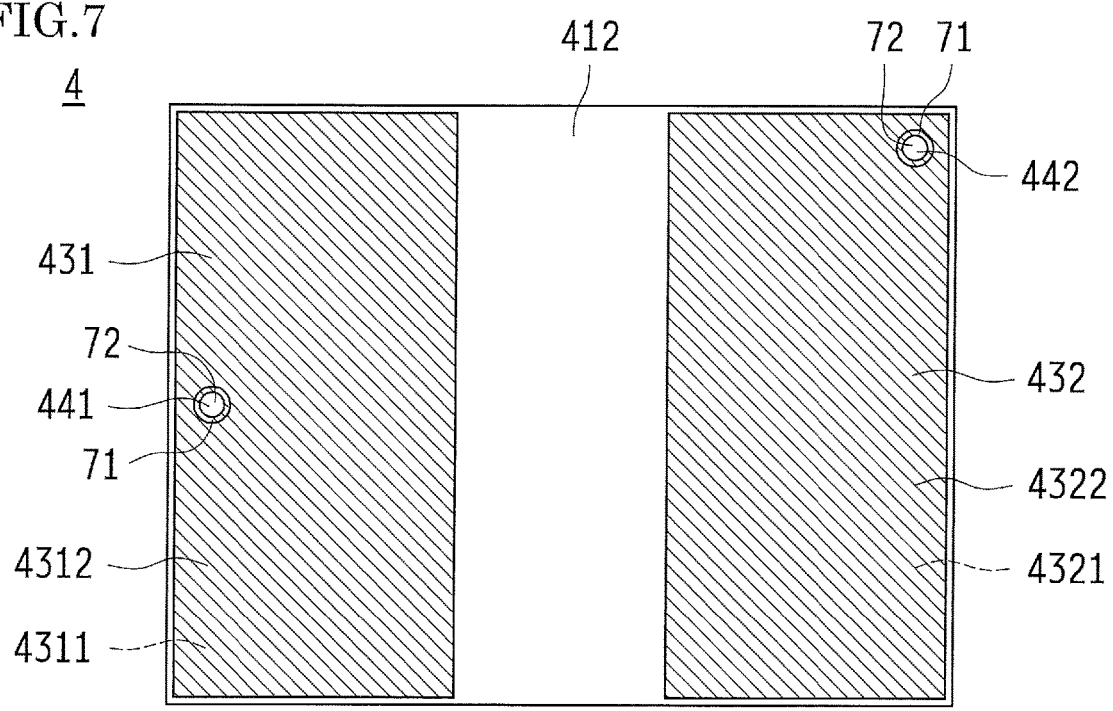
FIG. 7 is a schematic rear view illustrating the second sealing member of the crystal resonator according to the embodiment of the present invention.

Also, a pair of external electrode terminals (the first external electrode terminal 431 and the second external electrode terminal 432), which is electrically connected to the outside, is formed on a second main surface 412 (an outer main surface not facing the crystal resonator plate 2) of the second sealing member 4. The first external electrode terminal 431 is electrically connected, directly, to the first excitation electrode 221 via the resonator-plate-side first bonding pattern 251. The second external electrode terminal 432 is electrically connected, directly, to the second excitation electrode 222 via the resonator-plate-side second bonding pattern 252. As shown in FIG. 7, the first external electrode terminal 431 and the second external electrode terminal 432 are respectively located on both ends in the longitudinal direction in plan view of the second main surface 412 of the second sealing member 4. The pair of external electrode terminals (the first external electrode terminal 431 and the second external electrode terminal 432) is constituted by base PVD films 4311 and 4321 deposited on the second main surface 412 by the physical vapor deposition, and electrode PVD films 4312 and 4322 deposited on the base PVD films 4311 and 4321 by the physical vapor deposition. Compared with the base PVD films 2511, 2521, 3211 and 4211 of the above-described resonator-plate-side first bonding pattern 251, the resonator-plate-side second bonding pattern 252, the sealing-member-side first bonding pattern 321 and a sealing-member-side second bonding pattern 421, the base PVD films 4311 and 4321 of the external electrode terminals (the first external electrode terminal 431 and the second external electrode terminal 432) have a great thickness. Also, the first external electrode terminal 431 and the second external electrode terminal 432 each cover a region of not less than ⅓ of the area of the second main surface 412 of the second sealing member 4.

On the sealing-member-side second sealing part 42 of the second sealing member 4, the sealing-member-side second bonding pattern 421 is formed so as to be bonded to the crystal resonator plate 2. The sealing-member-side second bonding pattern 421 has the same width at all positions on the sealing-member-side second sealing part 42 of the second sealing member 4.

The sealing-member-side second bonding pattern 421 is constituted by the base PVD film 4211 deposited on the second sealing member 4 by the physical vapor deposition, and an electrode PVD film 4212 deposited on the base PVD film 4211 by the physical vapor deposition. In this embodiment, the base PVD film 4211 is made of Ti (or Cr), and the electrode PVD film 4212 is made of Au. Also, the sealing-member-side second bonding pattern 421 does not contain Sn. Specifically, the sealing-member-side second bonding pattern 421 is made of a plurality of layers laminated on the sealing-member-side second sealing part 42 of the second main surface 412, that is, a Ti layer (or a Cr layer) and an Au layer are deposited by the vapor deposition in this order from the lowermost layer side. Furthermore, in the sealing-member-side second bonding pattern 421, the electrode PVD film 4212 has a scaly surface in plan view.

As shown in FIGS. 1, 6 and 7, the second sealing member 4 includes two through holes (the second through hole 441 and the third through hole 442, i.e., the through holes of the second sealing member in the present invention) that pass through between the first main surface 411 and the second main surface 412. The through electrodes 71 for conduction between the electrodes respectively formed on the first main surface 411 and the second main surface 412 are formed over respective inner wall surfaces of the second through hole 441 and the third through hole 442. Each center of the second through hole 441 and the third through hole 442 is the through part 72 that is a hollow passing through between the first main surface 411 and the second main surface 412. The second through hole 441 and the third through hole 442 are disposed in the outward position of the internal space 13. As shown in FIGS. 6 and 7, the second through hole 441 is located so as to be defected to the right side in plan view of both main surfaces (the first main surface 411 and the second main surface 412) while the third through hole 442 is located on the upper left side in plan view. The second through hole 441 and the third through hole 442 are not formed in the inward position of the internal space 13. Here, the inward position of the internal space 13 means strictly the inner side of the inner peripheral surface of the bonding material 11, not including the position on the bonding material 11. Thus, the first external electrode terminal 431 is conducted to the resonator-plate-side first bonding pattern 251 that is connected to the first excitation electrode 221 of the crystal resonator plate 2, via the first through hole 261 of the crystal resonator plate 2 and the second through hole 441. Also, the second external electrode terminal 432 is conducted to the resonator-plate-side second bonding pattern 252 that is connected to the second excitation electrode 222 of the crystal resonator plate 2, via the third through hole 442 and the sealing-member-side second bonding pattern 421.

In the crystal resonator 101 having the above configuration, the crystal resonator plate 2 and the first sealing member 3 are subjected to diffusion bonding in a state in which the resonator-plate-side first bonding pattern 251 and the sealing-member-side first bonding pattern 321 are overlapped with each other, and the crystal resonator plate 2 and the second sealing member 4 are subjected to the diffusion bonding in a state in which the resonator-plate-side second bonding pattern 252 and the sealing-member-side second bonding pattern 421 are overlapped with each other, thus, the package 12 having the sandwich structure as shown in FIG. 1 is produced. In contrast to the conventional art, no special bonding material, such as an adhesive, is needed separately. Also, when the resonator-plate-side second bonding pattern 252 of the crystal resonator plate 2 is overlapped with the sealing-member-side second bonding pattern 421 of the second sealing member 4, the through part 72 of the through hole of the piezoelectric resonator plate (the first through hole 261) is at least partially (or in this embodiment, completely) superimposed to the through part 72 of the through hole of the second sealing member (the second through hole 441). The resonator-plate-side first bonding pattern 251 and the sealing-member-side first bonding pattern 321 themselves become the bonding material 11 formed upon the diffusion bonding. The resonator-plate-side second bonding pattern 252 and the sealing-member-side second bonding pattern 421 themselves become the bonding material 11 formed upon the diffusion bonding. In this embodiment, the diffusion bonding is performed at a room temperature. Here, the room temperature means the temperature in the range from 5 to 35° C. Advantageous effects as described later (suppression of generation of gas and improvement in bonding) are obtained by the diffusion bonding at the room temperature, which is lower than the melting point of 183° C. of the eutectic solder. Thus, this is a preferable embodiment. However, the advantageous effects described later can be obtained by the diffusion bonding performed at temperatures other than the room temperature. That is, the diffusion bonding may be performed at the temperature in the range from the room temperature to the temperature of less than 230° C. In particular, when the diffusion bonding is performed at the temperature in the range from 200° C. to less than 230° C., which is less than the melting point of 230° C. of the Pb-free solder and furthermore not less than the recrystallization temperature (200° C.) of Au, it is possible to stabilize an unstable region of the bonding part. Also, in this embodiment, since the special bonding material such as Au—Sn is not used, the gas such as plating gas, binder gas or metal gas is not generated. Thus, the temperature can be equal to or more than the recrystallization temperature of Au.

As described above, in the package 12 produced here, the sealing-member side first bonding pattern 321 is bonded to the resonator-plate-side first bonding pattern 251, and the sealing-member-side second bonding pattern 421 is bonded to the resonator-plate-side second bonding pattern 252, both by the diffusion bonding. Other than the above bonding, the sealing-member-side first bonding pattern 321 may be bonded to the resonator-plate-side first bonding pattern 251 by pressurized diffusion bonding, and the sealing-member-side second bonding pattern 421 may be bonded to the resonator-plate-side second bonding pattern 252 by the pressurized diffusion bonding. In this case, it is possible to easily ensure the bonding part (to increase substantially the bonding area) due to pressurizing, accordingly, the bonding by only the diffusion bonding can be performed more suitably without high-temperature heating.

Also, in the package 12 produced here, the first sealing member 3 and the crystal resonator plate 2 have a gap of not more than 1.00 µm. The second sealing member 4 and the crystal resonator plate 2 have a gap of not more than 1.00 µm. That is, the thickness of the bonding material 11 between the first sealing member 3 and the crystal resonator plate 2 is not more than 1.00 µm, and the thickness of the bonding material 11 between the second sealing member 4 and the crystal resonator plate 2 is not more than 1.00 µm (specifically, the thickness in the Au—Au bonding of this embodiment is 0.15 to 1.00 µm). As a comparative example, the conventional metal paste sealing material containing Sn has a thickness of 5 to 20 µm.

The thickness of the bonding pattern made by the diffusion bonding of the sealing-member-side first bonding pattern 321 and the resonator-plate-side first bonding pattern 251 is the same as the thickness of the bonding pattern made by the diffusion bonding of the sealing-member-side second bonding pattern 421 and the resonator-plate-side second bonding pattern 252, and is different from the thickness of the external electrode terminals (the first external electrode terminal 431 and the second external electrode terminal 432) that are electrically connected to the outside.

As shown in FIGS. 1 to 7, in the package 12 produced here, the internal space 13 is located so as to be deflected to the left side in plan view. Also, the sealing-member-side first bonding pattern 321 formed on the first sealing member 3 and the sealing-member-side second bonding pattern 421 formed on the second sealing member 4 are not superimposed to each other in plan view. Specifically, the region in the sealing-member-side first bonding pattern 321 in plan view is larger than the region in the sealing-member-side second bonding pattern 421 in plan view. In this embodiment, although the region in the sealing-member-side first bonding pattern 321 in plan view is larger than the region in the sealing-member-side second bonding pattern 421 in plan view, the present invention is not limited thereto. The region in the sealing-member-side second bonding pattern 421 in plan view may be larger than the region in the sealing-member-side first bonding pattern 321 in plan view. Since the first external electrode terminal 431 and the second external electrode terminal 432 are formed on the second sealing member 4, the region in the sealing-member-side first bonding pattern 321 in plan view is larger than the region in the sealing-member-side second bonding pattern 421 in plan view, accordingly, routing of the wiring pattern (ensuring the conduction path) becomes easy. Thus, the routing region of the wiring pattern (conduction-ensured region) can be increased.

Compared with the resonator-plate-side first bonding pattern 251 and the resonator-plate-side second bonding pattern 252 formed on the crystal resonator plate 2, the sealing-member-side first bonding pattern 321 formed on the first sealing member 3 and the sealing-member-side second bonding pattern 421 formed on the second sealing member 4 each have a large width.

As shown in FIGS. 1 and 3 to 6, the internal space 13 of the crystal resonator 101 produced here is located so as to be deflected to the left side in plan view.

In the second sealing member 4, the through holes (the second through hole 441 and the third through hole 442) are formed so as to be disposed in the outward position of the internal space 13. The through holes (the second through hole 441 and the third through hole 442) are not formed in the inward position of the internal space 13.

Figure 8:
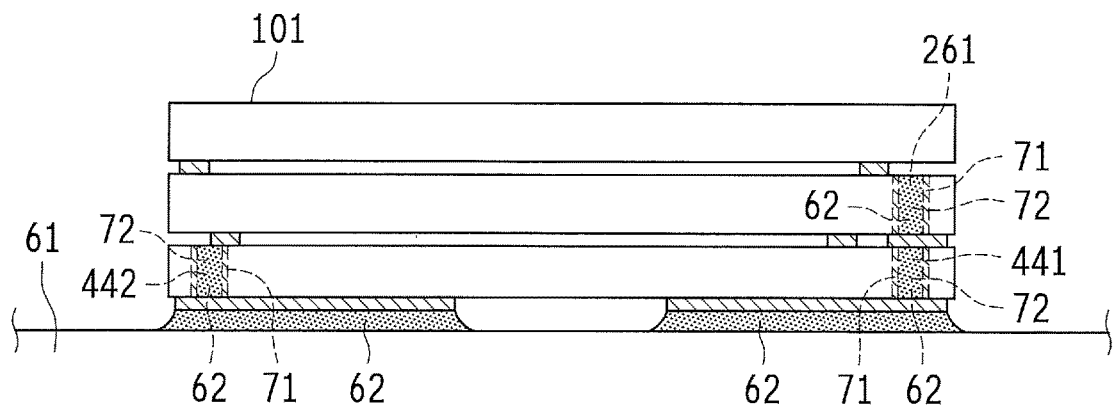
FIG. 8 is a diagram of a bonding structure of the crystal resonator of FIG. 1 and a circuit board, illustrating adhering positions of a flowable conductive bonding material in through holes.
Figure 9:
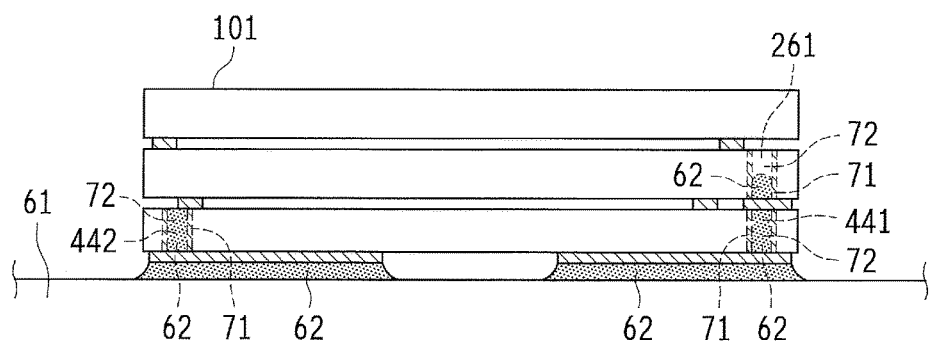
FIG. 9 is a diagram of the bonding structure of the crystal resonator of FIG. 1 and a circuit board, illustrating the adhering positions of the flowable conductive bonding material in the through holes.

The crystal resonator 101 produced as described above is electrically connected to the circuit board 61 using a flowable conductive bonding material (solder) 62. Here, in the bonding structure in which the external electrode terminals (the first external electrode terminal 431 and the second external electrode terminal 432) are electrically connected to the circuit board 61, the respective through parts 72 of the second through hole 441 and the third through hole 442 (the through holes of the second sealing member) are filled with the solder 62, and the through part 72 of the first through hole 261 that is a through hole of the piezoelectric resonator plate is filled with the solder 62, thus the crystal resonator 101 is bonded to the circuit board 61, as shown in FIGS. 8 and 9. In the bonding structure shown in FIG. 8, all the through parts 72 of the first through hole 261, the second through hole 441 and the third through hole 442 are completely filled with the solder 62. On the other hand, in the bonding structure shown in FIG. 9, the respective through parts 72 of the second through hole 441 and the third through hole 442 are completely filled with the solder 62 while the through part 72 of the first through hole 261 is partially filled with the solder 62.

As described above, in the crystal resonator 101 according to this embodiment, the through holes of the second sealing member (the second through hole 441 and the third through hole 442) each have the through electrode 71 and further the through part 72, which means that the through electrode 71 is not formed in the through part 72. Thus, it is possible to reduce the material for the through electrodes 71 by the amount corresponding to the through electrodes 71 with which the through parts 72 are to be filled, which results in cost reduction. Furthermore, with this embodiment, it is possible to conduct between both main surfaces (i.e., between the first main surface 411 and the second main surface 412) of the second sealing member 4 by the through electrodes 71 that are formed on the through holes of the second sealing member (the second through hole 441 and the third through hole 442). For this reason, there is no need to fill the through holes of the second sealing member (the second through hole 441 and the third through hole 442) with a metal electrode material, in contrast to the conventional art (such as disclosed in Patent Document 1).

Also, with this embodiment, in the bonding structure for being electrically connected to the external circuit board 61 using the solder 62, the through holes of the second sealing member (the second through hole 441 and the third through hole 442) each have the through electrode 71 and further the through electrodes 71. Thus, when the external electrode terminals (the first external electrode terminal 431 and the second external electrode terminal 432) are electrically connected to the external circuit board 61 using the solder 62, the solder 62 creeps up the through parts 72 of the through holes of the second sealing member (the second through hole 441 and the third through hole 442) along the through holes of the second sealing member (the second through hole 441 and the third through hole 442) from the external electrode terminals (the first external electrode terminal 431 and the second external electrode terminal 432). When using a large amount of solder 62, the through parts 72 of the through holes of the second sealing member (the second through hole 441 and the third through hole 442) are filled with the solder 62 (see FIG. 8). For this reason, when the crystal resonator 101 is bonded to the external circuit board 61, bonding stress is applied to the external electrode terminals (the first external electrode terminal 431 and the second external electrode terminal 432). However, the bonding stress is dispersed by the amount corresponding to the solder 62 that creeps up the through parts 72 of the through holes of the second sealing member (the second through hole 441 and the third through hole 442) along the through holes of the second sealing member (the second through hole 441 and the third through hole 442). Therefore, when the crystal resonator 101 is bonded to the external circuit board 61, it is possible to substantially reduce the bonding stress that is applied to the external electrode terminals (the first external electrode terminal 431 and the second external electrode terminal 432).

When the external electrode terminals (the first external electrode terminal 431 and the second external electrode terminal 432) are electrically connected to the circuit board 61 using the solder 62, the solder 62 adheres to the external electrode terminals (the first external electrode terminal 431 and the second external electrode terminal 432), and further spreads over and adheres to the through electrodes 71 of the through holes of the second sealing member (the second through hole 441 and the third through hole 442). Thus, it is possible to substantially increase the bonding region. Such functions and effects are suitable for the miniaturized crystal resonator 101. Even when the package of the crystal resonator 101 is reduced in size, the bonding region can be substantially maintained or even increased, which results in improvement in bonding strength.

The through part 72 of the first through hole 261 is at least partially (or in this embodiment, completely) superimposed to the through part 72 of the through hole of the second sealing member (the second through hole 441 or the third through hole 442). Thus, it is possible to prevent misalignment in lamination of the second sealing member 4 and the crystal resonator plate 2 by the use of the first through hole 261 and the through hole of the second sealing member (the second through hole 441 or the third through hole 442), i.e., by confirming their superimposed part.

In this embodiment, there is no variation in the height of the package 12 of the crystal resonator 101. For example, unlike this embodiment, if using the metal paste sealing material such as an Sn-containing bonding material that makes a gap of more than 1 μm between the crystal resonator plate 2 and the sealing members (the first sealing member 3 and the second sealing member 4 in this embodiment), the variation in height occurs when the metal paste sealing material is formed on the patterns (the resonator-plate-side first bonding pattern 251, the resonator-plate-side second bonding pattern 252, the sealing-member-side first bonding pattern 321 and the sealing-member-side second bonding pattern 421). Also, after bonding, due to heat capacity distribution in the formed patterns (the resonator-plate-side first bonding pattern 251, the resonator-plate-side second bonding pattern 252, the sealing-member-side first bonding pattern 321 and the sealing-member-side second bonding pattern 421), the even gaps (the gap between the first sealing member 3 and the crystal resonator plate 2 of this embodiment and the gap between the second sealing member 4 and the crystal resonator plate 2 of this embodiment) are not formed. Therefore, in the conventional art, when three members (i.e., the first sealing member, the second sealing member and the piezoelectric resonator plate) are laminated, the respective gaps between the members are different. As a result, the laminated three members are bonded in a state in which they are not parallel to each other. This problem becomes remarkable according to the reduction in package height. In this embodiment, since the upper limit of the gap is set to 1.00 μm, the three members (i.e., the first sealing member 3, the second sealing member 4 and the crystal resonator plate 2) can be laminated and bonded in a state in which they are parallel to each other, thus, this embodiment can be adaptable to the height reduction.

Furthermore, in the second sealing member 4, since the through holes (the second through hole 441 and the third through hole 442) are formed so as to be located in the outward position of the internal space 13, the second through hole 441 and the third through hole 442 do not affect the internal space 13. Thus, compared with the configuration in which the second through hole 441 and the third through hole 442 are disposed in the inward position of the internal space 13, it is possible to avoid the poor hermeticity caused by the second through hole 441 and the third through hole 442.

Unlike this embodiment, when the through holes are disposed in the internal space, it is necessary to ensure the hermeticity of the internal space, thus, it is necessary to add a process to fill the through holes in the internal space with a metal and the like. In contrast, in this embodiment, since the through holes (the second through hole 441 and the third through hole 442) are formed in the outward position of the internal space 13, routing of the wiring pattern can be made in the same process as the pattern formation of the resonator-plate-side first bonding pattern 251, the resonator-plate-side second bonding pattern 252, the sealing-member-side first bonding pattern 321 and the sealing-member-side second bonding pattern 421. Thus, it is possible to reduce the production cost.

Since the internal space 13 is located so as to be deflected to one end side in plan view (to the left side in plan view in this embodiment), it is easy to form the through hole (the second through hole 441) and the electrode pattern on the other end side in plan view (on the right side in plan view in this embodiment), thus, it is easy to form the electrode patterns that may affect the first excitation electrode 221 and the second excitation electrode 222 disposed in the internal space 13. Also, it is easy to dispose the through holes (the second through hole 441 and the third through hole 442) that may affect the hermeticity of the internal space 13.

On the first sealing member 3, the sealing-member-side first bonding pattern 321 having the same width at all positions is formed. On the second sealing member 4, the sealing-member-side second bonding pattern 421 having the same width at all positions is formed. In the second sealing member 4, the thorough holes (the second through hole 441 and the third through hole 442) are formed so as to be located in the outward position of the internal space 13. Thus, it is possible to prevent the bonding material 11 from flowing toward the pattern having a larger width due to difference in the width of the pattern. As a result, it is possible to stabilize the bonded state of the first sealing member 3 and the second sealing member 4 to the crystal resonator plate 2. Furthermore, in the second sealing member 4, since the through holes (the second through hole 441 and the third through hole 442) are formed so as to be located in the outward position of the internal space 13, the through holes (the second through hole 441 and the third through hole 442) do not affect the internal space 13. Thus, compared with the configuration in which the through holes (the second through hole 441 and the third through hole 442) are disposed in the inward position of the internal space 13, it is possible to avoid the poor hermeticity caused by the through holes (the second through hole 441 and the third through hole 442).

In the bonding structure of the crystal resonator 101 and the circuit board 61 according to this embodiment, when the external electrode terminals (the first external electrode terminal 431 and the second external electrode terminal 432) are electrically connected to the circuit board 61, the through parts 72 of the through holes of the second sealing member (the second through hole 441 and the third through hole 442) are filled with the solder 62. Thus, it is possible to reduce the material for the through electrodes 71 by the amount corresponding to the solder 62 filling the through electrodes 71, in contrast to the conventional art (such as disclosed in Patent Document 1). For this reason, there is no need to fill the through holes of the second sealing member (the second through hole 441 and the third through hole 442) with a metal electrode material, in contrast to the conventional art.

In the bonding structure of the crystal resonator 101 and the circuit board 61 according to this embodiment, the solder 62 creeps up the through parts 72 of the through holes of the second sealing member (the second through hole 441 and the third through hole 442) along the through holes of the second sealing member (the second through hole 441 and the third through hole 442) from the external electrode terminals (the first external electrode terminal 431 and the second external electrode terminal 432). When using a large amount of solder 62, the through parts 72 of the through holes of the second sealing member (the second through hole 441 and the third through hole 442) are filled with the solder 62 (see FIG. 8). For this reason, when the crystal resonator 101 is bonded to the circuit board 61, bonding stress is applied to the external electrode terminals (the first external electrode terminal 431 and the second external electrode terminal 432). However, the bonding stress is dispersed by the amount corresponding to the solder 62 that creeps up the through parts 72 of the through holes of the second sealing member (the second through hole 441 and the third through hole 442) along the through holes of the second sealing member (the second through hole 441 and the third through hole 442). Therefore, when the crystal resonator 101 is bonded to the external circuit board 61, it is possible to substantially reduce the bonding stress that is applied to the external electrode terminals (the first external electrode terminal 431 and the second external electrode terminal 432).

When the external electrode terminals (the first external electrode terminal 431 and the second external electrode terminal 432) are electrically connected to the circuit board 61 using the solder 62, the solder 62 adheres to the external electrode terminals (the first external electrode terminal 431 and the second external electrode terminal 432), and further spreads over and adheres to the through electrodes 71 of the through holes of the second sealing member (the second through hole 441 and the third through hole 442). Thus, it is possible to substantially increase the bonding region. Such functions and effects are suitable for the miniaturized crystal resonator 101. Even when the package of the crystal resonator 101 is reduced in size, the bonding region can be substantially maintained or even increased, which results in improvement in bonding strength.

In the bonding structure of the crystal resonator 101 and the circuit board 61 according to this embodiment, when the external electrode terminals (the first external electrode terminal 431 and the second external electrode terminal 432) are electrically connected to the circuit board 61, the through part 72 of the first through hole 261 and the through parts 72 of the through holes of the second sealing member (the second through hole 441 and the third through hole 442) are filled with the solder 62. Thus, it is possible to suitably reduce the material for the through electrode 71 of the first through hole 261 and the through electrodes 71 of the through holes of the second sealing member (the second through hole 441 and the third through hole 442) by the amount corresponding to the solder 62 filling the through part 72 of the first through hole 261 and the through parts 72 of the through holes of the second sealing member (the second through hole 441 and the third through hole 442), in contrast to the conventional art (such as disclosed in Patent Document 1). For this reason, there is no need to fill the first through hole 261 and the through holes of the second sealing member (the second through hole 441 and the third through hole 442) with a metal electrode material, in contrast to the conventional art.

In the bonding structure of the crystal resonator 101 and the circuit board 61 according to this embodiment, the solder 62 creeps up the through parts 72 of the through holes of the second sealing member (the second through hole 441 and the third through hole 442) and the through part 72 of the first through hole 261 along the through holes of the second sealing member (the second through hole 441 and the third through hole 442) and the first through hole 261 from the external electrode terminals (the first external electrode terminal 431 and the second external electrode terminal 432). Thus, the through parts 72 of the through holes of the second sealing member (the second through hole 441 and the third through hole 442) and the through part 72 of the first through hole 261 are filled with the solder 62. For this reason, when the crystal resonator 101 is bonded to the circuit board 61, bonding stress is applied to the external electrode terminals (the first external electrode terminal 431 and the second external electrode terminal 432). However, the bonding stress is dispersed by the amount corresponding to the solder 62 that creeps up the through parts 72 of the through holes of the second sealing member (the second through hole 441 and the third through hole 442) and the through part 72 of the first through hole 261 along the through holes of the second sealing member (the second through hole 441 and the third through hole 442) and the first through hole 261. Therefore, when the crystal resonator 101 is bonded to the external circuit board 61, it is possible to substantially reduce the bonding stress that is applied to the external electrode terminals (the first external electrode terminal 431 and the second external electrode terminal 432).

When the external electrode terminals (the first external electrode terminal 431 and the second external electrode terminal 432) are electrically connected to the circuit board 61 using the solder 62, the solder 62 adheres to the external electrode terminals (the first external electrode terminal 431 and the second external electrode terminal 432), and further spreads over and adheres to the through electrodes 71 of the through holes of the second sealing member (the second through hole 441 and the third through hole 442) and the through part 72 of the first through hole 261. Thus, it is suitable for substantially increase the bonding region. Such functions and effects are suitable for the miniaturized crystal resonator 101. Even when the package of the crystal resonator 101 is reduced in size, the bonding region can be substantially maintained or even increased, which results in improvement in bonding strength.

In this embodiment, the first sealing member 3 and the second sealing member 4 are made of glass, however, the present invention is not limited thereto. They may be made of crystal.

In this embodiment, the piezoelectric resonator plate is made of crystal, however, the present invention is not limited thereto. It may be made of another material such as lithium niobate and lithium tantalate, i.e., a piezoelectric material.

In this embodiment, the bonding material 11 is made of Ti (or Cr) and Au, however, the present invention is not limited thereto. The bonding material 11 may be made, for example, of Ni and Au.

In this embodiment, the resonator-plate-side first bonding pattern 251, the resonator-plate-side second bonding pattern 252, the sealing-member-side first bonding pattern 321 and the sealing-member-side second bonding pattern 421 contain Ti (or Cr) and Au. However, the present invention is not limited thereto. They may contain Cu (a single Cu or a Cu alloy), which can contribute to stress relaxation at the time of producing (e.g. when bonding or when the device is shocked due to an external force by, for example, pressurizing) or at the time of using (e.g. when solder-mounting is performed or when the device is shocked by an external force such as falling shock). That is, if the resonator-plate-side first bonding pattern 251, the resonator-plate-side second bonding pattern 252, the sealing-member-side first bonding pattern 321 and the sealing-member-side second bonding pattern 421 contain Cu, the mechanical strength is improved.

Also, if Cr is contained in the base PVD films 2511, 2521, 3211 and 4211, it is possible to prevent Cr from diffusing into the electrode PVD films 2512, 2522, 3212 and 4212 because of Cu contained in the base PVD films 2511, 2521, 3211 and 4211. As a result, even when the layer using Cr is made thick, it is possible to prevent Cr from diffusing into the electrode PVD films 2512, 2522, 3212 and 4212, thus thickening the Cr layer results in suppression of the production variation. Specifically, even when the Cr layer has a thickness of 0.2 μm, it is possible to prevent Cr from diffusing into the electrode PVD films 2512, 2522, 3212 and 4212.

In this embodiment, the second sealing member 4 is a substrate having a rectangular parallelepiped shape that is made of a single glass wafer. However, the present invention is not limited thereto. It may be two rectangular parallelepiped substrates each made of a glass wafer. In this case, the sealing-member-side second bonding pattern 421, the third through hole 442 and the second external electrode terminal 432 are formed on the one rectangular parallelepiped substrate for hermetically sealing, and the second through hole 441 and the first external electrode terminal 431 are formed on the other rectangular parallelepiped substrate. With such a configuration, it is possible to separate the pair of external electrode terminals (the first external electrode terminal 431 and the second external electrode terminal 432) completely from each other, thus preventing the short-circuiting. Also, if the second sealing member 4 is made up of the two rectangular parallelepiped substrates made of a metal material, not the glass wafer, there is no need for further forming the third through hole 442. Thus, reducing the number of the through holes results in the reduction in size.

In this embodiment, the first extraction electrode 223 and the second extraction electrode 224 are formed as shown in FIGS. 1 to 7. However, the present invention is not limited thereto. Cr may be used as the uppermost layer on respective arbitrary positions of the first extraction electrode 223 and the second extraction electrode 224, and a gap may exist between the first extraction electrode 223 and the resonator-plate-side first bonding pattern 251, and between the second extraction electrode 224 and the resonator-plate-side second bonding pattern 252. Preferably, the gap is disposed on the resonator-plate-side sealing part 25. With such a configuration, the first extraction electrode 223 is not electrically connected to the resonator-plate-side first bonding pattern 251, and the second extraction electrode 224 is not electrically connected to the resonator-plate-side second bonding pattern 252, before bonding by the heat-melting in the production process. As a result, it is possible to perform various inspections for only the excitation electrodes (the first excitation electrode 221 and the second excitation electrode 222) in the vibration inspection process, which results in a high degree of freedom in the vibration inspections.

As described above, in the aspect shown in FIG. 8, it is possible to provide the functions and effects by filling completely the through part 72 of the first through hole 261 and the through parts 72 of the through holes of the second sealing member (the second through hole 441 and the third through hole 442) with the solder 62. In order to obtain the above functions and effects, this embodiment is optimal. However, it is also possible to provide, to a certain extent, the above functions and effects by filling only the through parts 72 of the through holes of the second sealing member (the second through hole 441 and the third through hole 442) with the solder 62. Also, as shown in FIG. 9, it is also possible to provide, to a certain extent, the above functions and effects by filling partially the through part 72 of the through hole of the piezoelectric resonator plate (the first through hole 261) and by filling completely the through parts 72 of the through holes of the second sealing member (the second through hole 441 and the third through hole 442) with the solder 62. Furthermore, it is also possible to provide, to a certain extent, the above functions and effects by filling partially the through parts 72 of the through holes of the second sealing member (the second through hole 441 and the third through hole 442) with the solder 62.

—Crystal Oscillator—

In this embodiment, the crystal resonator is used as a piezoelectric resonator device. However, the present invention is not limited thereto. A crystal oscillator (see FIG. 10) described later may be applied. Hereinafter, an embodiment will be described, in which the present invention is applied to a crystal oscillator as a piezoelectric resonator device that causes piezoelectric resonance. For the sake of convenience, the common configuration with the above-described crystal resonator 101 will be described referring to the same reference numerals. Also, since functions and effects obtained by the common configuration are similar to those of the crystal resonator 101 shown in FIG. 1, such functions and effects are omitted from the following description.

Figure 10:
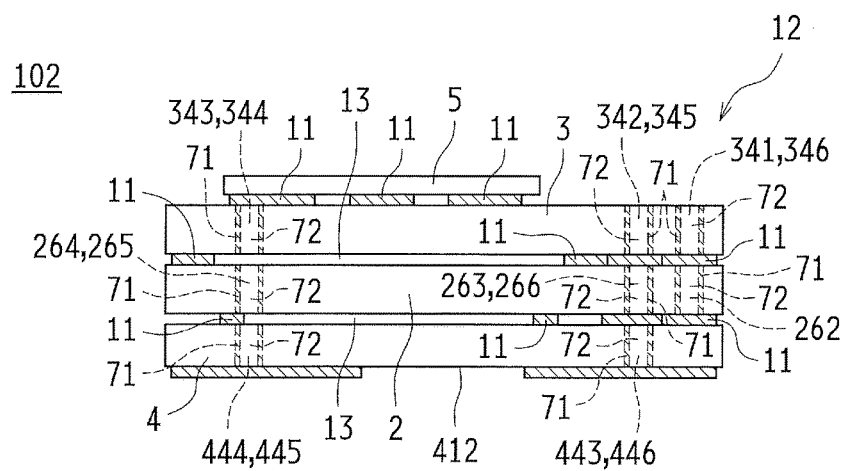
FIG. 10 is a schematic configuration diagram illustrating a configuration of a crystal oscillator according to an embodiment of the present invention.

As shown in FIG. 10, a crystal oscillator 102 according to this embodiment includes: the crystal resonator plate 2 (a piezoelectric resonator plate in the present invention); the first sealing member 3 that covers the first excitation electrode 221 (see FIG. 13) of the crystal resonator plate 2 so as to hermetically seal the first excitation electrode 221 that is formed on the first main surface 211 of the crystal resonator plate 2; the second sealing member 4 disposed on the second main surface 212 of the crystal resonator plate 2 so as to cover the second excitation electrode 222 (see FIG. 14) of the crystal resonator plate 2, the second sealing member 4 for hermetically sealing the second excitation electrode 222 that makes a pair with the first excitation electrode 221; and an electronic component element (an IC 5 in this embodiment), which is other than the piezoelectric resonator element, mounted on the first sealing member 3.

In the crystal oscillator 102, the crystal resonator plate 2 is bonded to the first sealing member 3, and also the crystal resonator plate 2 is bonded to the second sealing member 4. Thus, the package 12 having a sandwich structure is constituted.

The internal space 13 of the package 12 is formed by bonding the first sealing member 3 to the second sealing member 4 via the crystal resonator plate 2. In this internal space 13 of the package 12, the vibrating part 23 is hermetically sealed. The vibrating part 23 includes the first excitation electrode 221 and the second excitation electrode 222 respectively formed on both main surfaces 211 and 212 of the crystal resonator plate 2. As shown in FIG. 10, the internal space 13 is located so as to be deflected to one end side (left side) in plan view of the package 12.

The crystal oscillator 102 according to this embodiment has a package size of 1.2×1.0 mm, which is reduced in size and height. According to the size reduction, no castellation is formed in the package 12. Through holes (a fourth through hole 262 to an eighteenth through hole 446) are used for conduction between electrodes.

Next, the configuration of the above-described crystal oscillator 102 will be described referring to FIGS. 10 to 16. Here, each of the crystal resonator plate 2, the first sealing member 3 and the second sealing member 4 will be described as a single body without bonded.

Figure 13:
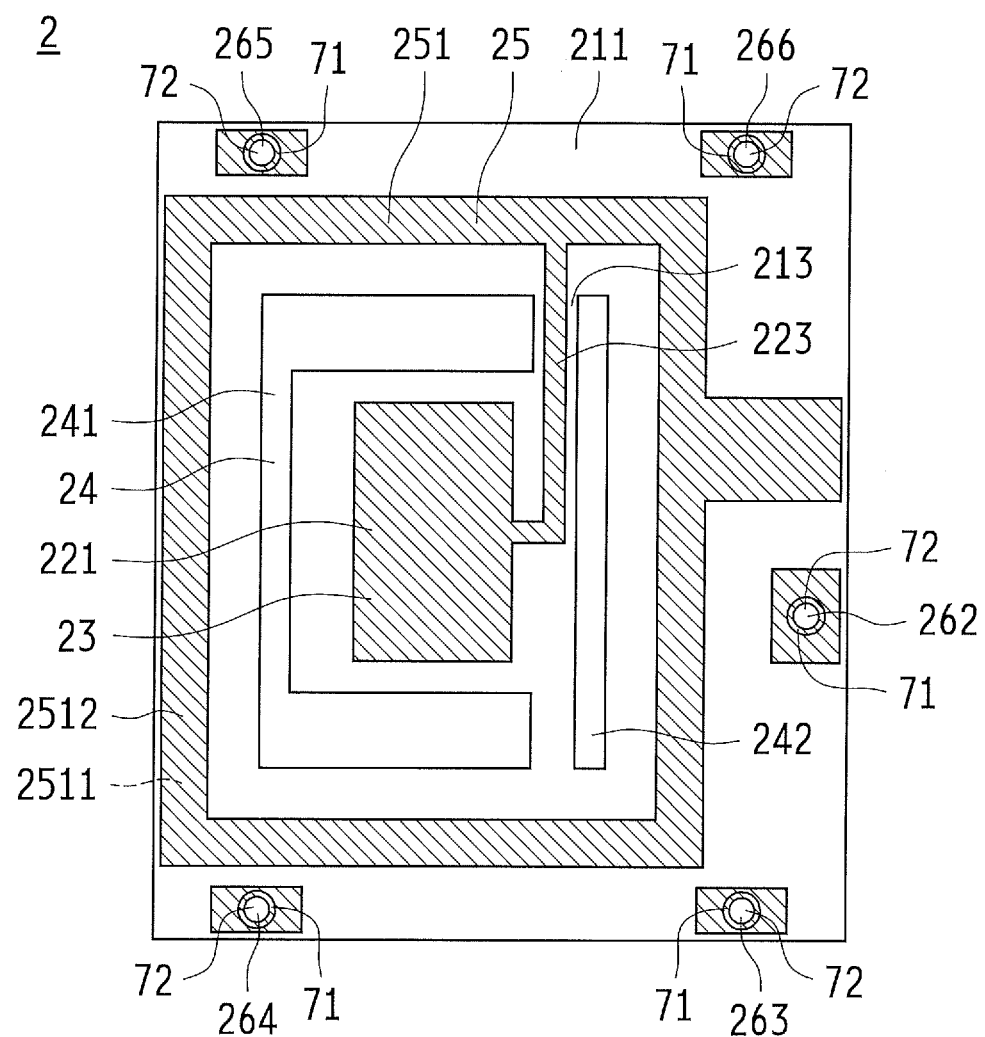
FIG. 13 is a schematic plan view illustrating a crystal resonator plate of the crystal oscillator according to the embodiment of the present invention.
Figure 14:
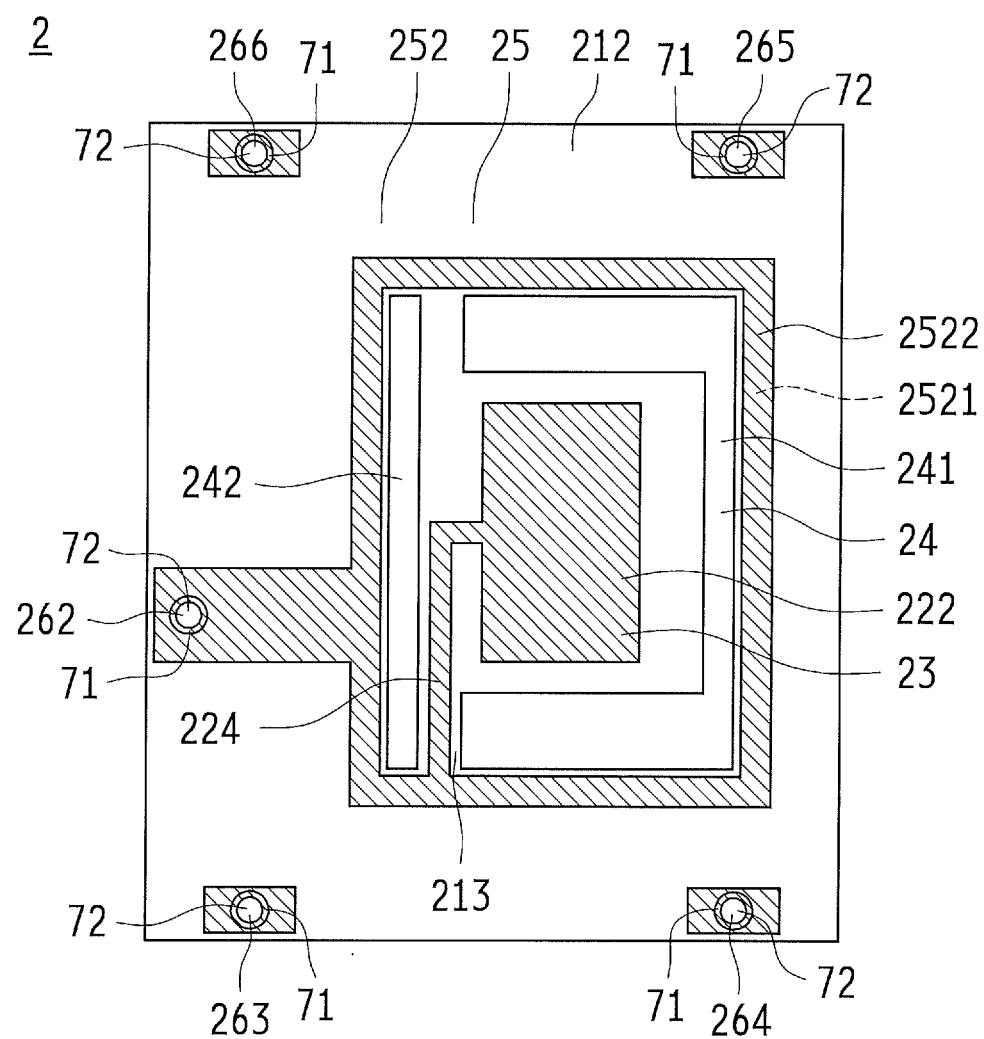
FIG. 14 is a schematic rear view illustrating the crystal resonator plate of the crystal oscillator according to the embodiment of the present invention.

As shown in FIGS. 13 and 14, the crystal resonator plate 2 is made of a crystal as a piezoelectric material. Both main surfaces (the first main surface 211 and the second main surface 212) are formed as smooth flat surfaces (mirror-finished).

A pair of excitation electrodes (i.e., excitation electrodes making a pair with each other, that is, the first excitation electrode 221 and the second excitation electrode 222) is formed, respectively, on both main surfaces 211 and 212 (the first main surface 211 and the second main surface 212) of the crystal resonator plate 2. Also, in both main surfaces 211 and 212, two cut-out parts 24 (each having a penetration shape) are formed so as to surround the pair of first excitation electrode 221 and second excitation electrode 222, thus, the vibrating part 23 is formed. The cut-out parts 24 are constituted by the squared U-shaped part 241 in plan view (i.e., a part in plan view made up of three rectangles in plan view: one rectangle; and two rectangles extending from both ends of the one rectangle in the direction perpendicular to the longitudinal direction of the one rectangle), and the oblong rectangular shaped part 242 in plan view. A part between the squared U-shaped part 241 in plan view and the oblong rectangular shaped part 242 in plan view serves as the conduction path 213 on which are disposed the extraction electrodes (the first extraction electrode 223 and the second extraction electrode 224) for extracting the first excitation electrode 221 and the second excitation electrode 222 to the external electrode terminals (see herein below). Regarding the electrode patterns, the first extraction electrode 223 and the second extraction electrode 224 extracted respectively from the pair of first excitation electrode 221 and second excitation electrode 222 are electrically connected to electrode patterns 33 formed on the first sealing member 3, via the resonator-plate-side first bonding pattern 251 and the resonator-plate-side second bonding pattern 252.

In the crystal resonator plate 2, the respective resonator-plate-side sealing parts 25 to be bonded to the first sealing member 3 and to the second sealing member 4 are provided on outward positions along the vibrating part 23 of both main surfaces 211 and 212, so that the vibrating part 23 is surrounded. As shown in FIGS. 13 and 14, the resonator-plate-side sealing parts 25 are located so as to be deflected to the left side in plan view of both main surfaces 211 and 212.

On the resonator-plate-side sealing part 25 on the first main surface 211 of the crystal resonator plate 2, the resonator-plate-side first bonding pattern 251 is formed so as to be bonded to the first sealing member 3. The first excitation electrode 221 is connected to the resonator-plate-side first bonding pattern 251. The resonator-plate-side first bonding pattern 251 is constituted by the base PVD film 2511 deposited on the first main surface 211 by the physical vapor deposition, and the electrode PVD film 2512 deposited on the base PVD film 2511 by the physical vapor deposition. Also, on the resonator-plate-side sealing part 25 on the second main surface 212 of the crystal resonator plate 2, the resonator-plate-side second bonding pattern 252 is formed so as to be bonded to the second sealing member 4. The second excitation electrode 222 is connected to the resonator-plate-side second bonding pattern 252. The resonator-plate-side second bonding pattern 252 is constituted by the base PVD film 2521 deposited on the second main surface 212 by the physical vapor deposition, and the electrode PVD film 2522 deposited on the base PVD film 2521 by the physical vapor deposition. The internal space 13 is formed in the inward position (inside) of the resonator-plate-side first bonding pattern 251 and the resonator-plate-side second bonding pattern 252.

The resonator-plate-side first bonding pattern 251 and the resonator-plate-side second bonding pattern 252 have the same configuration in which a plurality of layers is laminated on the resonator-plate-side sealing part 25 of both main surfaces 211 and 212, specifically, a Ti layer (or a Cr layer) and an Au layer are deposited by the vapor deposition in this order from the lowermost layer side. Like this, in the resonator-plate-side first bonding pattern 251 and the resonator-plate-side second bonding pattern 252, the base PVD films 2511 and 2521 are made of a single material (Ti or Cr), the electrode PVD films 2512 and 2522 are made of a single material (Au), and the electrode PVD films 2512 and 2522 have a thickness greater than the thickness of the base PVD films 2511 and 2521. The first excitation electrode 221 and the resonator-plate-side first bonding pattern 251 both formed on the first main surface 211 of the crystal resonator plate 2 have the same thickness, and the surfaces (main surfaces) of the first excitation electrode 221 and the resonator-plate-side first bonding pattern 251 are made of the same metal. The second excitation electrode 222 and the resonator-plate-side second bonding pattern 252 both formed on the second main surface 212 of the crystal resonator plate 2 have the same thickness, and the surfaces (main surfaces) of the second excitation electrode 222 and the resonator-plate-side second bonding pattern 252 are made of the same metal. The resonator-plate-side first bonding pattern 251 and the resonator-plate-side second bonding pattern 252 do not contain Sn. Note that when the resonator-plate-side first and second bonding patterns 251 and 252 are compared with the resonator plate side (first excitation electrode 221 and the second excitation electrode 222) in the configuration in which they have the same thickness and their surfaces are made of the same metal on the same main surface, it is possible to perform bonding even when the kind or thickness of the base metals (the base PVD films 2511 and 2521) differs, under the condition in which the uppermost layers (at least exposed surfaces, i.e., the electrode PVD films 2512 and 2522 and the like) are made of the same metal. The electrode PVD films 2512 and 2522 of the resonator-plate-side first bonding pattern 251 and the resonator-plate-side second bonding pattern 252 have respective scaly surfaces in plan view. Here, being scaly means a dense (or almost dense) state in plan view in which miscroscopically individual pieces of metal due to activation overlap with each other like a straw-mat.

As shown in FIGS. 13 and 14, the crystal resonator plate 2 includes the through holes of the piezoelectric resonator plate (the fourth through hole 262, the fifth through hole 263, the sixth through hole 264, the seventh through hole 265 and the eighth through hole 266) that pass through between the first main surface 211 and the second main surface 212. The resonator-plate-side second bonding pattern 252 connected to the second excitation electrode 222 is extracted to the side of the first main surface 211 through the fourth through hole 262. The fifth through hole 263, which is connected to the tenth through hole 342 of the first sealing member 3 and to the fifteenth through hole 443 of the second sealing member 4, is a conduction path so that the IC 5 is conducted to a first external electrode terminal 433. The sixth through hole 264, which is connected to the eleventh through hole 343 of the first sealing member 3 and to the sixteenth through hole 444 of the second sealing member 4, is a conduction path so that the IC 5 is conducted to a second external electrode terminal 434. The seventh through hole 265, which is connected to the twelfth through hole 344 of the first sealing member 3 and to the seventeenth through hole 445 of the second sealing member 4, is a conduction path so that the IC 5 is conducted to a third external electrode terminal 435. The eighth through hole 266, which is connected to the thirteenth through hole 345 of the first sealing member 3 and to the eighteenth through hole 446 of the second sealing member 4, is a conduction path so that the IC 5 is conducted to a fourth external electrode terminal 436. As shown in FIGS. 10, 13 and 14, the through electrodes 71 for conduction between the electrodes respectively formed on the first main surface 211 and the second main surface 212 are formed over respective inner wall surfaces of the fourth through hole 262, the fifth through hole 263, the sixth through hole 264, the seventh through hole 265 and the eighth through hole 266. Each center of the fourth through hole 262, the fifth through hole 263, the sixth through hole 264, the seventh through hole 265 and the eighth through hole 266 is the through part 72 that is a hollow passing through between the first main surface 211 and the second main surface 212. The fourth through hole 262, the fifth through hole 263, the sixth through hole 264, the seventh through hole 265 and the eighth through hole 266 are formed in the outward position of the internal space 13. The fourth through hole 262, the fifth through hole 263, the sixth through hole 264, the seventh through hole 265 and the eighth through hole 266 are not formed in the inward position of the internal space 13. Here, the inward position of the internal space 13 means strictly the inner side of the inner peripheral surface of the bonding material 11, not including the position on the bonding material 11.

Figure 11:
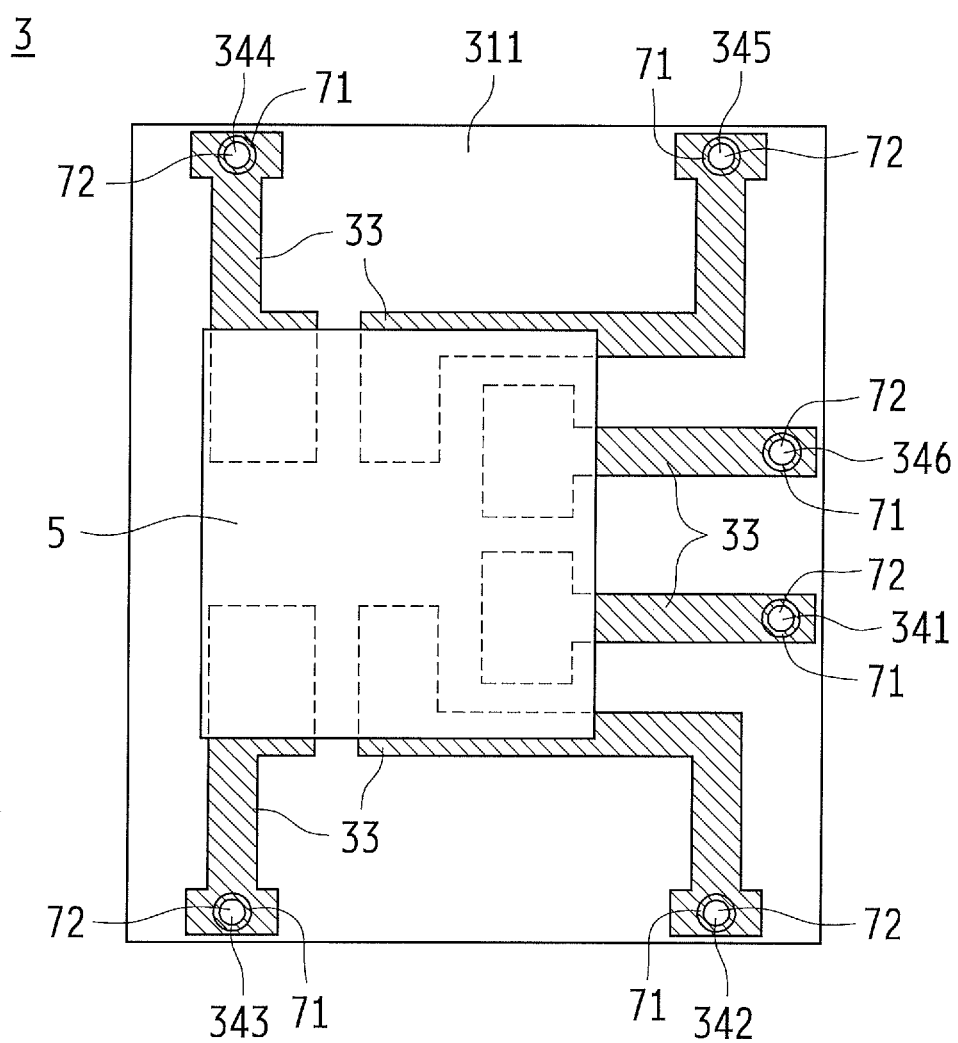
FIG. 11 is a schematic plan view illustrating a first sealing member of the crystal oscillator according to the embodiment of the present invention.
Figure 12:
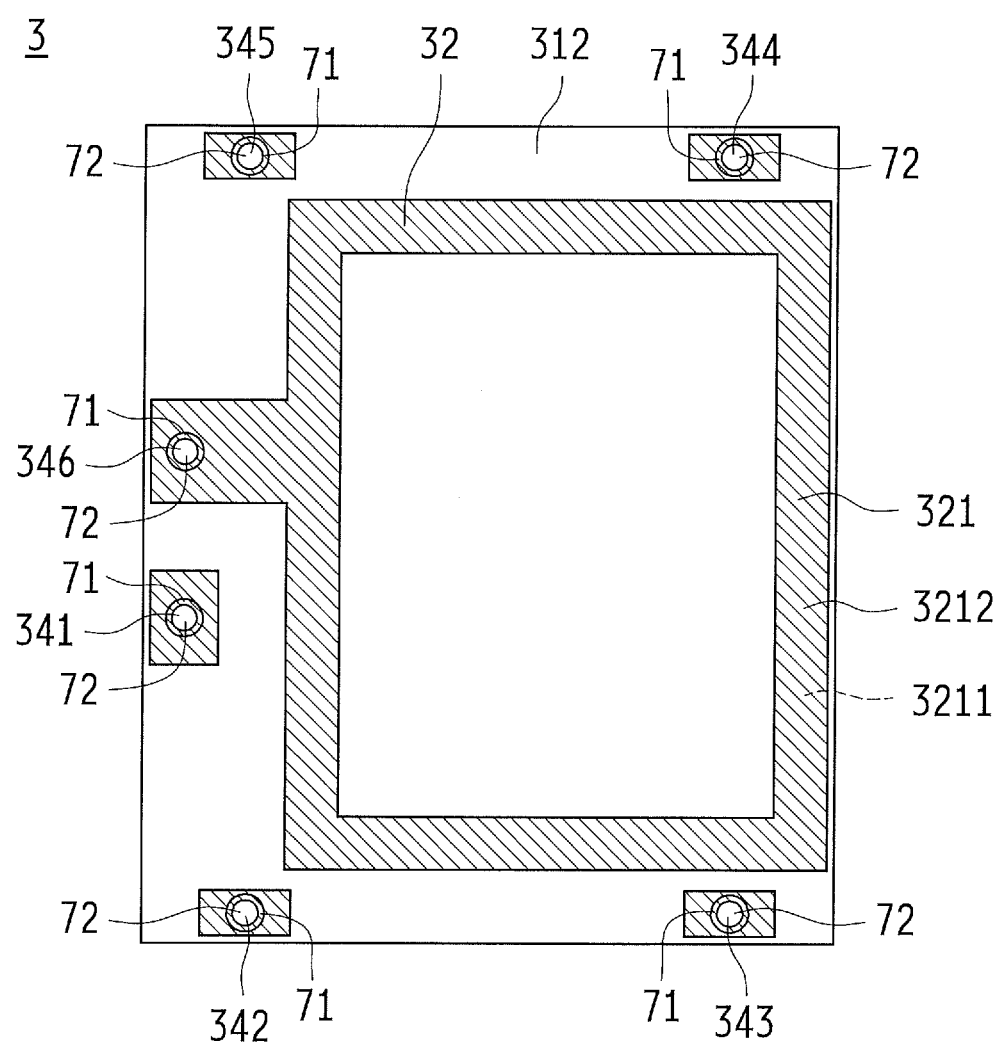
FIG. 12 is a schematic rear view illustrating the first sealing member of the crystal oscillator according to the embodiment of the present invention.

The first sealing member 3 is made of a material having the flexural rigidity (moment of inertia of area×Young's modulus) of not more than 1000 [N·mm$^2$]. Specifically, as shown in FIGS. 11 and 12, the first sealing member 3 is a substrate having a rectangular parallelepiped shape that is made of a single glass wafer. The second main surface 312 (the surface to be bonded to the crystal resonator plate 2) and a first main surface 311 (the surface on which the IC 5 is mounted) of the first sealing member 3 are formed as a smooth flat surface (mirror finished).

On the second main surface 312 of the first sealing member 3, the sealing-member-side first sealing part 32 is disposed so as to be bonded to the crystal resonator plate 2. As shown in FIG. 12, the sealing-member-side first sealing part 32 is located so as to be deflected to the left side in plan view of the second main surface 312 of the first sealing member 3.

On the sealing-member-side first sealing part 32 of the first sealing member 3, the sealing-member-side first bonding pattern 321 is formed so as to be bonded to the crystal resonator plate 2. The sealing-member-side first bonding pattern 321 has the same width at all positions on the sealing-member-side first sealing part 32 of the first sealing member 3.

The sealing-member-side first bonding pattern 321 is constituted by the base PVD film 3211 deposited on the first sealing member 3 by the physical vapor deposition, and the electrode PVD film 3212 deposited on the base PVD film 3211 by the physical vapor deposition. In this embodiment, the base PVD film 3211 is made of Ti (or Cr), and the electrode PVD film 3212 is made of Au. Also, the sealing-member-side first bonding pattern 321 does not contain Sn. Specifically, the sealing-member-side first bonding pattern 321 is made of a plurality of layers laminated on the sealing-member-side first sealing part 32 of the second main surface 312, that is, a Ti layer (or a Cr layer) and an Au layer are deposited by vapor deposition in this order from the lowermost layer side. Furthermore, in the sealing-member-side first bonding pattern 321, the electrode PVD film 3212 has a scaly surface in plan view.

As shown in FIGS. 10, 11 and 12, the first sealing member 3 includes six through holes (the ninth through hole 341, the tenth through hole 342, the eleventh through hole 343, the twelfth through hole 344, the thirteenth through hole 345 and the fourteenth through hole 346, i.e., the through holes of the second sealing member in the present invention) that pass through between the first main surface 311 and the second main surface 312. As shown in FIGS. 10, 11 and 12, the through electrodes 71 for conduction between the electrodes respectively formed on the first main surface 311 and the second main surface 312 are formed over respective inner wall surfaces of the the ninth through hole 341, the tenth through hole 342, the eleventh through hole 343, the twelfth through hole 344, the thirteenth through hole 345, and the fourteenth through hole 346. Specifically, the tenth through hole 342, the eleventh through hole 343, the twelfth through hole 344 and the thirteenth through hole 345 are the through holes for conduction of the oscillator. The ninth through hole 341 (the through hole for conduction of the second excitation electrode 222) and the fourteenth through hole 346 (the through hole for conduction of the first excitation electrode 221) are the through holes for conduction of the crystal resonator plate 2. Each center of the ninth through hole 341, the tenth through hole 342, the eleventh through hole 343, the twelfth through hole 344, the thirteenth through hole 345, and the fourteenth through hole 346 is the through part 72 that is a hollow passing through between the first main surface 311 and the second main surface 312.

On the first main surface 311 of the first sealing member 3, six electrode patterns 33 are formed, which include mounting pads for mounting the IC 5 as an oscillation circuit element. The six electrode patterns 33 are led, respectively, to the ninth through hole 341, the tenth through hole 342, the eleventh through hole 343, the twelfth through hole 344, the thirteenth through hole 345 and the fourteenth through hole 346.

Figure 15:
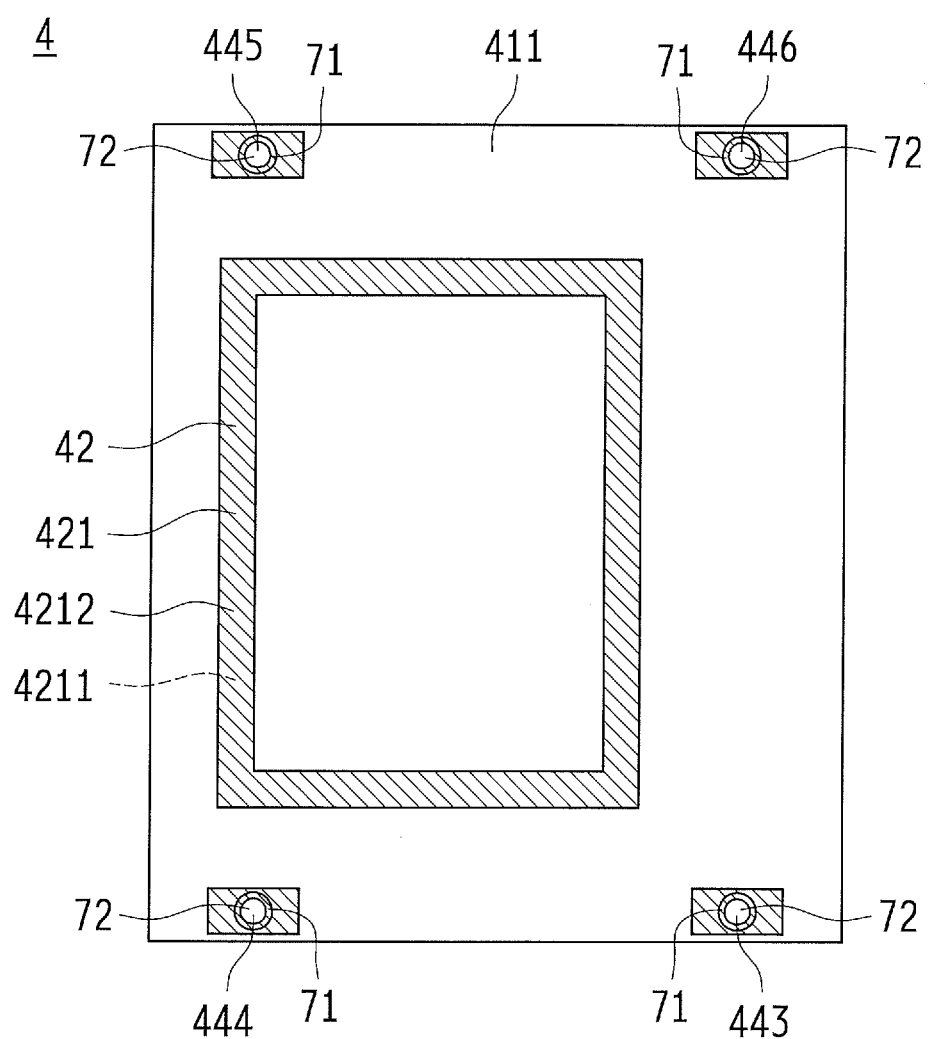
FIG. 15 is a schematic plan view illustrating a second sealing member of the crystal oscillator according to the embodiment of the present invention.
Figure 16:
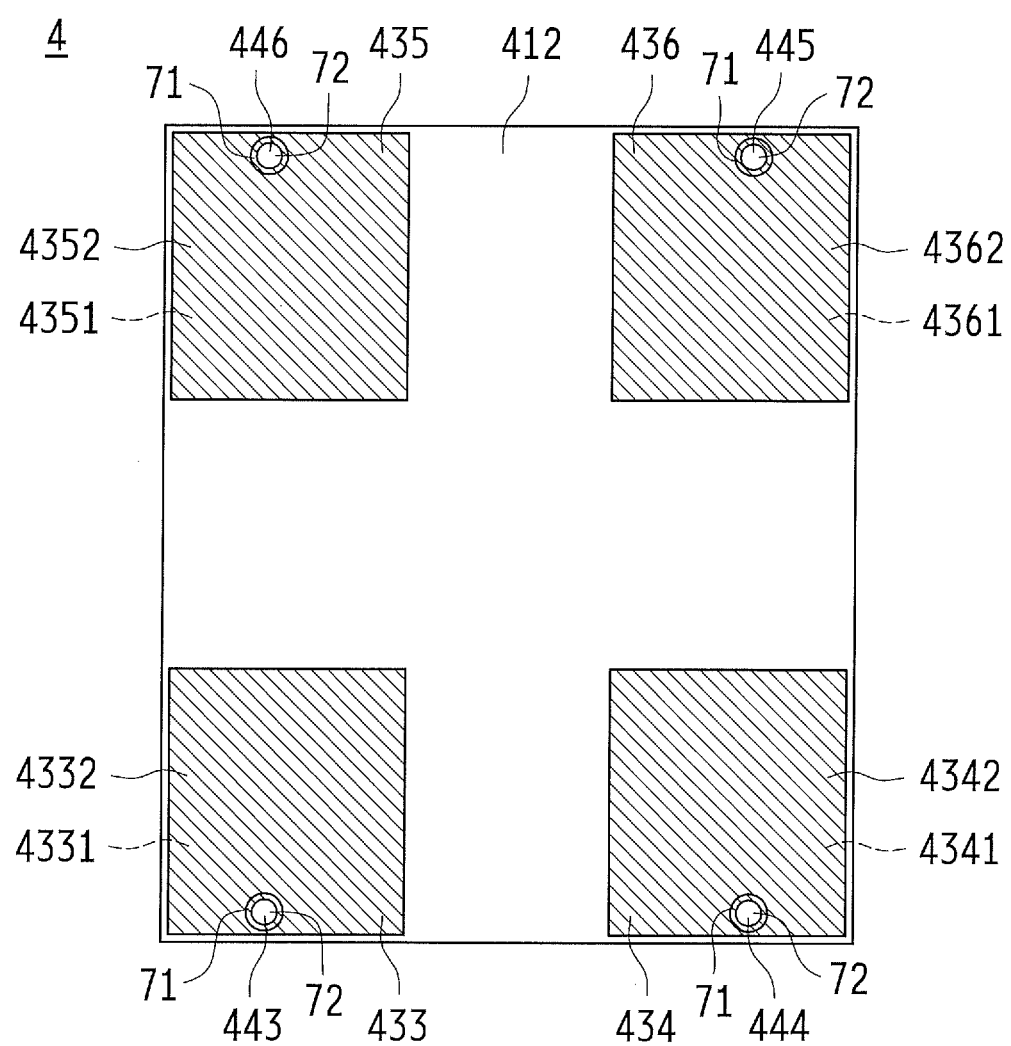
FIG. 16 is a schematic rear view illustrating the second sealing member of the crystal oscillator according to the embodiment of the present invention.

The second sealing member 4 is made of a material having the flexural rigidity (moment of inertia of area× Young's modulus) of not more than 1000 [N·mm$^2$]. Specifically, as shown in FIGS. 15 and 16, the second sealing member 4 is a substrate having a rectangular parallelepiped shape that is made of a single glass wafer. The first main surface 411 (the surface to be bonded to the crystal resonator plate 2) of the second sealing member 4 is formed as a smooth flat surface (mirror finished).

On the first main surface 411 of the second sealing member 4, the sealing-member-side second sealing part 42 is disposed so as to be bonded to the crystal resonator plate 2. As shown in FIG. 15, the sealing-member-side second sealing part 42 is located so as to be deflected to the left side in plan view of the first main surface 411 of the second sealing member 4.

Also, four external electrode terminals (the first external electrode terminal 433, the second external electrode terminal 434, the third external electrode terminal 435 and the fourth external electrode terminal 436), which are electrically connected to the outside, are formed on the second main surface 412 (the outer main surface not facing the crystal resonator plate 2) of the second sealing member 4. The first external electrode terminal 433, the second external electrode terminal 434, the third external electrode terminal 435 and the fourth external electrode terminal 436 are located respectively on the four corners. The external electrode terminals (the first external electrode terminal 433, the second external electrode terminal 434, the third external electrode terminal 435 and the fourth external electrode terminal 436) are constituted, respectively, by base PVD films 4331, 4341, 4351 and 4361 deposited on the second main surface 412 by the physical vapor deposition, and electrode PVD films 4332, 4342, 4352 and 4362 deposited on the base PVD films 4331, 4341, 4351 and 4361 by the physical vapor deposition. Compared with the base PVD films 2511, 2521, 3211 and 4211 of the above-described resonator-plate-side first bonding pattern 251, the resonator-plate-side second bonding pattern 252, the sealing-member-side first bonding pattern 321 and the sealing-member-side second bonding pattern 421, the base PVD films 4331, 4341, 4351 and 4361 of the external electrode terminals (the first external electrode terminal 433, the second external electrode terminal 434, the third external electrode terminal 435 and the fourth external electrode terminal 436) have a great thickness.

On the sealing-member-side second sealing part 42 of the second sealing member 4, the sealing-member-side second bonding pattern 421 is formed so as to be bonded to the crystal resonator plate 2. The sealing-member-side second bonding pattern 421 has the same width at all positions on the sealing-member-side second sealing part 42 of the second sealing member 4.

The sealing-member-side second bonding pattern 421 is constituted by the base PVD film 4211 deposited on the second sealing member 4 by the physical vapor deposition, and the electrode PVD film 4212 deposited on the base PVD film 4211 by the physical vapor deposition. In this embodiment, the base PVD film 4211 is made of Ti (or Cr), and the electrode PVD film 4212 is made of Au. Also, the sealing-member-side second bonding pattern 421 does not contain Sn. Specifically, the sealing-member-side second bonding pattern 421 is made of a plurality of layers laminated on the sealing-member-side second sealing part 42 of the first main surface 411, that is, a Ti layer (or a Cr layer) and an Au layer are deposited by the vapor deposition in this order from the lowermost layer side. Furthermore, in the sealing-member-side second bonding pattern 421, the electrode PVD film 4212 has a scaly surface in plan view.

As shown in FIGS. 10, 15 and 16, the second sealing member 4 includes four through holes (the fifteenth through hole 443, the sixteenth through hole 444, the seventeenth through hole 445 and the eighteenth through hole 446, i.e., through holes of the second sealing member in the present invention) that pass through between the first main surface 411 and the second main surface 412. As shown in FIGS. 10, 15 and 16, the through electrodes 71 for conduction between the electrodes respectively formed on the first main surface 411 and the second main surface 412 are formed over respective inner wall surfaces of the fifteenth through hole 443, the sixteenth through hole 444, the seventeenth through hole 445 and the eighteenth through hole 446. Each center of the fifteenth through hole 443, the sixteenth through hole 444, the seventeenth through hole 445 and the eighteenth through hole 446 is the through part 72 that is a hollow passing through between the first main surface 411 and the second main surface 412. The fifteenth through hole 443, the sixteenth through hole 444, the seventeenth through hole 445 and the eighteenth through hole 446 are disposed in the outward position of the internal space 13, not disposed in the inward position of the internal space 13.

In the crystal oscillator 102 having the above configuration, the crystal resonator plate 2 and the first sealing member 3 are subjected to the diffusion bonding in a state in which the resonator-plate-side first bonding pattern 251 and the sealing-member-side first bonding pattern 321 are overlapped with each other, and the crystal resonator plate 2 and the second sealing member 4 are subjected to the diffusion bonding in a state in which the resonator-plate-side second bonding pattern 252 and the sealing-member-side second bonding pattern 421 are overlapped with each other, thus, the package 12 having the sandwich structure as shown in FIG. 10 is produced. In contrast to the conventional art, no special bonding material is needed separately. When the resonator-plate-side second bonding pattern 252 of the crystal resonator plate 2 is overlapped with the sealing-member-side second bonding pattern 421 of the second sealing member 4, the through parts 72 of the through holes of the piezoelectric resonator plate (the fifth through hole 263, the sixth through hole 264, the seventh through hole 265 and the eighth through hole 266) are at least partially (or in this embodiment, completely) superimposed to the respective through parts 72 of the through holes of the second sealing member (the fifteenth through hole 443, the sixteenth through hole 444, the seventeenth through hole 445 and the eighteenth through hole 446). Also, when the resonator-plate-side first bonding pattern 251 of the crystal resonator plate 2 is overlapped with the sealing-member-side first bonding pattern 321 of the first sealing member 3, the through parts 72 of the through holes of the piezoelectric resonator plate (the fourth through hole 262, the fifth through hole 263, the sixth through hole 264, the seventh through hole 265 and the eighth through hole 266) are at least partially (or in this embodiment, completely) superimposed to the respective through parts 72 of the through holes of the first sealing member (the ninth through hole 341, the tenth though hole 342, the eleventh through hole 343, the twelfth through hole 344 and the thirteenth through hole 345).

The resonator-plate-side first bonding pattern 251 and the sealing-member-side first bonding pattern 321 themselves become the bonding material 11 formed upon the diffusion bonding. The resonator-plate-side second bonding pattern 252 and the sealing-member-side second bonding pattern 421 themselves become the bonding material 11 formed upon the diffusion bonding. In this embodiment, the diffusion bonding is performed at the room temperature (5 to 35° C.). However, the present invention is not limited thereto. The diffusion bonding may be performed at the temperature in the range from the room temperature to the temperature of less than 230° C. In particular, when the diffusion bonding is performed at the temperature in the range from 200° C. to less than 230° C., which is less than the melting point of 230° C. of the Pb-free solder and furthermore not less than the recrystallization temperature (200° C.) of Au, it is possible to stabilize an unstable region of the bonding part. Also, in this embodiment, since the special bonding material such as Au—Sn is not used, the gas such as plating gas, binder gas or metal gas is not generated. Thus, the temperature can be equal to or more than the recrystallization temperature of Au.

As described above, in the package 12 produced here, the sealing-member side first bonding pattern 321 is bonded to the resonator-plate-side first bonding pattern 251, and the sealing-member-side second bonding pattern 421 is bonded to the resonator-plate-side second bonding pattern 252, both by the diffusion bonding. Other than the above bonding, the sealing-member-side first bonding pattern 321 may be bonded to the resonator-plate-side first bonding pattern 251 by the pressurized diffusion bonding, and the sealing-member-side second bonding pattern 421 may be bonded to the resonator-plate-side second bonding pattern 252 by the pressurized diffusion bonding. In this case, it is possible to easily ensure the bonding part (to increase substantially the bonding area) due to pressurizing, accordingly, the bonding by only the diffusion bonding can be performed more suitably without the high-temperature heating.

Also, in the package 12 produced here, the first sealing member 3 and the crystal resonator plate 2 have a gap of not more than 1.00 μm. The second sealing member 4 and the crystal resonator plate 2 have a gap of not more than 1.00 μm. That is, the thickness of the bonding material 11 between the first sealing member 3 and the crystal resonator plate 2 is not more than 1.00 μm, and the thickness of the bonding material 11 between the second sealing member 4 and the crystal resonator plate 2 is not more than 1.00 μm (specifically, the thickness in the Au—Au bonding of this embodiment is 0.15 to 1.00 μm). As a comparative example, the conventional metal paste sealing material containing Sn has a thickness of 5 to 20 μm.

The thickness of the bonding pattern made by the diffusion bonding of the sealing-member-side first bonding pattern 321 and the resonator-plate-side first bonding pattern 251 is the same as the thickness of the bonding pattern made by the diffusion bonding of the sealing-member-side second bonding pattern 421 and the resonator-plate-side second bonding pattern 252, and is different from the thickness of the external electrode terminals (the first external electrode terminal 433, the second external electrode terminal 434, the third external electrode terminal 435 and the fourth external electrode terminal 436) that are electrically connected to the outside.

As shown in FIG. 10, in the package 12 produced here, the internal space 13 is located so as to be deflected to the left side in plan view. Also, the sealing-member-side first bonding pattern 321 formed on the first sealing member 3 and the sealing-member-side second bonding pattern 421 formed on the second sealing member 4 are not superimposed to each other in plan view. Specifically, the region in the sealing-member-side first bonding pattern 321 in plan view is larger than the region in the sealing-member-side second bonding pattern 421 in plan view. In this embodiment, although the region in the sealing-member-side first bonding pattern 321 in plan view is larger than the region in the sealing-member-side second bonding pattern 421 in plan view, the present invention is not limited thereto. The region in the sealing-member-side second bonding pattern 421 in plan view may be larger than the region in the sealing-member-side first bonding pattern 321 in plan view. Since the external electrode terminals (the first external electrode terminal 433, the second external electrode terminal 434, the third external electrode terminal 435 and the fourth external electrode terminal 436) are formed on the second sealing member 4, the region in the sealing-member-side first bonding pattern 321 in plan view is larger than the region in the sealing-member-side second bonding pattern 421 in plan view, accordingly, routing of the wiring pattern (ensuring the conduction path) becomes easy. Thus, the routing region of the wiring pattern (conduction-ensured region) can be increased.

An adjustment electrode for the crystal resonator plate 2 (the electrode pattern 33 that has the ninth through hole 341 as the conduction path in this embodiment), which has a polarity different from that of the first excitation electrode 221 of the crystal resonator plate 2, is formed on the first main surface 311 of the first sealing member 3. As shown in FIGS. 11 and 13, the electrode pattern 33 that has the ninth through hole 341 as the conduction path is not superimposed to the first excitation electrode 221. Also, an adjustment electrode for the crystal resonator plate 2 (the electrode pattern 33 that has the fourteenth through hole 346 as the conduction path in this embodiment), which has the same polarity as that of the first excitation electrode 221 of the crystal resonator plate 2, is formed on the first main surface 311 of the first sealing member 3. As shown in FIGS. 11 and 13, the electrode pattern 33 that has the ninth through hole 341 as the conduction path is partially superimposed to the first extraction electrode 223. In this embodiment, the electrode pattern 33 that has the ninth through hole 341 as the conduction path is partially superimposed to the first extraction electrode 223. However, it may be at least partially superimposed to the first excitation electrode 221.

In this embodiment, it is not necessary to ensure the space for mounting the IC 5 on the crystal resonator plate 2, thus, the height of the package can be reduced. Also, changing the pattern for the IC 5, the pattern provided on the first main surface of the first sealing member 3, is sufficient to be adapted to a desirable oscillation condition. Furthermore, a marking can be performed on the rear surface of the IC 5, thus the special marking is not needed even when the first sealing member 3 is made of a transparent material. In the conventional art, a recess is provided in the first sealing member 3, the crystal resonator plate 2 or the like, so that the IC 5 as the oscillation circuit element is mounted on the recess without exception. Thus, the outline of the piezoelectric resonator device is necessarily larger than that of the oscillation circuit element. However, in the first sealing member 3 according to this embodiment, the IC 5 is provided on the first main surface 311, and the second main surface 312 is bonded to the first main surface 211 of the crystal resonator plate 2. Thus, the size of the IC 5 and the size of the crystal oscillator 102 can be the same, which is advantageous for the reduction in size and in height.

Compared with the resonator-plate-side first bonding pattern 251 and the resonator-plate-side second bonding pattern 252 formed on the crystal resonator plate 2, the sealing-member-side first bonding pattern 321 formed on the first sealing member 3 and the sealing-member-side second bonding pattern 421 formed on the second sealing member 4 each have a large width.

Figure 17:
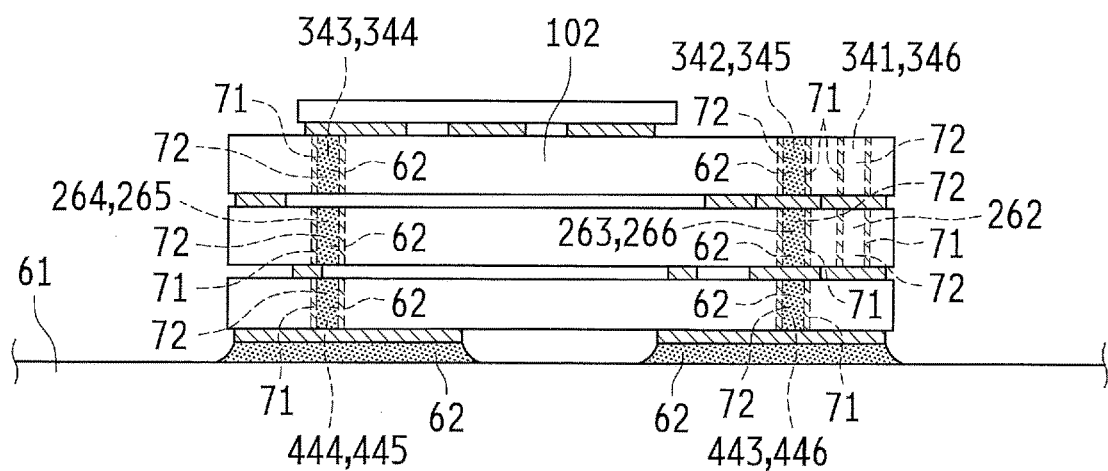
FIG. 17 is a diagram of the bonding structure of the crystal oscillator of FIG. 10 and a circuit board, illustrating adhering positions of the flowable conductive bonding material in the through holes.
Figure 18:
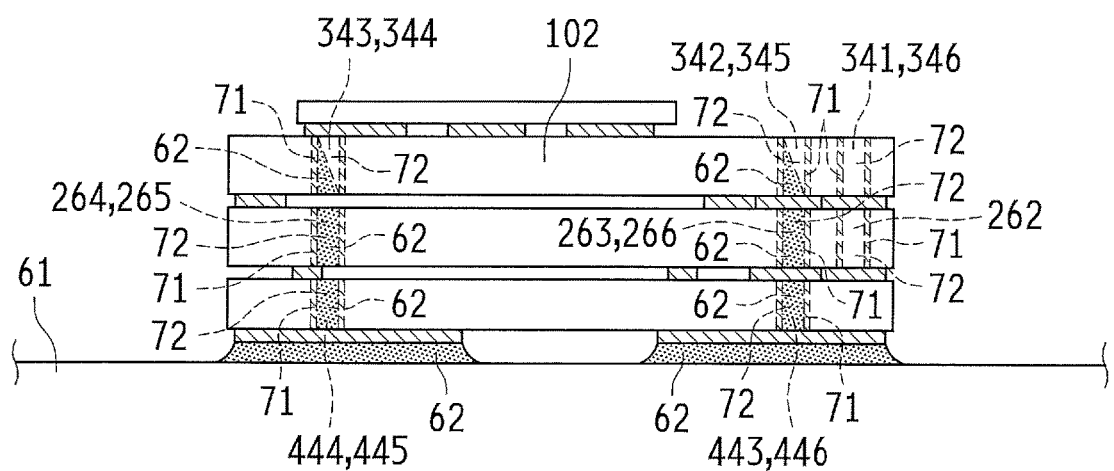
FIG. 18 is a diagram of the bonding structure of the crystal oscillator of FIG. 10 and a circuit board, illustrating the adhering positions of the flowable conductive bonding material in the through holes.

The crystal oscillator 102 produced as described above is electrically connected to the circuit board 61 using a flowable conductive bonding material (solder) 62. Here, in the bonding structure in which the external electrode terminals (the first external electrode terminal 433, the second external electrode terminal 434, the third external electrode terminal 435 and the fourth external electrode terminal 436) are electrically connected to the circuit board 61, the respective through parts 72 of through holes of the second sealing member (the fifteenth through hole 443, the sixteenth through hole 444, the seventeenth through hole 445 and the eighteenth through hole 446) are filled with the solder 62, and the respective through parts 72 of the through holes of the piezoelectric resonator (the fifth through hole 263, the sixth through hole 264, the seventh through hole 265 and the eighth through hole 266) are filled with the solder 62, thus the crystal oscillator 102 is bonded to the circuit board 61, as shown in FIGS. 17 and 18. In the bonding structure shown in FIG. 17, all the through parts 72 of the fifth through hole 263, the sixth through hole 264, the seventh through hole 265, the eighth through hole 266, the tenth through hole 342, the eleventh through hole 343, the twelfth through hole 344, the thirteenth through hole 345, the fifteenth through hole 443, the sixteenth through hole 444, the seventeenth through hole 445 and the eighteenth through hole 446 are completely filled with the solder 62. On the other hand, in the bonding structure shown in FIG. 18, the respective through parts 72 of the fifth through hole 263, the sixth through hole 264, the seventh through hole 265, the eighth through hole 266, the fifteenth through hole 443, the sixteenth through hole 444, the seventeenth through hole 445 and the eighteenth through hole 446 are completely filled with the solder 62 while the respective through parts 72 of the tenth through hole 342, the eleventh through hole 343, the twelfth through hole 344 and the thirteenth through hole 345 are partially filled with the solder 62.

As described above, with the crystal oscillator 102 according to this embodiment, it is possible to conduct between both main surfaces 411 and 412 of the second sealing member 4 using the fifteenth through hole 443, the sixteenth through hole 444, the seventeenth through hole 445 and the eighteenth through hole 446, while reducing the costs as in the case of the crystal resonator 101 having the sandwich structure. Also, the same functions and effects are obtained by the common configuration with the crystal resonator 101 having the sandwich structure.

Also, with the crystal oscillator 102 according to this embodiment, the respective through parts 72 of the through holes of the piezoelectric resonator plate (the fifth through hole 263, the sixth through hole 264, the seventh through hole 265 and the eighth through hole 266) are at least partially (or in this embodiment, completely) superimposed to: the respective through parts 72 of the through holes of the second sealing member (the fifteenth through hole 443, the sixteenth through hole 444, the seventeenth through hole 445 and the eighteenth through hole 446); and the respective through parts 72 of the through holes of the first sealing member (the tenth through hole 342, the eleventh through hole 343, the twelfth through hole 344 and the thirteenth through hole 345). Thus, it is possible to prevent misalignment in lamination of the first sealing member 3, the second sealing member 4 and the crystal resonator plate 2 by confirming their superimposed parts.

Since the respective through parts 72 of the through holes of the piezoelectric resonator plate (the fifth through hole 263, the sixth through hole 264, the seventh through hole 265 and the eighth through hole 266) are at least partially (or in this embodiment, completely) superimposed to: the respective through parts 72 of the through holes of the second sealing member (the fifteenth through hole 443, the sixteenth through hole 444, the seventeenth through hole 445 and the eighteenth through hole 446); and the respective through parts 72 of the through holes of the first sealing member (the tenth through hole 342, the eleventh through hole 343, the twelfth through hole 344 and the thirteenth through hole 345), even when air bubbles exist in the solder 62 used for electrically connecting the crystal oscillator 102 to the circuit board 61, it is possible to release the air bubbles (gas) of the solder 62 from the first main surface 311 of the first sealing member 3 to the outside via the above superimposed parts of the through holes of the second sealing member (the fifteenth through hole 443, the sixteenth through hole 444, the seventeenth through hole 445 and the eighteenth through hole 446), the through holes of the piezoelectric resonator plate (the fifth through hole 263, the sixth through hole 264, the seventh through hole 265 and the eighth through hole 266) and the through holes of the first sealing member (the tenth through hole 342, the eleventh through hole 343, the twelfth through hole 344 and the thirteenth through hole 345).

In the bonding structure of the crystal oscillator 102 and the circuit board 61 according to this embodiment, when the external electrode terminals (the first external electrode terminal 433, the second external electrode terminal 434, the third external electrode terminal 435 and the fourth external electrode terminal 436) are electrically bonded to the circuit board 61, the respective through parts 72 of the following are filled with the solder 62: the through holes of the piezoelectric resonator plate (the fifth through hole 263, the sixth through hole 264, the seventh through hole 265 and the eighth through hole 266); the through holes of the second sealing member (the fifteenth through hole 443, the sixteenth through hole 444, the seventeenth through hole 445 and the eighteenth through hole 446); and the through holes of the first sealing member (the tenth through hole 342, the eleventh through hole 343, the twelfth through hole 344 and the thirteenth through hole 345). Thus, it is possible to reduce the material for: the through electrodes of the through holes of the piezoelectric resonator plate (the fifth through hole 263, the sixth through hole 264, the seventh through hole 265 and the eighth through hole 266); the through electrodes 71 of the through holes of the second sealing member (the fifteenth through hole 443, the sixteenth through hole 444, the seventeenth through hole 445 and the eighteenth through hole 446); and the through electrodes 71 of the through holes of the first sealing member (the tenth through hole 342, the eleventh through hole 343, the twelfth through hole 344 and the thirteenth through hole 345), by the amount corresponding to the solder 62 filling the through parts 72 of the through holes of the piezoelectric resonator plate (the fifth through hole 263, the sixth through hole 264, the seventh through hole 265 and the eighth through hole 266), the through parts 72 of the through holes of the second sealing member (the fifteenth through hole 443, the sixteenth through hole 444, the seventeenth through hole 445 and the eighteenth through hole 446), and the through parts 72 of the through holes of the first sealing member (the tenth through hole 342, the eleventh through hole 343, the twelfth through hole 344 and the thirteenth through hole 345), in contrast to the conventional art such as disclosed in Patent Document 1. For this reason, there is no need to fill, with a metal electrode material: the through holes of the piezoelectric resonator plate (especially the fifth through hole 263, the sixth through hole 264, the seventh through hole 265 and the eighth through hole 266); the through holes of the second sealing member (the fifteenth through hole 443, the sixteenth through hole 444, the seventeenth through hole 445 and the eighteenth through hole 446); and the through holes of the first sealing member (especially, the tenth through hole 342, the eleventh through hole 343, the twelfth through hole 344 and the thirteenth through hole 345), in contrast to the conventional art.

Also, in the bonding structure of the crystal oscillator 102 and the circuit board 61 according to this embodiment, the solder 62 creeps up: the through parts 72 of the through holes of the second sealing member (the fifteenth through hole 443, the sixteenth through hole 444, the seventeenth through hole 445 and the eighteenth through hole 446); the through parts 72 of the through holes of the piezoelectric resonator plate (the fifth through hole 263, the sixth through hole 264, the seventh through hole 265 and the eighth through hole 266); and the through parts 72 of the through holes of the first sealing member (the tenth through hole 342, the eleventh through hole 343, the twelfth through hole 344 and the thirteenth through hole 345), along the through holes of the second sealing member (the fifteenth through hole 443, the sixteenth through hole 444, the seventeenth through hole 445 and the eighteenth through hole 446), the through holes of the piezoelectric resonator plate (the fifth through hole 263, the sixth through hole 264, the seventh through hole 265 and the eighth through hole 266), and the through holes of the first sealing member (the tenth through hole 342, the eleventh through hole 343, the twelfth through hole 344 and the thirteenth through hole 345), from the external electrode terminals (the first external electrode terminal 433, the second external electrode terminal 434, the third external electrode terminal 435 and the fourth external electrode terminal 436). Thus, the following are filled with the solder 62: the through parts 72 of the through holes of the second sealing member (the fifteenth through hole 443, the sixteenth through hole 444, the seventeenth through hole 445 and the eighteenth through hole 446); the through parts 72 of the through holes of the piezoelectric resonator plate (the fifth through hole 263, the sixth through hole 264, the seventh through hole 265 and the eighth through hole 266); and the through parts 72 of the through holes of the first sealing member (the tenth through hole 342, the eleventh through hole 343, the twelfth through hole 344 and the thirteenth through hole 345). For this reason, when the crystal oscillator 102 is bonded to the circuit board 61, bonding stress is applied to the external electrode terminals (the first external electrode terminal 433, the second external electrode terminal 434, the third external electrode terminal 435 and the fourth external electrode terminal 436). However, the bonding stress is dispersed by the amount corresponding to the solder 62 that creeps up: the through parts 72 of the through holes of the second sealing member (the fifteenth through hole 443, the sixteenth through hole 444, the seventeenth through hole 445 and the eighteenth through hole 446); the through parts 72 of the through holes of the piezoelectric resonator plate (the fifth through hole 263, the sixth through hole 264, the seventh through hole 265 and the eighth through hole 266); and the through parts 72 of the through holes of the first sealing member (the tenth through hole 342, the eleventh through hole 343, the twelfth through hole 344 and the thirteenth through hole 345), along the following: the through holes of the second sealing member (the fifteenth through hole 443, the sixteenth through hole 444, the seventeenth through hole 445 and the eighteenth through hole 446); the through holes of the piezoelectric resonator plate (the fifth through hole 263, the sixth through hole 264, the seventh through hole 265 and the eighth through hole 266); and the through holes of the first sealing member (the tenth through hole 342, the eleventh through hole 343, the twelfth through hole 344 and the thirteenth through hole 345). Therefore, when the crystal oscillator 102 is bonded to the circuit board 61, it is possible to substantially reduce the bonding stress that is applied to the external electrode terminals (the first external electrode terminal 433, the second external electrode terminal 434, the third external electrode terminal 435 and the fourth external electrode terminal 436).

When the external electrode terminals (the first external electrode terminal 433, the second external electrode terminal 434, the third external electrode terminal 435 and the fourth external electrode terminal 436) are electrically connected to the circuit board 61 using the solder 62, the solder 62 adheres to the external electrode terminals (the first external electrode terminal 433, the second external electrode terminal 434, the third external electrode terminal 435 and the fourth external electrode terminal 436), and further spreads over and adheres to: the through electrodes 71 of the through holes of the second sealing member (the fifteenth through hole 443, the sixteenth through hole 444, the seventeenth through hole 445 and the eighteenth through hole 446); the through parts 72 of the through holes of the piezoelectric resonator plate (the fifth through hole 263, the sixth through hole 264, the seventh through hole 265 and the eighth through hole 266); and the through parts 72 of the through holes of the first sealing member (the tenth through hole 342, the eleventh through hole 343, the twelfth through hole 344 and the thirteenth through hole 345). Thus, it is suitable for substantially increase the bonding region. Such functions and effects are suitable for the miniaturized crystal oscillator 102. Even when the package of the crystal oscillator 102 is reduced in size, the bonding region can be substantially maintained or even increased, which results in improvement in bonding strength.

As described above, in the aspect shown in FIG. 17, it is possible to provide the functions and effects by filling completely, with the solder 62, the following: the through parts 72 of the through holes of the piezoelectric resonator plate (the fifth through hole 263, the sixth through hole 264, the seventh through hole 265 and the eighth through hole 266); the through parts 72 of the through holes of the first sealing member (the tenth through hole 342, the eleventh through hole 343, the twelfth through hole 344 and the thirteenth through hole 345); and the through parts 72 of the through holes of the second sealing member (the fifteenth through hole 443, the sixteenth through hole 444, the seventeenth through hole 445 and the eighteenth through hole 446). In order to obtain the above functions and effects, this embodiment is optimal. However, it is also possible to provide, to a certain extent, the above functions and effects by filling only the through parts 72 of the through holes of the second sealing member (the fifteenth through hole 443, the sixteenth through hole 444, the seventeenth through hole 445 and the eighteenth through hole 446) by the solder 62.

It is also possible to provide, to a certain extent, the above functions and effects when the solder 62 does not adhere to the through parts 72 of the through holes of the first sealing member (the tenth through hole 342, the eleventh through hole 343, the twelfth through hole 344 and the thirteenth through hole 345), and furthermore the through parts 72 of the through holes of the piezoelectric resonator plate (the fifth through hole 263, the sixth through hole 264, the seventh through hole 265 and the eighth through hole 266) are partially filled with the solder 62 while the through parts 72 of the through holes of the second sealing member (the fifteenth through hole 443, the sixteenth through hole 444, the seventeenth through hole 445 and the eighteenth through hole 446) are completely filled with the solder 62.

Also, as shown in FIG. 18, it is possible to provide, to a certain extent, the above functions and effects when the through parts 72 of the through holes of the piezoelectric resonator plate (the fifth through hole 263, the sixth through hole 264, the seventh through hole 265 and the eighth through hole 266) are completely filled with the solder 62, and furthermore the through parts 72 of the through holes of the first sealing member (the tenth through hole 342, the eleventh through hole 343, the twelfth through hole 344 and the thirteenth through hole 345) are partially filled with the solder 62 while the through parts 72 of the through holes of the second sealing member (the fifteenth through hole 443, the sixteenth through hole 444, the seventeenth through hole 445 and the eighteenth through hole 446) are completely filled with the solder 62.

The present invention can be embodied in other forms without departing from the spirit, scope or essential characteristics thereof. The foregoing embodiments are therefore to be considered in all respects as illustrative and not restrictive. The scope of the present invention is indicated by the appended claims rather than by the foregoing description. Furthermore, all modifications and changes that come within the meaning and range of equivalency of the claims are intended to be embraced therein.

For example, in the crystal oscillator 102 according to this embodiment as described above, the four external electrode terminals (the first external electrode terminal 433, the second external electrode terminal 434, the third external electrode terminal 435 and the fourth external electrode terminal 436) are provided. However, the present invention is not limited thereto. The present invention can also be applied to the configuration including the desirable number of external electrode terminals such as six terminals or eight terminals.

(Variation of Crystal Resonator)

Hereinafter, a variation of the crystal resonator according to the above-described embodiment will be described. For the sake of convenience, the common configuration with the crystal resonator 101 shown in FIG. 1 will be described referring to the same reference numerals. Also, since functions and effects obtained by the common configuration are similar to those of the crystal resonator 101 shown in FIG. 1, such functions and effects are omitted from the following description. Hereinafter, difference of a crystal resonator 101A shown in FIG. 19 of this variation from the crystal resonator 101 will be mainly described.

Figure 19:
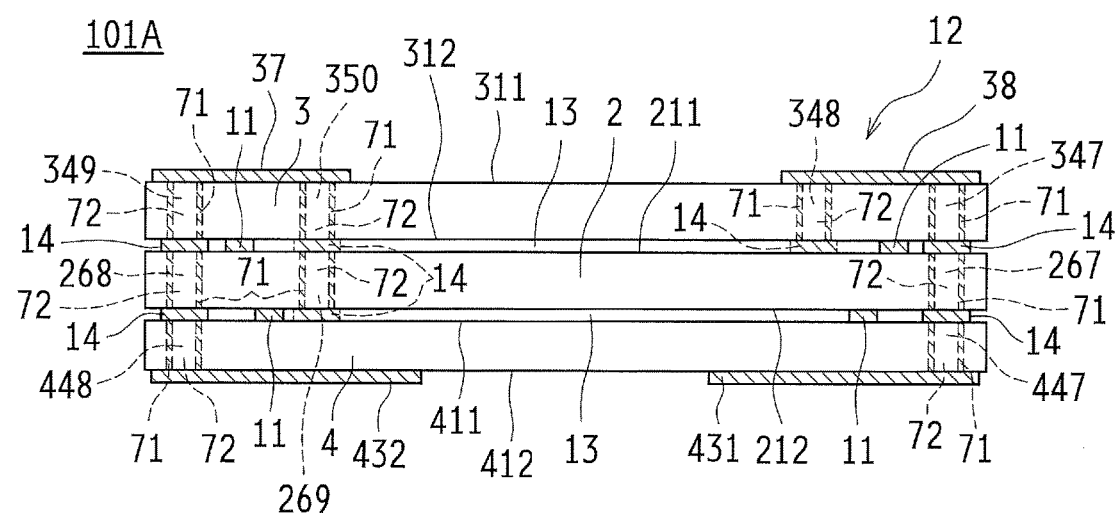
FIG. 19 is a schematic configuration diagram illustrating a configuration of the crystal resonator according to a variation of the present invention.

In the crystal resonator 101A of this variation, as shown in FIG. 19, the first excitation electrode 221 of the crystal resonator plate 2 is connected to the first external electrode terminal 431 of the second sealing member 4 via a first terminal 37 formed on the first main surface 311 of the first sealing member 3. The second excitation electrode 222 of the piezoelectric resonator plate 2 is connected to the second external electrode terminal 432 of the second sealing member 4 via a second terminal 38 formed on the first main surface 311 of the first sealing member 3. In this case, the superimposed parts of the respective through parts of the through holes of the piezoelectric resonator plates, the through holes of the second sealing member and the through holes of the first sealing member are provided between the first terminal 37 and the first external electrode terminal 431, and between the second terminal 38 and the second external electrode terminal 432. The configuration of the crystal resonator 101A of this variation is described in detail with reference to FIGS. 19 to 25.

Unlike the crystal resonator 101 shown in FIG. 1, in the crystal resonator 101A, the pair of first excitation electrode 221 and second excitation electrode 222 of the crystal resonator plate 2 is not electrically connected to the resonator-plate-side first bonding pattern 251 and the resonator-plate-side second bonding pattern 252. In the crystal resonator plate 2, the respective resonator-plate-side sealing parts 25 to be bonded to the first sealing member 3 and to the second sealing member 4 are provided on outward positions along the vibrating part 23 of both main surfaces 211 and 212, so that the vibrating part 23 is surrounded. On the resonator-plate-side sealing part 25 on the first main surface 211 of the crystal resonator plate 2, the resonator-plate-side first bonding pattern 251 is formed to be bonded to the first sealing member 3. Also, on the resonator-plate-side sealing part 25 on the second main surface 212 of the crystal resonator plate 2, the resonator-plate-side second bonding pattern 252 is formed to be bonded to the second sealing member 4.

Figure 22:
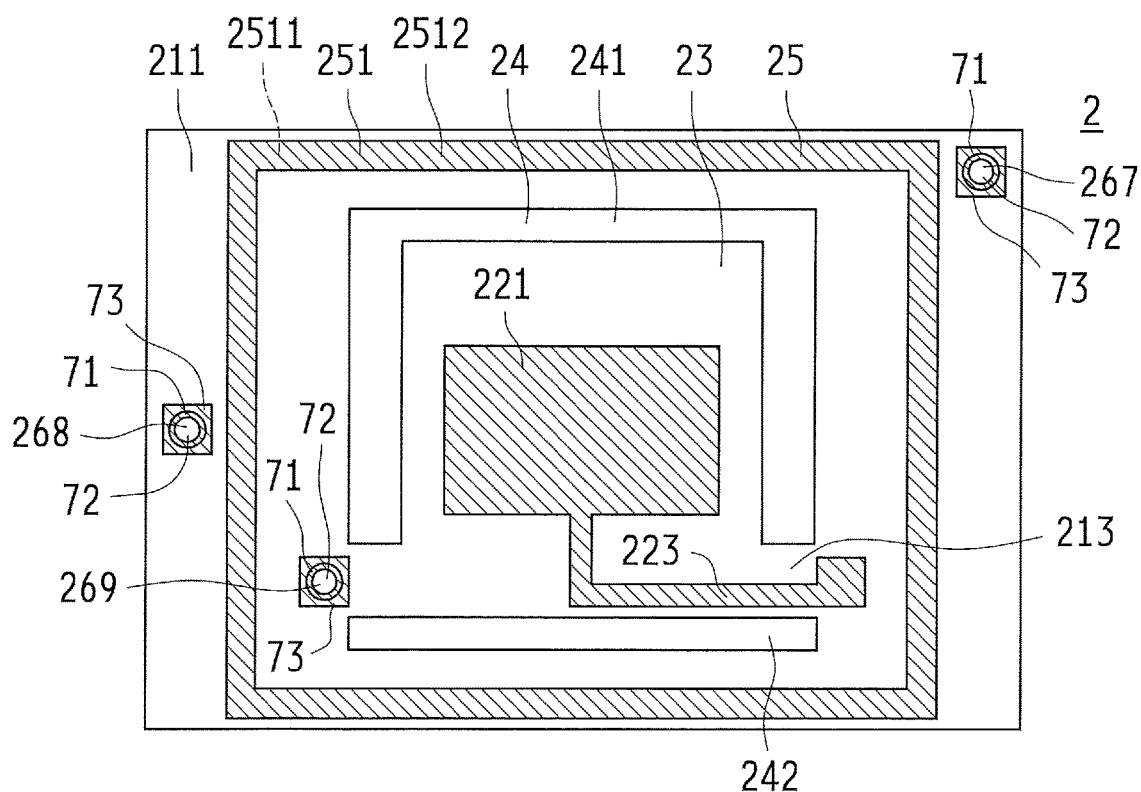
FIG. 22 is a schematic plan view illustrating a crystal resonator plate of the crystal resonator according to the variation of the present invention.
Figure 23:
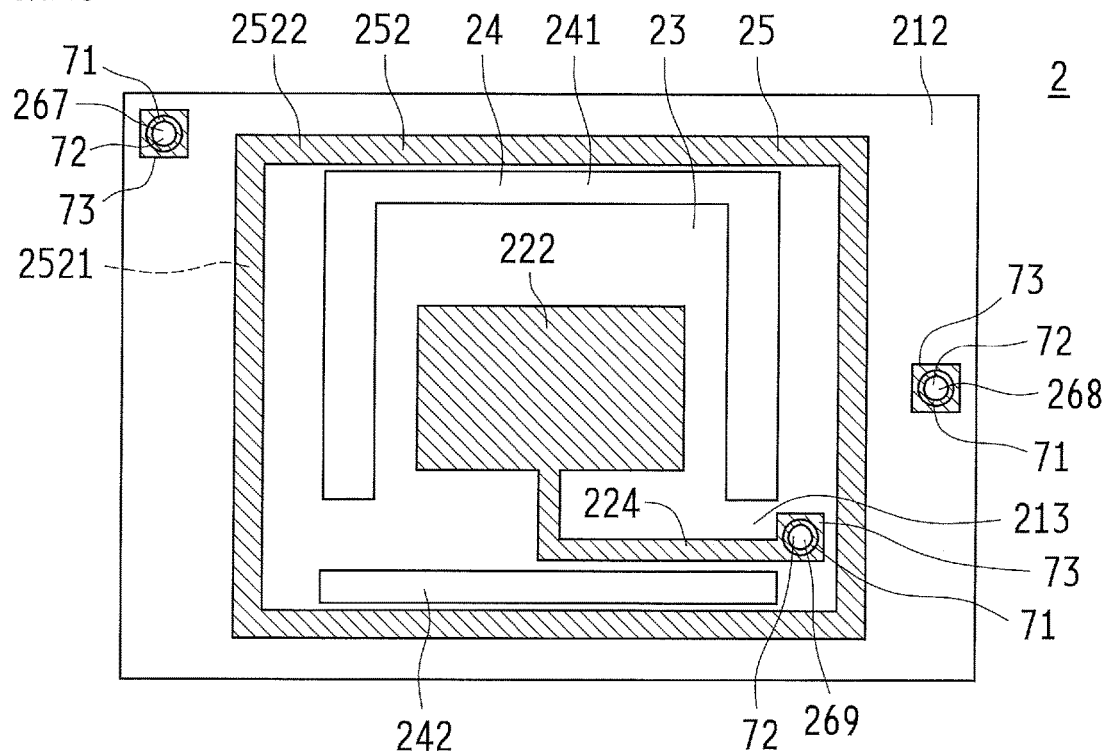
FIG. 23 is a schematic rear view illustrating the crystal resonator plate of the crystal resonator according to the variation of the present invention.

As shown in FIGS. 22 and 23, the crystal resonator plate 2 includes three through holes (a nineteenth through hole 267, a twentieth through hole 268 and a twenty-first through hole 269) that pass through between the first main surface 211 and the second main surface 212. The nineteenth through hole 267 (the through hole of the piezoelectric resonator plate in the present invention) is connected to a twenty-second through hole 347 of the first sealing member 3 and to a twenty-sixth through hole 447 of the second sealing member 4. The twentieth through hole 268 (the through hole of the piezoelectric resonator plate in the present invention) is connected to a twenty-fourth through hole 349 of the first sealing member 3 and to a twenty-seventh through hole 448 of the second sealing member 4. The twenty-first through hole 269 is connected to the second extraction electrode 224 extracted from the second excitation electrode 222 and to a twenty-fifth through hole 350 of the first sealing member 3. The nineteenth through hole 267 and the twentieth through hole 268 are respectively located on both ends in the longitudinal direction in plan view of the crystal resonator plate 2.

As shown in FIGS. 19, 22 and 23, the through electrodes 71 for conduction between the electrodes respectively formed on the first main surface 211 and the second main surface 212 are formed over respective inner wall surfaces of the nineteenth through hole 267, the twentieth through hole 268 and the twenty-first through hole 269. Each center of the nineteenth through hole 267, the twentieth through hole 268 and the twenty-first through hole 269 is the through part 72 that is a hollow passing through between the first main surface 211 and the second main surface 212. At each outer periphery of the nineteenth through hole 267, the twentieth through hole 268 and the twenty-first through hole 269, a corresponding connecting bonding pattern 73 is formed. Each connecting bonding pattern 73 has a configuration similar to the configuration of the resonator-plate-side first bonding pattern 251 and the resonator-plate-side second bonding pattern 252. The connecting bonding patterns 73 are each constituted by a base PVD film deposited on both main surfaces (the first main surface 211 and the second main surface 212) of the crystal resonator plate 2 by the physical vapor deposition, and an electrode PVD film deposited on the base PVD film by the physical vapor deposition. The connecting bonding pattern 73 of the twenty-first through hole 269 is integrally formed with the second extraction electrode 224 extracted from the second excitation electrode 222.

In the crystal resonator 101A, the nineteenth through hole 267 and the twentieth through hole 268 are formed in the outward position of the internal space 13 in plan view (i.e., in the outer side of the outer peripheral surface of the bonding material 11). The twenty-first through hole 269 is formed in the inward position of the internal space 13 in plan view (i.e., in the inner side of the inner peripheral surface of the bonding material 11). The nineteenth through hole 267, the twentieth through hole 268 and the twenty-first through hole 269 are not electrically connected to the resonator-plate-side first bonding pattern 251 and the resonator-plate-side second bonding pattern 252.

Figure 20:
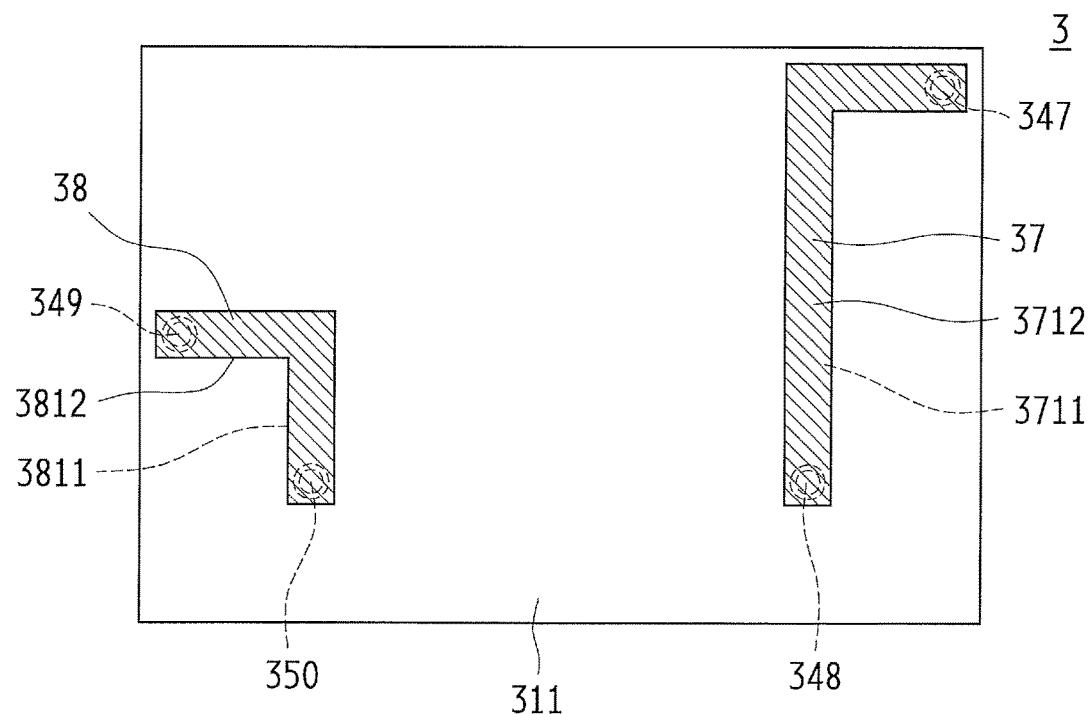
FIG. 20 is a schematic plan view illustrating a first sealing member of the crystal resonator according to the variation of the present invention.

Unlike the crystal resonator 101 shown in FIG. 1, in the crystal resonator 101A, the first terminal 37 and the second terminal 38 are formed on the first main surface 311 (the outer main surface not facing the crystal resonator plate 2) of the first sealing member 3 as shown in FIGS. 19 and 20. The first terminal 37 is provided so as to connect the twenty-second through hole 347 and a twenty-third through hole 348, while the second terminal 38 is provided so as to connect the twenty-fourth through hole 349 and the twenty-fifth through hole 350. The first terminal 37 and the second terminal 38 are constituted, respectively, by base PVD films 3711 and 3811 deposited on the first main surface 311 by the physical vapor deposition, and electrode PVD films 3712 and 3812 deposited on the respective base PVD films 3711 and 3811 by the physical vapor deposition. In this embodiment, the first terminal 37 and the second terminal 38 are respectively located on both ends in the longitudinal direction in plan view of the first main surface 311 of the first sealing member 3.

On the second main surface 312 of the first sealing member 3, the sealing-member-side first sealing part 32 is disposed so as to be bonded to the crystal resonator plate 2. On the sealing-member-side first sealing part 32, the sealing-member-side first bonding pattern 321 is formed so as to be bonded to the crystal resonator plate 2.

Figure 21:
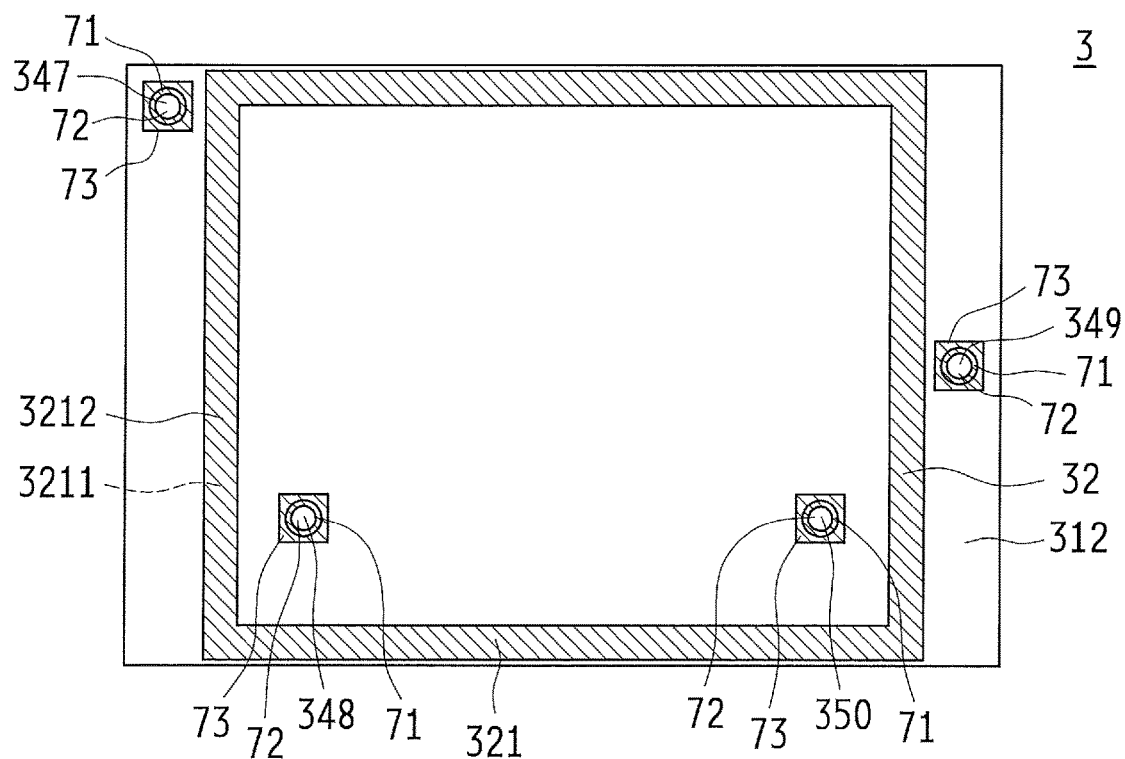
FIG. 21 is a schematic rear view illustrating the first sealing member of the crystal resonator according to the variation of the present invention.

As shown in FIGS. 19, 20 and 21, the first sealing member 3 includes four through holes (the twenty-second through hole 347, the twenty-third through hole 348, the twenty-fourth through hole 349 and the twenty-fifth through hole 350) that pass through between the first main surface 311 and the second main surface 312. The twenty-second through hole 347 (the through hole of the first sealing member in the present invention) is connected to the first terminal 37 and the nineteenth through hole 267 of the crystal resonator plate 2. The twenty-third through hole 348 is connected to the first terminal 37 and the first extraction electrode 223 extracted from the first excitation electrode 221 of the crystal resonator plate 2. The twenty-fourth through hole 349 (the through hole of the first sealing member in the present invention) is connected to the second terminal 38 and the twentieth through hole 268 of the crystal resonator plate 2. The twenty-fifth through hole 350 is connected to the second terminal 38 and the twenty-first through hole 269 of the crystal resonator plate 2. The twenty-second through hole 347 and the twenty-fourth through hole 349 are respectively located on both ends in the longitudinal direction in plan view of the first sealing member 3.

As shown in FIGS. 19, 20 and 21, the through electrodes 71 for conduction between the electrodes respectively formed on the first main surface 311 and the second main surface 312 are formed over respective inner wall surfaces of the twenty-second through hole 347, the twenty-third through hole 348, the twenty-fourth through hole 349 and the twenty-fifth through hole 350. Each center of the twenty-second through hole 347, the twenty-third through hole 348, the twenty-fourth through hole 349 and the twenty-fifth through hole 350 is the through part 72 that is a hollow passing through between the first main surface 311 and the second main surface 312. At each outer periphery of the twenty-second through hole 347, the twenty-third through hole 348, the twenty-fourth through hole 349 and the twenty-fifth through hole 350, a corresponding connecting bonding pattern 73 is formed. Each connecting bonding pattern 73 has a configuration similar to the configuration of the sealing-side first bonding pattern 321. The connecting bonding patterns 73 are each constituted by the base PVD film deposited on the second main surface 312 of the first sealing member 3 by the physical vapor deposition, and an electrode PVD film deposited on the base PVD film by the physical vapor deposition.

In the crystal resonator 101A, the twenty-second through hole 347 and the twenty-fourth through hole 349 are formed in the outward position of the internal space 13 in plan view. On the other hand, the twenty-third through hole 348 and the twenty-fifth through hole 350 are formed in the inward position of the internal space 13 in plan view. The twenty-second through hole 347, the twenty-third through hole 348, the twenty-fourth through hole 349 and the twenty-fifth through hole 350 are not electrically connected to the sealing-member-side first bonding pattern 321. Also, the first terminal 37 and the second terminal 38 are not electrically connected to the sealing-member-side first bonding pattern 321.

On the first main surface 411 of the second sealing member 4, the sealing-member-side second sealing part 42 is disposed so as to be bonded to the crystal resonator plate 2. On the sealing-member-side second sealing part 42, the sealing-member-side second bonding pattern 421 is formed so as to be bonded to the crystal resonator plate 2.

Figure 25:
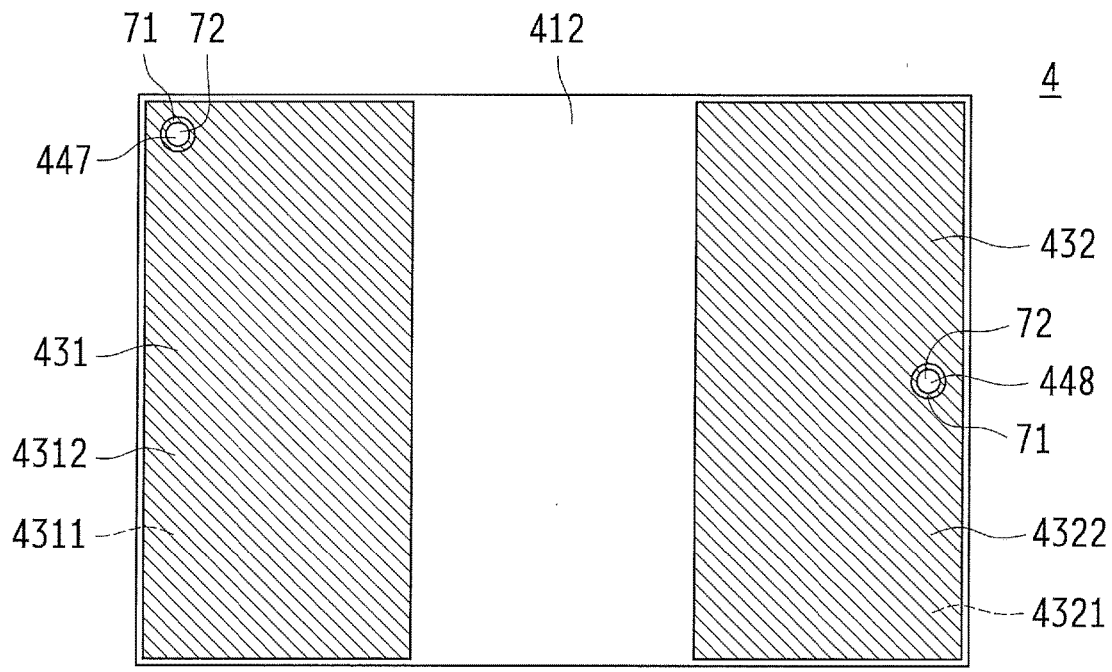
FIG. 25 is a schematic rear view illustrating the second sealing member of the crystal resonator according to the variation of the present invention.

A pair of external electrode terminals (the first external electrode terminal 431 and the second external electrode terminal 432), which is electrically connected to the outside, is formed on the second main surface 412 (the outer main surface not facing the crystal resonator plate 2) of the second sealing member 4. As shown in FIGS. 19 and 25, the first external electrode terminal 431 and the second external electrode terminal 432 are respectively located on both ends in the longitudinal direction in plan view of the second main surface 412 of the second sealing member 4. The pair of external electrode terminals (the first external electrode terminal 431 and the second external electrode terminal 432) is constituted, respectively, by the base PVD films 4311 and 4321 deposited on the second main surface 412 by the physical vapor deposition, and the electrode PVD films 4312 and 4322 deposited on the base PVD films 4311 and 4321 by the physical vapor deposition.

Figure 24:
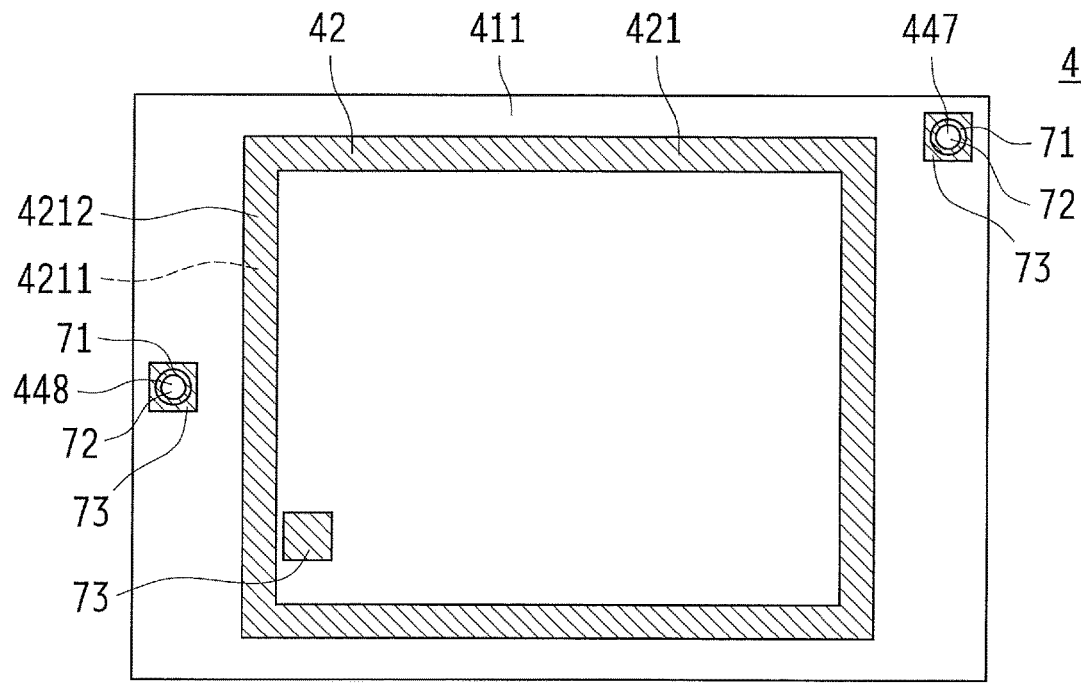
FIG. 24 is a schematic plan view illustrating a second sealing member of the crystal resonator according to the variation of the present invention.

As shown in FIGS. 19, 24 and 25, the second sealing member 4 includes two through holes (the twenty-sixth through hole 447 and the twenty-seventh through hole 448) that pass through between the first main surface 411 and the second main surface 412. The twenty-sixth through hole 447 (the through hole of the second sealing member in the present invention) is connected to the first external electrode terminal 431 and the nineteenth through hole 267 of the crystal resonator plate 2. The twenty-seventh through hole 448 (the through hole of the second sealing member in the present invention) is connected to the second external electrode terminal 432 and the twentieth through hole 268 of the crystal resonator plate 2. The twenty-sixth through hole 447 and the twenty-seventh through hole 448 are respectively located on both ends in the longitudinal direction in plan view of the second sealing member 4.

As shown in FIGS. 19, 24 and 25, the through electrodes 71 for conduction between the electrodes respectively formed on the first main surface 411 and the second main surface 412 are formed over respective inner wall surfaces of the twenty-sixth through hole 447 and the twenty-seventh through hole 448. Each center of the twenty-sixth through hole 447 and the twenty-seventh through hole 448 is the through part 72 that is a hollow passing through between the first main surface 411 and the second main surface 412. At each outer periphery of the twenty-sixth through hole 447 and the twenty-seventh through hole 448, a corresponding connecting bonding pattern 73 is formed. Also, on the first main surface 411, the connecting bonding pattern 73, which is to be bonded to the connecting bonding pattern 73 formed at the outer periphery of the twenty-first through hole 269 of the crystal resonator plate 2, is formed in the inward position of the sealing-member-side second bonding pattern 421. Each connecting bonding pattern 73 has a configuration similar to the configuration of the sealing-member-side second bonding pattern 421. The connecting bonding patterns 73 are each constituted by a base PVD film deposited on the first main surface 411 of the second sealing member 4 by the physical vapor deposition, and an electrode PVD film deposited on the base PVD film by the physical vapor deposition.

In the crystal resonator 101A, the twenty-sixth through hole 447 and the twenty-seventh through hole 448 are formed in the outward position of the internal space 13 in plan view. The twenty-sixth through hole 447 and the twenty-seventh through hole 448 are not electrically connected to the sealing-member-side second bonding pattern 421. Also, the first external electrode terminal 431 and the second external electrode terminal 432 are not electrically connected to the sealing-member-side second bonding pattern 421.

In the crystal resonator 101A having the above configuration, the crystal resonator plate 2 and the first sealing member 3 are subjected to the diffusion bonding in a state in which the resonator-plate-side first bonding pattern 251 and the sealing-member-side first bonding pattern 321 are overlapped with each other, and the crystal resonator plate 2 and the second sealing member 4 are subjected to the diffusion bonding in a state in which the resonator-plate-side second bonding pattern 252 and the sealing-member-side second bonding pattern 421 are overlapped with each other, thus, the package 12 having the sandwich structure as shown in FIG. 19 is produced. In contrast to the conventional art, no special bonding material is needed separately. Thus, the internal space 13 of the package 12 (i.e., the space for housing the vibrating part 23) is hermetically sealed. The resonator-plate-side first bonding pattern 251 and the sealing-member-side first bonding pattern 321 themselves become the bonding material 11 formed upon the diffusion bonding. The resonator-plate-side second bonding pattern 252 and the sealing-member-side second bonding pattern 421 themselves become the bonding material 11 formed upon the diffusion bonding.

In the above diffusion bonding, each of the connecting bonding patterns 73 is also overlapped with the corresponding connecting bonding pattern 73, the connecting bonding patterns 73 at the respective outer peripheries of the nineteenth through hole 267, the twentieth through hole 268, the twenty-first through hole 269, the twenty-second through hole 347, the twenty-third through hole 348, the twenty-fourth through hole 349, the twenty-fifth through hole 350, the twenty-sixth through hole 447 and the twenty-seventh through hole 448. Specifically, the respective connecting bonding patterns 73 of the nineteenth through hole 267 and the twenty-second through hole 347 are diffusion bonded to each other. The respective connecting bonding patterns 73 of the nineteenth through hole 267 and the twenty-sixth through hole 447 are diffusion bonded to each other. The respective connecting bonding patterns 73 of the twentieth through hole 268 and the twenty-fourth through hole 349 are diffusion bonded to each other. The respective connecting bonding patterns 73 of the twentieth through hole 268 and the twenty-seventh through hole 448 are diffusion bonded to each other. The respective connecting bonding patterns 73 of the twenty-first through hole 269 and the twenty-fifth through hole 350 are diffusion bonded to each other. The diffusion bonding is performed in the state in which the connecting bonding pattern 73 of the twenty-first through hole 269 is overlapped with the connecting bonding pattern 73 disposed on the first main surface 411 of the second sealing member 4. Then, the respective connecting bonding patterns 73 become the bonding material 14 formed upon the diffusion bonding. The connecting bonding pattern 73 of the twenty-third through hole 348 is overlapped with the first extraction electrode 223 extracted from the first excitation electrode 221 of the resonator plate 2 so as to be diffusion bonded. Then, the connecting bonding pattern 73 and the first extraction electrode 223 themselves become the bonding material 14 formed upon the diffusion bonding. The bonding materials 14 thus formed by the diffusion bonding serve to conduct the through electrodes 71 of the through holes and to hermetically seal the bonding part. In FIG. 19, the bonding materials 14 formed outward from the bonding materials 11 for sealing are indicated by the solid lines, while the bonding materials 14 formed inward from the bonding materials 11 are indicated by the broken lines.

In this embodiment, the first excitation electrode 221 is electrically connected to the first external electrode terminal 431 via the twenty-third through hole 348, the first terminal 37, the twenty-second through hole 347, the nineteenth through hole 267 and the twenty-sixth through hole 447. Also, the second excitation electrode 222 is electrically connected to the second external electrode terminal 432 via the twenty-first through hole 269, the twenty-fifth through hole 350, the second terminal 38, the twenty-fourth through hole 349, the twentieth through hole 268 and the twenty-seventh through hole 448. At this time, the first excitation electrode 221, the second excitation electrode 222, the first external electrode terminal 431 and the second external electrode terminal 432 are not electrically connected to the bonding materials 11 for hermetically sealing the vibrating part 23 (i.e., the resonator-plate-side first bonding pattern 251 and the sealing-member-side first bonding pattern 321, and the resonator-plate-side second bonding pattern 252 and the sealing-member-side second bonding pattern 421). That is, since the electrical connection path from the first excitation electrode 221 to the first external electrode terminal 431 passes through the first terminal 37 on the first main surface 311 of the first sealing member 3, such an electrical connection path is not electrically connected to the bonding materials 11. Likewise, since the electrical connection path from the second excitation electrode 222 to the second external electrode terminal 432 passes through the second terminal 38 on the first main surface 311 of the first sealing member 3, such an electrical connection path is not electrically connected to the bonding materials 11.

In the package 12, the first sealing member 3 and the crystal resonator plate 2 have a gap of not more than 1.00 μm. The second sealing member 4 and the crystal resonator plate 2 have a gap of not more than 1.00 μm. That is, the thickness of the bonding material 11 between the first sealing member 3 and the crystal resonator plate 2 is not more than 1.00 μm, and the thickness of the bonding material 11 between the second sealing member 4 and the crystal resonator plate 2 is not more than 1.00 μm (specifically, the thickness in the Au—Au bonding of this embodiment is 0.15 to 1.00 μm).

In the crystal resonator 101A, when the resonator-plate-side second bonding pattern 252 of the crystal resonator plate 2 is overlapped with the sealing-member-side second bonding pattern 421 of the second sealing member 4, the through parts 72 of the through holes of the piezoelectric resonator plate (the nineteenth through hole 267 and the twentieth through hole 268) are at least partially (or in this embodiment, completely) superimposed to the respective through parts 72 of the through holes of the second sealing member (the twenty-sixth through hole 447 and the twenty-seventh through hole 448). Also, when the resonator-plate-side first bonding pattern 251 of the crystal resonator plate 2 is overlapped with the sealing-member-side first bonding pattern 321 of the first sealing member 3, the through parts 72 of the through holes of the piezoelectric resonator plate (the nineteenth through hole 267 and the twentieth through hole 268) are at least partially (or in this embodiment, completely) superimposed to the respective through parts 72 of the through holes of the first sealing member (the twenty-second through hole 347 and the twenty-fourth through hole 349). Thus, the respective through parts 72 of the through holes of the piezoelectric resonator plate (the nineteenth through hole 267 and the twentieth through hole 268) are at least partially (or in this embodiment, completely) superimposed to the respective through parts 72 of the through holes of the first sealing member (the twenty-second through hole 347 and the twenty-fourth through hole 349), and to the respective through parts 72 of the through holes of the second sealing member (the twenty-sixth through hole 447 and the twenty-seventh through hole 448). The superimposed parts of the respective through holes of the second sealing member, the through holes of the piezoelectric resonator plate and the through holes of the first sealing member are formed in the outward position of the sealed region (the region inside the inner peripheral surface of the bonding materials 11) of the internal space 13 of the package 12. In this embodiment, the through part 72 of the twenty-first through hole 269 of the crystal resonator plate 2 and the through part 72 of the twenty-fifth through hole 350 of the first sealing member 3 are at least partially (or in this embodiment, completely) superimposed to each other. The through parts 72 of the twenty-first through hole 269 and the twenty-fifth through hole 350 are filled with a metal and the like. The respective positions of the twenty-first through hole 269 and the twenty-fifth through hole 350 may be shifted so that the through part 72 of the twenty-first through hole 269 is not superimposed to the through part 72 of the twenty-fifth through hole 350. Also, it is possible to use the configuration in which the through parts 72 of the twenty-first through hole 269 and the twenty-fifth through hole 350 are not filled with the metal and the like.

Figure 26:
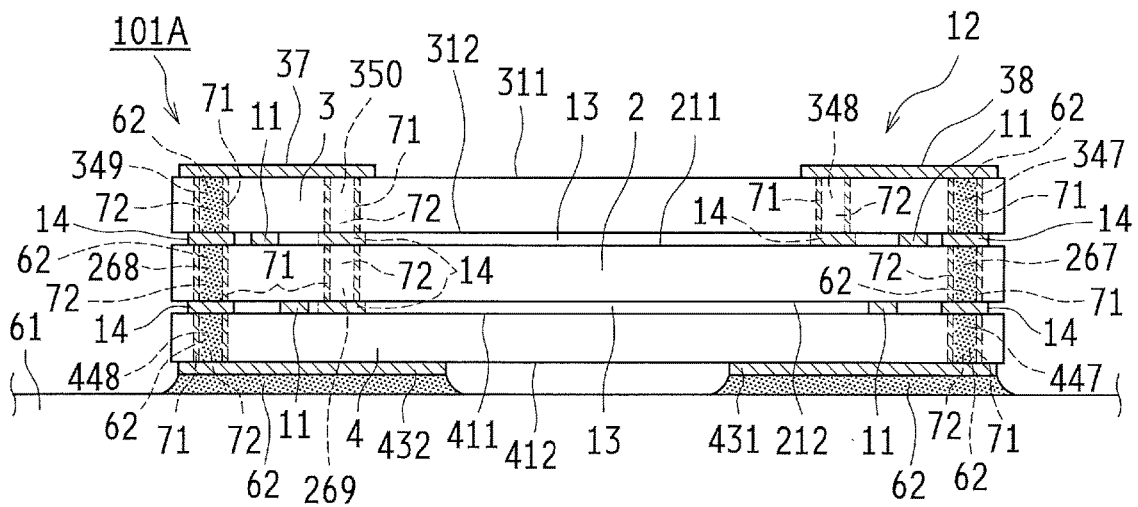
FIG. 26 is a diagram of the bonding structure of the crystal resonator of FIG. 19 and a circuit board, illustrating the adhering positions of the flowable conductive bonding material in the through holes.
Figure 27:
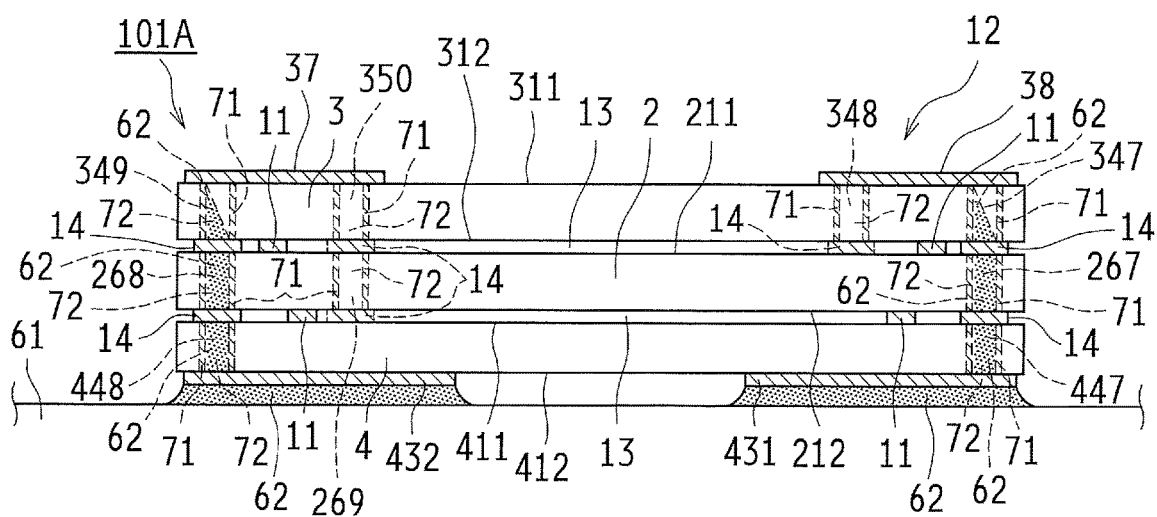
FIG. 27 is a diagram of the bonding structure of the crystal resonator of FIG. 19 and a circuit board, illustrating the adhering positions of the flowable conductive bonding material in the through holes.

The crystal resonator 101A produced as described above is electrically connected to the circuit board 61 using the flowable conductive bonding material (solder) 62. Here, in the bonding structure in which the external electrode terminals (the first external electrode terminal 431 and the second external electrode terminal 432) are electrically connected to the circuit board 61, the respective through parts 72 of the through holes of the second sealing member (the twenty-sixth through hole 447 and the twenty-seventh through hole 448) are filled with the solder 62, and also the through parts 72 of the through holes of the piezoelectric resonator plate (the nineteenth through hole 267 and the twentieth through hole 268) are filled with the solder 62, thus the crystal resonator 101A is bonded to the circuit board 61, as shown in FIGS. 26 and 27. In the bonding structure shown in FIG. 26, all the through parts 72 of the nineteenth through hole 267, the twentieth through hole 268, the twenty-second through hole 347, the twenty-fourth through hole 349, the twenty-sixth through hole 447 and the twenty-seventh through hole 448 are completely filled with the solder 62. On the other hand, in the bonding structure shown in FIG. 27, the respective through parts 72 of the nineteenth through hole 267, the twentieth through hole 268, the twenty-sixth through hole 447 and the twenty-seventh through hole 448 are completely filled with the solder 62 while the through parts 72 of the twenty-second through hole 347 and the twenty-fourth through hole 349 are partially filled with the solder 62.

In the crystal resonator 101A of this embodiment, the respective through parts 72 of the through holes of the piezoelectric resonator plate (the nineteenth through hole 267 and the twentieth through hole 268) are at least partially (or in this embodiment, completely) superimposed to the respective through parts 72 of the through holes of the first sealing member (the twenty-second through hole 347 and the twenty-fourth through hole 349), and to the respective through parts 72 of the through holes of the second sealing member (the twenty-sixth through hole 447 and the twenty-seventh through hole 448). Thus, it is possible to prevent misalignment in lamination of the first sealing member 3, the second sealing member 4 and the crystal resonator plate 2 by confirming their superimposed parts.

Since the respective through parts 72 of the through holes of the piezoelectric resonator plate (the nineteenth through hole 267 and the twentieth through hole 268) are at least partially (or in this embodiment, completely) superimposed to the respective through parts 72 of the through holes of the first sealing member (the twenty-second through hole 347 and the twenty-fourth through hole 349), and to the respective through parts 72 of the through holes of the second sealing member (the twenty-sixth through hole 447 and the twenty-seventh through hole 448), even when air bubbles exist in the solder 62 used for electrically connecting the crystal resonator 101A to the circuit board 61, it is possible to release the air bubbles of the solder 62 from the first main surface 311 of the first sealing member 3 to the outside via the above superimposed parts of the through holes of the second sealing member, the through holes of the piezoelectric resonator plate and the through holes of the first sealing member.

In addition, when the external electrode terminals (the first external electrode terminal 431 and the second external electrode terminal 432) are electrically connected to the circuit board 61 using the solder 62, the solder 62 creeps up the through parts 72 of the through holes of the second sealing member along the through holes of the second sealing member (the twenty-sixth through hole 447 and the twenty-seventh through hole 448) from the external electrode terminals. When using a large amount of solder 62, the through parts 72 of the through holes of the second sealing member are filled with the solder 62 (see FIG. 26). In this case, the hermeticity of the internal space 13 in which the vibrating part 23 of the crystal resonator plate 2 is hermetically sealed may be decreased due to corrosion of the solder 62 that creeps up the through parts 72. However, with this embodiment, it is possible to ensure a long distance as the length of the path from the first excitation electrode 221 of the crystal resonator plate 2 to the first external electrode terminal 431 and as the length of the path from the second excitation electrode 222 of the crystal resonator plate 2 to the second external electrode terminal 432, which allows to prevent the internal space 13 from being affected by corrosion of the solder 62 that decreases the hermeticity. Also, the superimposed parts of the through holes of the second sealing member, the through holes of the piezoelectric resonator plate and the through holes of the first sealing member are disposed in the outside (where the hermeticity is of no concern) of the sealed region of the internal space 13 in which the vibrating part 23 of the crystal resonator plate 2 is hermetically sealed. Thus, it is possible to further prevent the hermeticity of the internal space 13 from being decreased by the corrosion of the solder 62.

When the crystal resonator 101A is bonded to the circuit board 61 using the solder 62, the solder 62 creeps up the through parts 72 of the through holes (the through holes of the second sealing member, the through holes of the piezoelectric resonator plate and the through holes of the first sealing member) along the through holes of the second sealing member from the external electrode terminals (the first external electrode terminal 431 and the second external electrode terminal 432) so that the through parts 72 of the through holes are filled with the solder 62. Thus, the bonding stress, which is generated when bonding the crystal resonator 101A to the circuit board 61, is dispersed by the amount corresponding to the solder 62 that creeps up the through parts 72 of the through holes. As a result, it is possible to reduce the bonding stress that is applied to the external electrode terminals when bonding.

Also, since the through holes (the through holes of the piezoelectric resonator plate, the through holes of the first sealing member, and the through holes of the second sealing member) are disposed in the positions apart from the vibrating part 23 disposed in the sealed region of the internal space 13, even when the through parts 72 of the through holes are filled with the solder 62 having a different coefficient of thermal expansion from that of the crystal resonator plate 2 or the like at the time of bonding the crystal resonator 101A to the circuit board 61, it is possible to prevent the generated bonding stress from affecting the vibrating part 23 of the crystal resonator plate 2.

Specifically, when the through parts 72 of the through holes are filled with the solder 62 at the time of bonding the crystal resonator 101A to the circuit board 61, the vibrating part 23 of the crystal resonator plate 2 may be affected by the stress caused by the difference in the coefficient of thermal expansion between the solder 62 and the crystal resonator plate 2 or the like. However, with this embodiment, even when the through parts 72 of the through holes are filled with the solder 62, the vibrating part 23 of the crystal resonator plate 2 and the through holes are disposed apart from each other. Thus, it is possible to prevent the stress caused by the difference in the coefficient of thermal expansion from affecting the vibrating part 23 of the crystal resonator plate 2. Also, since the sealing part (the part bonded by the bonding material 11) of the sealed region is interposed between the vibrating part 23 of the crystal resonator plate 2 and the through holes, the stress caused by the difference in the coefficient of thermal expansion is not directly transmitted to the vibrating part 23 of the crystal resonator plate 2 from the solder 62 filling the through holes. Thus, the sealing part (the part bonded by the bonding material 11) of the sealed region prevents the stress caused by the difference in the coefficient of thermal expansion from being transmitted, which results in reduction of the stress that is transmitted to the vibrating part 23 of the crystal resonator plate 2.

Also, since the first terminal 37 and the second terminal 38 are disposed on the first main surface 311 (i.e., the external surface not facing the crystal resonator plate 2) of the first sealing member 3, it is possible to easily test the crystal resonator plate 2 using the first terminal 37 and the second terminal 38 as test terminals for the crystal resonator plate 2. Specifically, it is possible to easily test the crystal resonator plate 2 not only before the crystal resonator 101A is mounted on the circuit board 61 but also after the crystal resonator 101A is mounted on the circuit board 61. Not being limited thereto, it is possible to easily test the crystal resonator plate 2 even in the state in which the crystal resonator plate 2 and the first sealing member 3 are bonded to each other (in the state in which the second sealing member 4 is not bonded). Furthermore, the size and the shape of the first terminal 37 and the second terminal 38 can be easily changed. Thus, the capacity of the crystal resonator plate 2 viewed from the external electrode terminals (the first external electrode terminal 431 and the second external electrode terminal 432) can be finely adjusted as required.

This application claims priority based on Patent Application No. 2014-000486 filed in Japan on Jan. 6, 2014. The entire contents thereof are hereby incorporated in this application by reference.

INDUSTRIAL APPLICABILITY

The present invention is suitable for a crystal resonator device (such as a crystal resonator and a crystal oscillator) using a crystal for the material of a substrate of a piezoelectric resonator plate.

DESCRIPTION OF REFERENCE NUMERALS 101, 101A Crystal resonator
102 Crystal oscillator 11 Bonding material
12 Package
13 Internal space
14 Bonding material
2 Crystal resonator plate
211 First main surface
212 Second main surface
213 Conduction path
221 First excitation electrode
222 Second excitation electrode
223 First extraction electrode
224 Second extraction electrode
23 Vibrating part
24 Cut-out part
241 Squared U-shaped part in plan view
242 Oblong rectangular shaped part in plan view
25 Resonator-plate-side sealing part
251 Resonator-plate-side first bonding pattern
2511 Base PVD film
2512 Electrode PVD film
252 Resonator-plate-side second bonding pattern
2521 Base PVD film
2522 Electrode PVD film
261 First through hole
262 Fourth through hole
263 Fifth through hole
264 Sixth through hole
265 Seventh through hole
266 Eighth through hole
267 Nineteenth through hole
268 Twentieth through hole
269 Twenty-first through hole
3 First sealing member
311 First main surface
312 Second main surface
32 Sealing-member-side first sealing part
321 Sealing-member-side first bonding pattern
3211 Base PVD film
3212 Electrode PVD film
33 Electrode pattern
341 Ninth through hole
342 Tenth through hole
343 Eleventh through hole
344 Twelfth through hole
345 Thirteenth through hole
346 Fourteenth through hole
347 Twenty-second through hole
348 Twenty-third through hole
349 Twenty-fourth through hole
350 Twenty-fifth through hole
37 First terminal
3711 Base PVD film
3712 Electrode PVD film
38 Second terminal
3811 Base PVD film
3812 Electrode PVD film
4 Second sealing member
411 First main surface
412 Second main surface
42 Sealing-member-side second sealing part
421 Sealing-member-side second bonding pattern
4211 Base PVD film
4212 Electrode PVD film
431 First external electrode terminal
4311 Base PVD film
4312 Electrode PVD film
432 Second external electrode terminal
4321 Base PVD film
4322 Electrode PVD film
433 First external electrode terminal
4331 Base PVD film
4332 Electrode PVD film
434 Second external electrode terminal
4341 Base PVD film
4342 Electrode PVD film
435 Third external electrode terminal
4351 Base PVD film
4352 Electrode PVD film
436 Fourth external electrode terminal
4361 Base PVD film
4362 Electrode PVD film
441 Second through hole
442 Third through hole
443 Fifteenth through hole
444 Sixteenth through hole
445 Seventeenth through hole
446 Eighteenth through hole
447 Twenty-sixth through hole
448 Twenty-seventh through hole
5 IC
61 Circuit board
62 Solder
71 Through electrode
72 Through part
73 Connecting bonding pattern

The invention claimed is:

1. A piezoelectric resonator device, comprising:
a piezoelectric resonator plate including a first excitation electrode formed on a first main surface of a substrate, and a second excitation electrode formed on a second main surface of the substrate, the second excitation electrode making a pair with the first excitation electrode;
a flat planar first sealing member covering the first excitation electrode of the piezoelectric resonator plate;
a flat planar second sealing member covering the second excitation electrode of the piezoelectric resonator plate, the second sealing member including external electrode terminals to be electrically connected to an external circuit board using a flowable conductive bonding material; and
an internal space formed by Au to Au bonding the first sealing member to the piezoelectric resonator plate and by Au to Au bonding the second sealing member to the piezoelectric resonator plate, the internal space hermetically sealing a vibrating part including the first excitation electrode and the second excitation electrode of the piezoelectric resonator plate,
wherein through holes of the second sealing member are formed so as to pass through between a first main surface and a second main surface of the second sealing member, and the external electrode terminals are formed on the second main surface of the second sealing member, and
wherein the through holes of the second sealing member include: respective through electrodes for conduction between electrodes formed on the first main surface and the second main surface of the second sealing member; and
respective through parts,
wherein through holes of the piezoelectric resonator plate are formed so as to pass through between the first main surface and the second main surface of the piezoelectric resonator plate, wherein the through holes of the piezoelectric resonator plate include: respective through electrodes for conduction between electrodes formed on the first main surface and the second main surface of the piezoelectric resonator plate; and respective through parts, and wherein the respective through parts of the through holes of the piezoelectric resonator plate are at least partially superimposed to the respective through parts of the through holes of the second sealing member.

2. The piezoelectric resonator device according to claim 1, wherein through holes of the first sealing member are formed so as to pass through between a first main surface and a second main surface of the first sealing member, wherein the through holes of the first sealing member include: respective through electrodes for conduction between electrodes formed on the first main surface and the second main surface of the first sealing member; and respective through parts, and wherein the respective through parts of the through holes of the piezoelectric resonator plate are at least partially superimposed to: the respective through parts of the through holes of the second sealing member; and the respective through parts of the through holes of the first sealing member.

3. The piezoelectric resonator device according to claim 2, wherein the first excitation electrode of the piezoelectric resonator plate is connected to a first external electrode terminal out of the external electrode terminals of the second sealing member via a first terminal formed on the first main surface of the first sealing member, and wherein the second excitation electrode of the piezoelectric resonator plate is connected to a second external electrode terminal out of the external electrode terminals of the second sealing member via a second terminal formed on the first main surface of the first sealing member.

4. The piezoelectric resonator device according to claim 3, wherein superimposed parts of the respective through parts of the through holes of the piezoelectric resonator plate, the through holes of the second sealing member and the through holes of the first sealing member are disposed between the first terminal and the first external electrode terminal, and between the second terminal and the second external electrode terminal.

5. The piezoelectric resonator device according to claim 4, wherein the respective superimposed parts are disposed in an outside of a sealed region of the internal space.

6. The piezoelectric resonator device according to claim 1, wherein a resonator-plate-side first bonding pattern, which is to be bonded and sealed to the first sealing member, is formed on the first main surface of the piezoelectric resonator plate, wherein a resonator-plate-side second bonding pattern, which is to be bonded and sealed to the second sealing member, is formed on the second main surface of the piezoelectric resonator plate, wherein a sealing-member-side first bonding pattern, which is to be bonded to the piezoelectric resonator plate, is formed on the first sealing member, wherein a sealing-member-side second bonding pattern, which is to be bonded to the piezoelectric resonator plate, is formed on the second sealing member, wherein the sealing-member-side first bonding pattern is bonded to the resonator-plate-side first bonding pattern by Au to Au bonding, and the sealing-member-side second bonding pattern is bonded to the resonator-plate-side second bonding pattern by Au to Au bonding, and wherein the first sealing member and the piezoelectric resonator plate have a gap of not more than 1.00 micron, and the second sealing member and the piezoelectric resonator plate have a gap of not more than 1.00 micron.

7. A bonding structure of a piezoelectric resonator device and a circuit board, wherein the piezoelectric resonator device according to claim 1 is electrically connected to a circuit board using a flowable conductive bonding material, and wherein, when the external electrode terminals are electrically connected to the circuit board, the through parts of the through holes of the second sealing member are filled with the flowable conductive bonding material.

8. A bonding structure of a piezoelectric resonator device and a circuit board, wherein the piezoelectric resonator device according to claim 1 is electrically connected to a circuit board using a flowable conductive bonding material, and wherein, when the external electrode terminals are electrically connected to the circuit board, the through parts of the through holes of the piezoelectric resonator plate and the through parts of the through holes of the second sealing member are filled with the flowable conductive bonding material.

9. A bonding structure of a piezoelectric resonator device and a circuit board, wherein the piezoelectric resonator device according to claim 3 is electrically connected to a circuit board using a flowable conductive bonding material, and wherein, when the first external electrode terminal and the second external electrode terminal are electrically connected to the circuit board, the through parts of the through holes of the piezoelectric resonator plate, the through parts of the through holes of the second sealing member and the through parts of the through holes of the first sealing member are filled with the flowable conductive bonding material.

10. The piezoelectric resonator device according to claim 1, wherein a resonator-plate-side first bonding pattern, which is to be bonded and sealed to the first sealing member, is formed on the first main surface of the piezoelectric resonator plate, wherein a resonator-plate-side second bonding pattern, which is to be bonded and sealed to the second sealing member, is formed on the second main surface of the piezoelectric resonator plate, wherein a sealing-member-side first bonding pattern, which is to be bonded to the piezoelectric resonator plate, is formed on the first sealing member, wherein a sealing-member-side second bonding pattern, which is to be bonded to the piezoelectric resonator plate, is formed on the second sealing member, wherein the sealing-member-side first bonding pattern is bonded to the resonator-plate-side first bonding pattern by diffusion bonding, and the sealing-member-side second bonding pattern is bonded to the resonator-plate-side second bonding pattern by the diffusion bonding, and wherein an even flat space between the first sealing member and the piezoelectric resonator plate has a gap of not more than 1.00 micron, and the even flat space between the second sealing member and the piezoelectric resonator plate has a gap of not more than 1.00 micron.

11. A piezoelectric resonator device, comprising:

a piezoelectric resonator plate including a first excitation electrode formed on a first main surface of a substrate, and a second excitation electrode formed on a second main surface of the substrate, the second excitation electrode making a pair with the first excitation electrode;

a first sealing member covering the first excitation electrode of the piezoelectric resonator plate; a second sealing member covering the second excitation electrode of the piezoelectric resonator plate, the second sealing member including external electrode terminals to be electrically connected to an external circuit board using a flowable conductive bonding material; and an internal space formed by bonding the first sealing member to the piezoelectric resonator plate and by bonding the second sealing member to the piezoelectric resonator plate, the internal space hermetically sealing a vibrating part including the first excitation electrode and the second excitation electrode of the piezoelectric resonator plate, wherein through holes of the second sealing member are formed so as to pass through between a first main surface and a second main surface of the second sealing member, and the external electrode terminals are formed on the second main surface of the second sealing member, and wherein the through holes of the second sealing member include: respective through electrodes for conduction between electrodes formed on the first main surface and the second main surface of the second sealing member; and respective through parts, wherein through holes of the piezoelectric resonator plate are formed so as to pass through between the first main surface and the second main surface of the piezoelectric resonator plate, wherein the through holes of the piezoelectric resonator plate include: respective through electrodes for conduction between electrodes formed on the first main surface and the second main surface of the piezoelectric resonator plate; and respective through parts, and wherein the respective through parts of the through holes of the piezoelectric resonator plate are at least partially superimposed to the respective through parts of the through holes of the second sealing member, and wherein through holes of the first sealing member are formed so as to pass through between a first main surface and a second main surface of the first sealing member, wherein the through holes of the first sealing member include: respective through electrodes for conduction between electrodes formed on the first main surface and the second main surface of the first sealing member; and respective through parts, and wherein the respective through parts of the through holes of the piezoelectric resonator plate are at least partially superimposed to: the respective through parts of the through holes of the second sealing member; and the respective through parts of the through holes of the first sealing member.

12. The piezoelectric resonator device according to claim 11, wherein the first excitation electrode of the piezoelectric resonator plate is connected to a first external electrode terminal out of the external electrode terminals of the second sealing member via a first terminal formed on the first main surface of the first sealing member, and wherein the second excitation electrode of the piezoelectric resonator plate is connected to a second external electrode terminal out of the external electrode terminals of the second sealing member via a second terminal formed on the first main surface of the first sealing member.

13. The piezoelectric resonator device according to claim 12, wherein superimposed parts of the respective through parts of the through holes of the piezoelectric resonator plate, the through holes of the second sealing member and the through holes of the first sealing member are disposed between the first terminal and the first external electrode terminal, and between the second terminal and the second external electrode terminal.

14. The piezoelectric resonator device according to claim 13, wherein the respective superimposed parts are disposed in an outside of a sealed region of the internal space.

15. A bonding structure of a piezoelectric resonator device and a circuit board, wherein the piezoelectric resonator device according to claim 12 is electrically connected to a circuit board using a flowable conductive bonding material, and wherein, when the first external electrode terminal and the second external electrode terminal are electrically connected to the circuit board, the through parts of the through holes of the piezoelectric resonator plate, the through parts of the through holes of the second sealing member and the through parts of the through holes of the first sealing member are filled with the flowable conductive bonding material.

16. A piezoelectric resonator device, comprising:

a piezoelectric resonator plate including a first excitation electrode formed on a first main surface of a substrate, and a second excitation electrode formed on a second main surface of the substrate, the second excitation electrode making a pair with the first excitation electrode; a first sealing member covering the first excitation electrode of the piezoelectric resonator plate;

a second sealing member covering the second excitation electrode of the piezoelectric resonator plate, the second sealing member including external electrode terminals to be electrically connected to an external circuit board using a flowable conductive bonding material; and even, flat internal spaces formed by bonding the first sealing member to the piezoelectric resonator plate and by bonding the second sealing member to the piezoelectric resonator plate, the internal space hermetically sealing a vibrating part including the first excitation electrode and the second excitation electrode of the piezoelectric resonator plate, wherein through holes of the second sealing member are formed so as to pass through between a first main surface and a second main surface of the second sealing member, and the external electrode terminals are formed on the second main surface of the second sealing member, and wherein the through holes of the second sealing member include: respective through electrodes for conduction between electrodes formed on the first main surface and the second main surface of the second sealing member; and respective through parts.

17. The piezoelectric resonator device according to claim 16, wherein through holes of the piezoelectric resonator plate are formed so as to pass through between the first main surface and the second main surface of the piezoelectric resonator plate, wherein the through holes of the piezoelectric resonator plate include: respective through electrodes for conduction between electrodes formed on the first main surface and the second main surface of the piezoelectric resonator plate; and respective through parts, and wherein the respective through parts of the through holes of the piezoelectric resonator plate are at least partially superimposed to the respective through parts of the through holes of the second sealing member.

18. The piezoelectric resonator device according to claim 17, wherein through holes of the first sealing member are formed so as to pass through between a first main surface and a second main surface of the first sealing member, wherein the through holes of the first sealing member include: respective through electrodes for conduction between electrodes formed on the first main surface and the second main surface of the first sealing member; and respective through parts, and wherein the respective through parts of the through holes of the piezoelectric resonator plate are at least partially superimposed to: the respective through parts of the through holes of the second sealing member; and the respective through parts of the through holes of the first sealing member.

19. The piezoelectric resonator device according to claim 18, wherein the first excitation electrode of the piezoelectric resonator plate is connected to a first external electrode terminal out of the external electrode terminals of the second sealing member via a first terminal formed on the first main surface of the first sealing member, and wherein the second excitation electrode of the piezoelectric resonator plate is connected to a second external electrode terminal out of the external electrode terminals of the second sealing member via a second terminal formed on the first main surface of the first sealing member.

* * * * *